US006917321B1

(12) United States Patent
Haurie et al.

(10) Patent No.: US 6,917,321 B1
(45) Date of Patent: *Jul. 12, 2005

(54) METHOD AND APPARATUS FOR USE IN SWITCHED CAPACITOR SYSTEMS

(75) Inventors: Xavier S. Haurie, Arlington, MA (US); Paul F. Ferguson, Jr., North Andover, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/575,562

(22) Filed: May 21, 2000

(51) Int. Cl.[7] .................................. H03M 1/66
(52) U.S. Cl. ........................ 341/144; 341/150
(58) Field of Search .................. 341/144, 150, 341/118, 146

(56) References Cited

U.S. PATENT DOCUMENTS

| | | | |
|---|---|---|---|
| 4,205,203 A | | 5/1980 | Mehta et al. |
| 4,430,642 A | * | 2/1984 | Weigand et al. ............ 341/144 |
| 4,580,126 A | * | 4/1986 | Kato et al. .................. 341/144 |
| 4,584,568 A | * | 4/1986 | Zomorrodi .................. 341/150 |
| 4,591,832 A | * | 5/1986 | Fling et al. ................. 341/144 |
| 4,616,212 A | * | 10/1986 | Law et al. .................. 341/150 |
| 4,667,179 A | | 5/1987 | Law et al. |
| 4,864,305 A | | 9/1989 | Toyama |
| 4,894,620 A | | 1/1990 | Nagaraj |
| 4,968,989 A | | 11/1990 | Olmstead et al. |
| 5,008,674 A | * | 4/1991 | Da Franca et al. ......... 341/150 |
| 5,036,322 A | | 7/1991 | Barrow et al. |
| 5,162,801 A | * | 11/1992 | Powell et al. .............. 341/150 |
| 5,243,346 A | | 9/1993 | Inami |
| 5,274,376 A | * | 12/1993 | Phillips et al. ............. 341/150 |
| 5,332,997 A | * | 7/1994 | Dingwall et al. ........... 341/150 |
| 5,404,142 A | | 4/1995 | Adams et al. .............. 341/144 |
| 5,412,387 A | | 5/1995 | Vincelette et al. ......... 341/150 |
| 5,455,582 A | | 10/1995 | Valdenaire |
| 5,640,162 A | | 6/1997 | Lewyn |
| 5,684,482 A | * | 11/1997 | Galton ....................... 341/144 |
| 5,798,724 A | * | 8/1998 | Myers ........................ 341/146 |
| 5,809,432 A | | 9/1998 | Yamashita |
| 5,818,372 A | | 10/1998 | Noro |
| 5,880,690 A | | 3/1999 | Rothenberg |
| 5,969,657 A | | 10/1999 | Dempsey et al. .......... 341/145 |
| 5,977,899 A | | 11/1999 | Adams ....................... 341/145 |
| 6,124,813 A | | 9/2000 | Robertson et al. |
| 6,130,633 A | | 10/2000 | Lee et al. |
| 6,137,430 A | | 10/2000 | Lyden et al. |
| 6,150,970 A | * | 11/2000 | Anagnos ..................... 341/144 |
| 6,154,162 A | | 11/2000 | Watson et al. |
| 6,169,747 B1 | | 1/2001 | Sartain et al. |

FOREIGN PATENT DOCUMENTS

| | | |
|---|---|---|
| EP | 0399120 | 11/1990 |
| EP | 0 903 862 A1 | 3/1999 |

OTHER PUBLICATIONS

Yoshizawa, et al. Novel Design Techniques for High–Linearity MOSFET–Only Switched–Capacitor Circuits, 1996 Symposium on VLSI Circuits Digest of Technical Papers, pp 152–153.

(Continued)

*Primary Examiner*—Trong Phan
(74) *Attorney, Agent, or Firm*—Wolf, Greenfield & Sacks, P.C.

(57) ABSTRACT

Systems and methods receive a digital signal and generate an analog signal indicative thereof. In one embodiment, a system includes a DAC that receives a multi-bit digital signal, generates at least two analog signals each indicative of the value of the multi-bit digital signal, and filters two or more of the at least two analog signals. In another embodiment, a system includes a DAC that receives digital input signals at an input data rate and outputs analog signals indicative of the digital signals to a signal conditioning stage at an output data rate different than the input data rate.

65 Claims, 46 Drawing Sheets

OTHER PUBLICATIONS

Wang, et al., A Quasi–Passive CMOS Pipeline D/A Converter, IEEE Journal of Solid–State Circuits vol. 24, No. 6, Dec. 1989, pp 1752–1755.

Wang, et al., A Quasi–Passive CMOS Pipeline D/A Converter, IEEE 1988 Custom Integrated Circuits Conference, 1988, pp 18.1.1–18.1.4.

Temes, et al., Novel Pipeline Data Converters, ISCAS'88, pp 1943–1946.

Yoshizawa, et al. MOSFET–Only Switched–Capacitor in Digital CMOS Technology, IEEE Journal of Solid–State Circuits, vol. 34, No. 6, Jun. 1999, pp 734–747.

Kwan, Tom, et al., "A Stereo Multibit Sigma–Delta DAC with Asynchronous Master–Clock Interface", IEEE Journal of Solid–State Circuits, vol. 31, No. 12, Dec. 1996, pp. 1881–1887.

Fujimori, Ichiro, et al, "A 1.5 V, 4.1 mW dual–channel audio delta–sigma D/A converter", IEEE, vol. 33, No. 12, Dec. 1998, pp. 1863–1870.

* cited by examiner

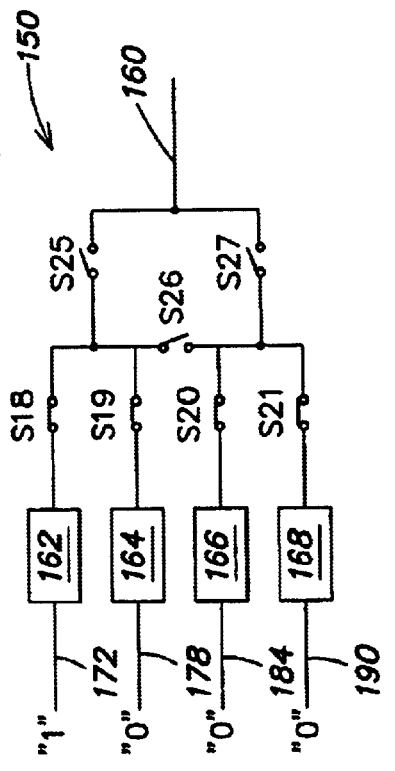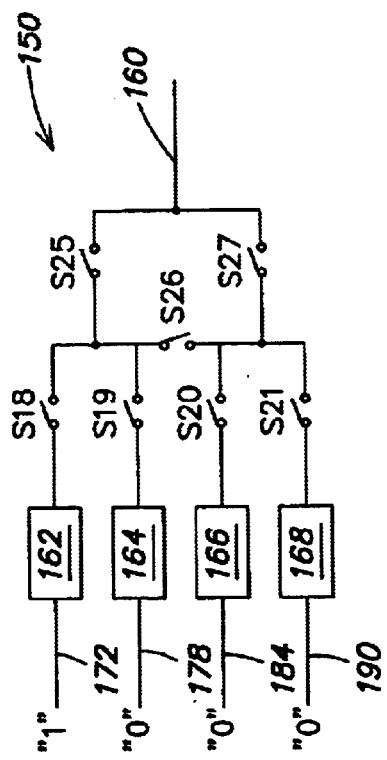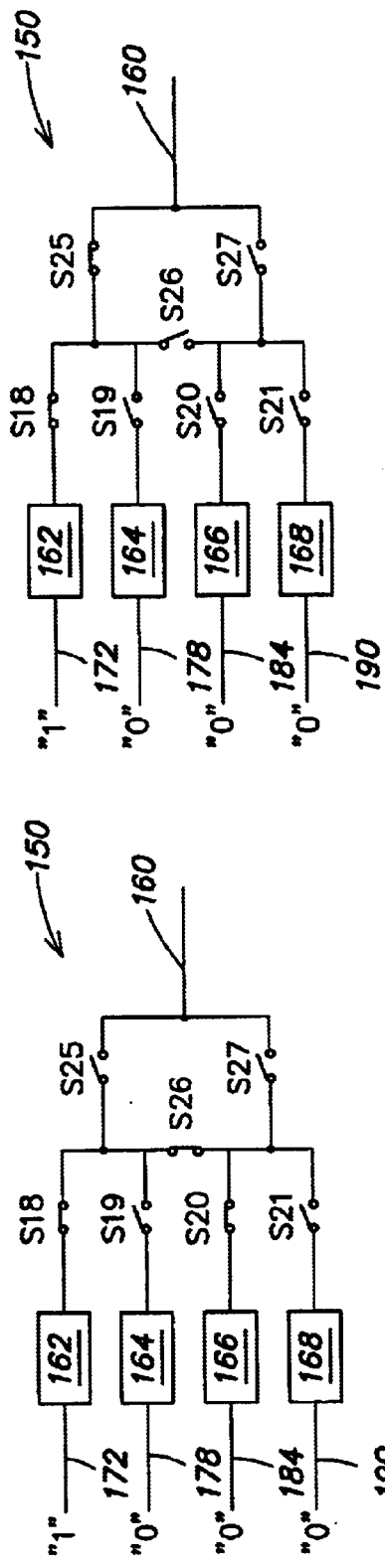

METHOD AND APPARATUS FOR USE IN SWITCHED CAPACITOR SYSTEMS

TECHNICAL FIELD

This invention relates to methods and apparatus for switched capacitor systems.

RELATED ART

Many systems employ switched capacitor techniques, for example, making use of capacitors and packets of charge to perform a function.

Digital to analog converters are one type of system that frequently use switched capacitor techniques, for example as part of a digital to analog conversion system for use in a mobile communications system. Mobile communications often include a cellular handset that uses digital baseband I/Q modulation and synthesis in a transmit path.

A digital-to-analog converter generates analog data in response to digital input data. One type of digital-to-analog converter receives binary-weighted data. Another type of digital-to-analog converter receives equally-weighted data.

Using digital-to-analog conversion to create an analog signal often results in signal noise, and/or distortion. Thus, in systems employing switched capacitor techniques, there is often a need for a solution which helps reduce noise and/or distortion. To help meet the noise and distortion requirements, a digital to analog converter is sometimes preceded by a scrambler. Output data from a digital-to-analog converter may be presented to a signal conditioner stage, e.g., an analog filter stage, to condition the noise and/or the distortion. One type of signal conditioner stage is a switched capacitor filter.

Analog to digital converters are another type of system that frequently uses switched capacitor techniques, for example as part of a digital to analog converter used as a feedback element in a successive approximation type of analog to digital converter. One example of a successive approximation analog to digital converter is an AD574 manufactured by Analog Devices, Inc.

In addition to reducing noise and/or distortion, there is often a need in switched capacitor systems to further reduce power requirements, size, and/or cost.

SUMMARY OF THE INVENTION

According to a first aspect, a DAC includes a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, at least two of the plurality of sub DACs sharing charge with one another, and the switched capacitor network outputs at least one analog signal indicative of a sum of values of each bit in the multi-bit signal.

According to a second aspect, A DAC includes a switched capacitor network that receives an equally-weighted multi-bit digital signal and outputs one or more analog signals, wherein at least one of the one or more analog signals comprises a single packet of charge indicative of a sum of equally weighted values of each bit in the multi-bit signal.

According to a third aspect a DAC includes a switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally weighted values of each bit in the multi-bit signal.

According to a fourth aspect, a method of converting a multi-bit digital signal to an analog signal indicative of a sum of value of each bit in the multi-bit digital signal includes charging each of a plurality of capacitors to a value corresponding to a value of a bit in the multi-bit signal, wherein the charge on each capacitor corresponds to a weight of the value of a corresponding bit; and connecting at least two of the plurality of capacitors to one another to share charge with one another.

According to a fifth aspect, a method of converting a equally weighted multi-bit digital signal to an analog signal indicative of a sum of value of each bit in the multi-bit digital signal includes charging each of a plurality of capacitors to a value corresponding to a value of a bit in the equally-weighted multi-bit signal, and generating a single packet of charge on at least one capacitor indicative of a sum of equally weighted values of each bit in the multi-bit signal.

According to a sixth aspect, a method of converting an equally weighted multi-bit digital signal to an analog signal indicative of a sum of value of each bit in the multi-bit digital signal includes charging each of a plurality of capacitors to a value corresponding to a value of a bit in the equally-weighted multi-bit signal, and connecting at least two of the plurality of capacitors to one another to share charge with one another.

According to a seventh aspect, A DAC includes means for charging each of a plurality of capacitors to a value corresponding to a value of a bit in the multi-bit signal, wherein the charge on each capacitor corresponds to a weight of the value of a corresponding bit; and means for connecting at least two of the plurality of capacitors to one another to share charge with one another.

According to an eighth aspect, a DAC includes means for charging each of a plurality of capacitors to a value corresponding to a value of a bit in the equally-weighted multi-bit signal, and means for generating a single packet of charge on at least one capacitor indicative of a sum of equally weighted values of each bit in the multi-bit signal.

According to a ninth aspect, a DAC includes means for charging each of a plurality of capacitors to a value corresponding to a value of a bit in the equally-weighted multi-bit signal, and means for connecting at least two of the plurality of capacitors to one another to share charge with one another.

According to a tenth aspect, an integrated circuit includes an integrated switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, at least two of the plurality of sub DACs sharing charge with one another, and the switched capacitor network outputs at least one analog signal indicative of a sum of values of each bit in the multi-bit signal.

According to an eleventh aspect, an integrated circuit includes an integrated switched capacitor network that receives an equally-weighted multi-bit digital signal and outputs one or more analog signals, wherein at least one of the one or more analog signals comprises a single packet of charge indicative of a sum of equally weighted values of each bit in the multi-bit signal.

According to a twelfth aspect, an integrated circuit includes an integrated switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally weighted values of each bit in the multi-bit signal.

According to a thirteenth aspect, a system includes a DAC that receives a multi-bit digital signal and outputs at least two analog signals each indicative of a sum of values of bits in the multi-bit digital signal; and a signal conditioning stage that receives at least two of the at least two analog signals.

According to a fourteenth aspect, a system includes a DAC that receives digital input signals at an input data rate and outputs analog signals indicative of the digital signals to a signal conditioning stage at an output data rate different than the input data rate.

According to a fifteenth aspect, a method includes receiving a multi-bit digital signal, generating at least two analog output signals each indicative of a sum of values of bits in the multi-bit digital signal; and filtering at least two of the at least two analog output signals.

According to a sixteenth aspect, a system includes means for receiving a multi-bit digital signal, means for generating at least two analog output signals each indicative of a sum of values of bits in the multi-bit digital signal; and means for filtering at least two of the at least two analog output signals.

According to a seventeenth aspect, a system includes a DAC that receives a multi-bit digital signal and outputs at least two analog signals each indicative of a sum of values of bits in the multi-bit digital signal.

According to eighteenth aspect, a method includes receiving a multi-bit digital signal, and generating at least two analog output signals each indicative of a sum of values of bits in the multi-bit digital signal.

According to an eighteenth aspect, a system includes means for receiving a multi-bit digital signal, and means for generating at least two analog output signals each indicative of a sum of values of bits in the multi-bit digital signal.

According to a nineteenth aspect, a switched capacitor filter has a first switched capacitor comprising a switched capacitor without substantial effects from parasitic characteristics, and a second switched capacitor in parallel with the first switched capacitor, the second switched capacitor having effects from parasitic characteristics.

According to a twentieth aspect, a system includes a switched capacitor filter having a first switched capacitor comprising a switched capacitor and a second switched capacitor in parallel with the first switched capacitor, the second switched capacitor having characteristics including parasitic effects; and a DAC having a switched capacitor having characteristics including parasitic effects substantially corresponding to the parasitic effects of the second switched capacitor of the switched capacitor filter.

According to a twenty first aspect, an apparatus includes a first switched capacitor cell having a reference direction and being adapted to electrically connect to a second switched capacitor cell substantially identical to the first switched capacitor cell, the second switched capacitor cell having a reference direction and being oriented such that the reference direction of the second switched capacitor cell is directed in substantially the same direction as the reference direction of the first switched capacitor cell, and being adapted to electrically connect to a third switched capacitor cell substantially identical to the first switched capacitor cell, the third switched capacitor cell having a reference direction and being oriented such that the reference direction of the third switched capacitor cell is directed in direction angularly offset from the direction in which the reference direction of the first switched capacitor cell is directed.

According to a twenty second aspect, a system includes a binary weighted DAC; and a segmented DAC, coupled to the binary weighted DAC, the segment DAC comprising a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, at least two of the plurality of sub DACs sharing charge with one another, and the switched capacitor network outputs at least one analog signal indicative of a sum of values of each bit in the multi-bit signal.

According to a twenty-third aspect, a system includes a scrambler that receives input and provides output; and a switched capacitor DAC that has a plurality of capacitors and redistributes charge between at least two of the plurality of capacitors, coupled to the scrambler, that receives digital output of the scrambler.

According to a twenty fourth aspect, a system includes a digital to analog converter that receives a multi-bit digital signal and produces an analog output that is proportional to the square of the multi-bit digital signal.

According to a twenty-fifth aspect of the invention, an analog-to-digital converter has an analog comparison stage coupled to a digital latch stage, the analog-to-digital converter including a feedback element through which an output of the digital latch stage is fed back to an input of the analog comparison stage, wherein the feedback element includes a digital-to-analog converter.

According to a twenty sixth aspect of the invention, a method for use in an analog to digital converter having an analog comparison stage coupled to a digital latch stage includes coupling an output of the digital latch stage back to an input of the analog comparison stage through a digital to analog converter that receives a multi-bit digital signal and produces an analog output proportional to the square of the multi-bit digital signal.

According to a twenty seventh aspect of the invention, a handset for a mobile communication system includes an input stage that receives an input signal and outputs a multi-bit digital signal to a digital-to-analog conversion system that receives the multi-bit digital signal and outputs an analog signal indicative of a sum of values of bits in the multi-bit signal, and including a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associate bit, wherein the associated amount of charge for each of the plurality of sub DACs is in direct proportion to a weight of the bit, at least two of the plurality of sub DACs sharing charge with one another, and the switched capacitor network outputs at least one analog signal indicative of a sum of values of bits in the multi-bit signal.

According to a twenty eighth aspect, a system includes a digital signal processing stage that receives input and provides output; and a switched capacitor DAC that has a plurality of capacitors and redistributes charge between at least two of the plurality of capacitors, coupled to the digital signal processing stage, that receives digital output of the digital signal processing stage.

According to a twenty ninth aspect, a digital to analog converter receives a first multi-bit digital signal and a second multi-bit digital signal ,and produces an analog output that is indicative a product of the first multi-bit digital signal and the second multi-bit digital signal.

According to a thirtieth aspect, in an analog-to-digital converter having an analog comparison stage coupled to a digital latch stage, a feedback element through which an output of the digital latch stage is coupled back to an input of the analog comparison stage, wherein the feedback element includes a digital-to-analog converter that receives a first multi-bit digital signal and a second multi-bit digital signal, and produces an analog output that is indicative of a product of the first multi-bit digital signal and the second multi-bit digital signal.

BRIEF DESCRIPTION OF THE DRAWINGS

FIGS. 11A–11D are block diagrams showing the operation of another embodiment of the switched capacitor DAC of FIG. 5 for each of four phases of a non-overlapping four phase clock;

DETAILED DESCRIPTION

Figure 1:
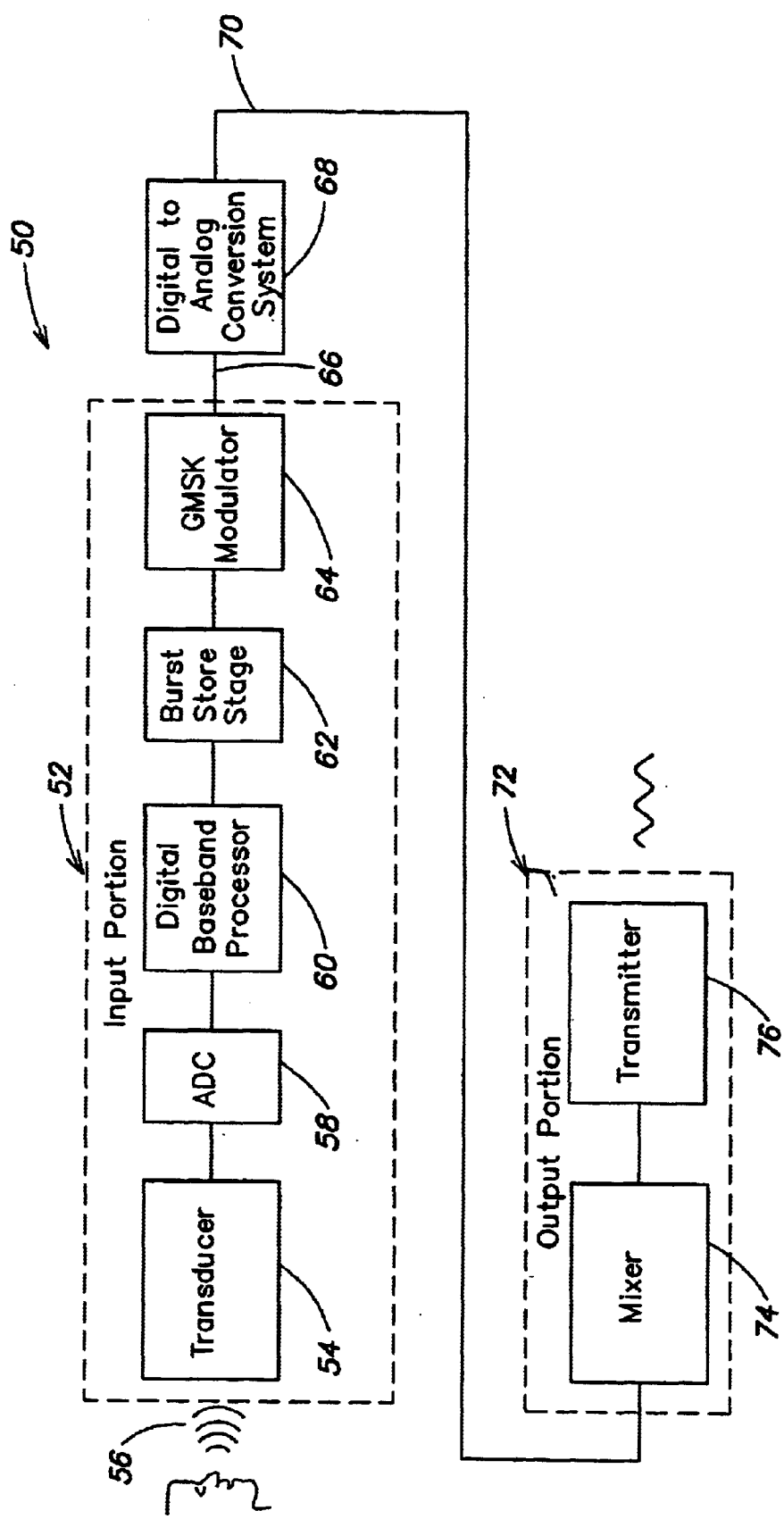
FIG. 1 is a block diagram of one embodiment of a portion of a handset for a mobile communication system that includes a digital-to-analog conversion system.

FIG. 1 is a block diagram of one embodiment of a portion of a handset 50 for a mobile communication system. The handset 50 includes an input portion 52 having a transducer 54 that receives an input signal 56, e.g., a voice or other acoustical signal, representing information to be communicated via the mobile communication system. The transducer 54 converts the input signal 56 into an electrical signal, typically an analog signal, which is supplied to an analog-to-digital converter (ADC) 58, for example a voiceband ADC. The ADC 58 periodically samples the electrical signal and generates a sequence of multi-bit digital signals, which are supplied to a digital baseband processor 60. The baseband processor 60 performs further signal processing, including for example, compression. The output of the baseband processor 60 is supplied to burst store stage 62, which feeds a GMSK modulator 64. The GMSK modulator 64 produces multi-bit digital signals, which is supplied via signal lines, represented by a signal line 66, to a digital to analog conversion system (DAC) 68. The digital to analog conversion system 68 converts the sequence of multi-bit digital signals into an analog signal, which is supplied via signal line 70 to an output portion 72. The output portion 72 includes a mixer 74 that receives the analog signal on signal line 70 and feeds a transmitter 76, which in turn transmits the signal. DAC can be used in any digital to analog conversion.

Figure 2:
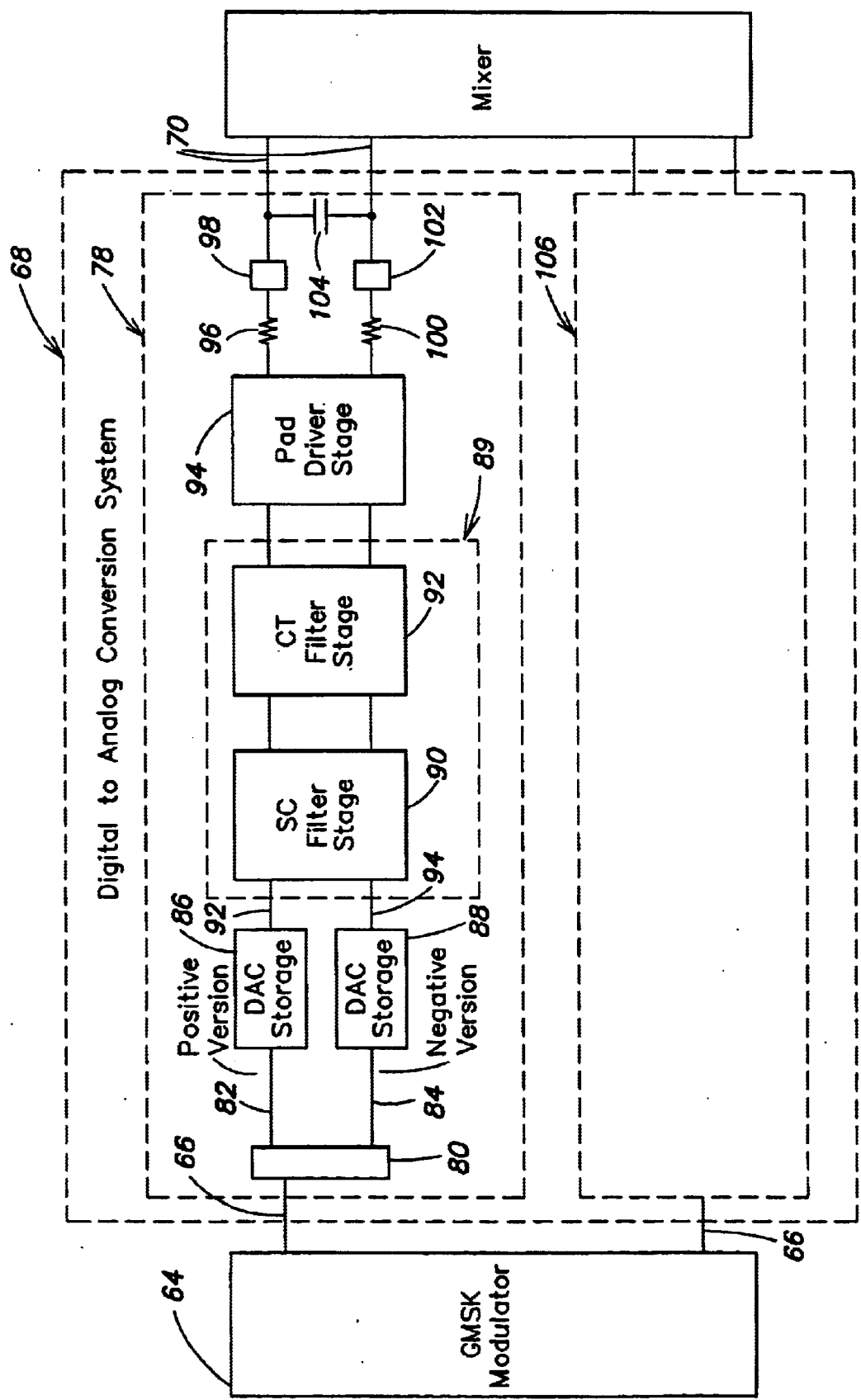
FIG. 2 is a block diagram of one embodiment of the digital-to-analog conversion system of FIG. 1 and including a DAC portion with two DAC stages.

FIG. 2 is a block diagram of one embodiment of the digital to analog conversion system 68, which utilizes a differential I/Q configuration. An I channel 78 of the digital to analog conversion system 68 includes a block 80 that receives the sequence of multi-bit digital signals on signal line 66. The block 80 generates two sequences of multi-bit digital signals, i.e., a first sequence of multi-bit digital signals that is output on signal line 82, and a second sequence of multi-bit digital signals that is output on signal line 84. The second sequence of multi-bit digital signals is generated to be the complement of the first sequence of multi-bit digital signals. The first sequence of multi-bit digital signals represents a positive version of the input signal. The second sequence of multi-bit digital signals represents a negative version of the input signal.

The first sequence of multi-bit digital signals is supplied to a first digital to analog converter stage 86, which generates analog signals that correspond to the first sequence of multi-bit digital signals. The second sequence of multi-bit digital signals is supplied to a second digital to analog converter stage 88, which generates analog signals that correspond to the second sequence of multi-bit digital signals. The analog signals from the first and the second DAC stages 86, 88 may be supplied to signal conditioning stage 89 that may comprise an analog filter, for example, a switched capacitor (SC) filter stage 90, which may help attenuate noise and/or distortion components of the analog signals. The SC filter 90 feeds a differential analog signal to the continuous time (CT) filter stage 92, which further attenuates noise and/or distortion. The CT filter stage 92 passes a differential analog signal to a pad driver stage 94. The CT filter stage 92 has a first output that connects via a first resistor 96 to a first pad 98. The CT filter stage 92 has a second output that connects via a second resistor 100 to a second pad 102. A capacitor 104 has a first terminal connected to the first pad 98, and a second terminal connected to the second pad 102.

A Q channel 106 of the digital to analog conversion system 68 contains substantially the same components as the I channel 78. The output data rate from each of the DAC stages is typically the same as the input sample rate of the SC filter. However, as is explained hereinbelow, in the present system, the DAC stages may or may not operate at the same clock frequency as the SC filter stage. For example, one embodiment of the mobile communication system uses a system clock running at 13 MHz, wherein the output data rate from the GMSK modulator is 6.5 MHz, the cycle frequency of each of the DAC stages is 6.5 MHz, and the input sample rate of the SC filter stage 90 is 13 MHz.

Figure 3:
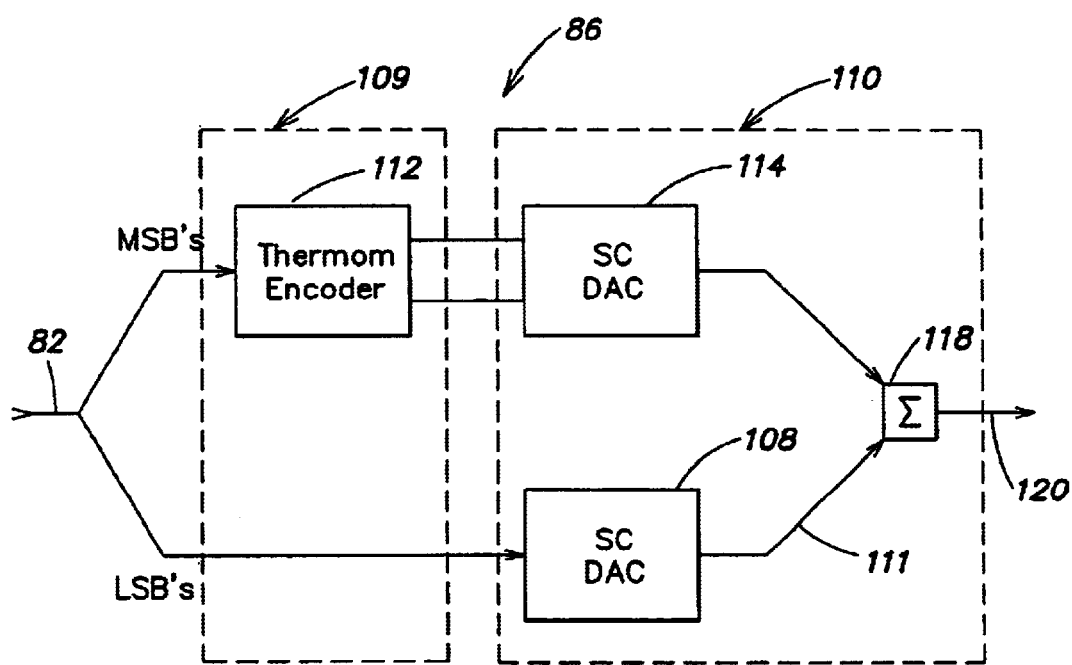
FIG. 3 is a block diagram of one embodiment of the DAC stage of FIG. 2 that includes a switched capacitor DAC.

FIG. 3 is a block diagram of one embodiment of the DAC stage 86, which receives a binary-weighted multi-bit digital signal on signal lines 82. The binary-weighted multi-bit digital signal is divided into a binary-weighted LSB portion and a binary-weighted MSB portion. In one embodiment, for example, the binary weighted multi-bit digital signal is ten bits, the MSB portion is four bits, and the LSB portion is six bits. The LSB's are supplied to a switched capacitor (SC) DAC 108 of a DAC portion 110 of the DAC stage 86. The SC DAC 108 forms an analog signal corresponding to the value represented by the LSB's. The MSB's are supplied to a digital signal processing stage 109 having a thermometer encoder 112 that converts the MSB's into an equally-weighted multi-bit digital signal. The equally-weighted multi-bit digital signal is input to a switched capacitor (SC) DAC 114, of the DAC portion 110 of the DAC stage 108. The SC DAC 114 is referred to herein as a segmented SC DAC because it forms an analog signal corresponding to the value represented by the equally-weighted multi-bit digital signal. The analog signal from the SC DAC 108 and the analog signal from the segmented SC DAC 114 are summed at 118 to form an analog signal, output on signal line 120. In one embodiment of the handset, the DAC stage generates 6.5 million samples per second (MS/s).

Figure 4:
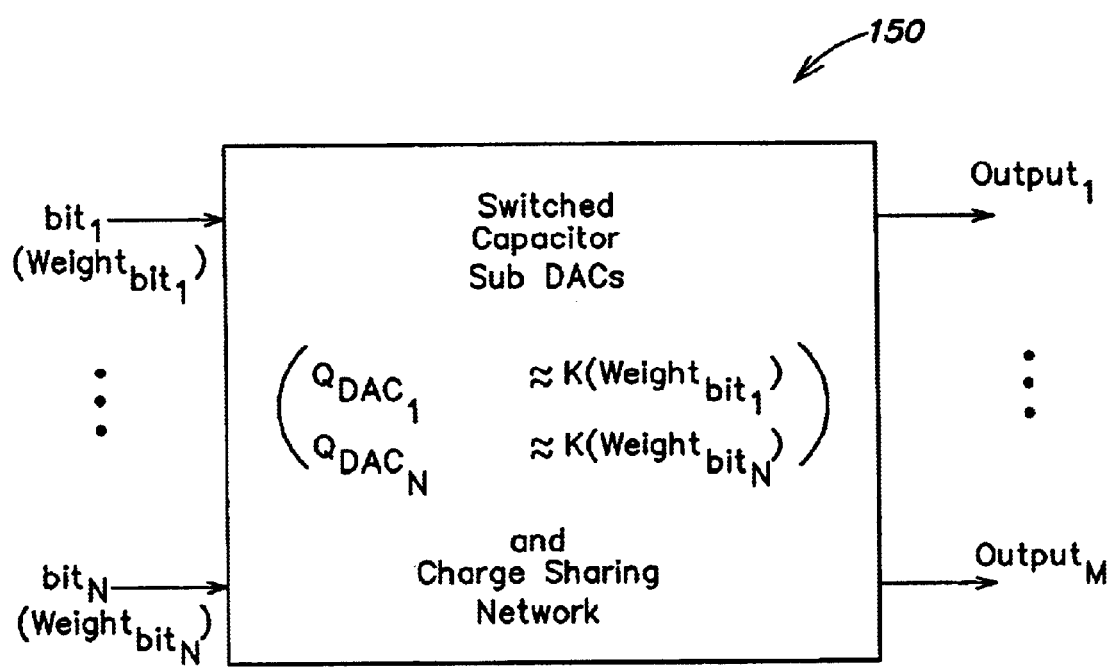
FIG. 4 is a block diagram of one embodiment of the switched capacitor DAC of FIG. 3.

FIG. 4 is a block diagram of one embodiment of a SC DAC 150 that may be used to form one or both of the SC DAC 108 and the SC DAC 114 in the handset 50. The SC DAC 150 receives a multi-bit digital signal, e.g., $bit_1$–$bit_n$. Each bit has an associated weight, $weight_{bit1}$–$weight_{bitn}$. In one embodiment, the weight of each bit is different than those of the other bits. For example, $bit_1$–$bit_N$ may represent binary-weighted bits. In another embodiment, $bit_1$–$bit_N$ are equally-weighted, and all of the weights, i.e., $weight_{bit1}$–$weight_{bitN}$, are the same.

The SC DAC includes a plurality of switched capacitor sub-DACs (SC sub-DACs) further described hereinbelow. Each of the SC sub-DACs shares charge via a charge sharing network with at least one other of the SC sub-DACs. The SC DAC 150 outputs one or more analog signals, e.g., $output_1$–$output_M$, each indicative of a sum of values of the bits in the multi-bit signal. '

FIGS. 5, 7A–7C, 8A–8C, 10, 11A–11D, 12A–12C, 13, 17, 14A–14C, 15, 20, 21, 22, 25, disclose various embodiments of the SC DAC 150.

Figure 5:
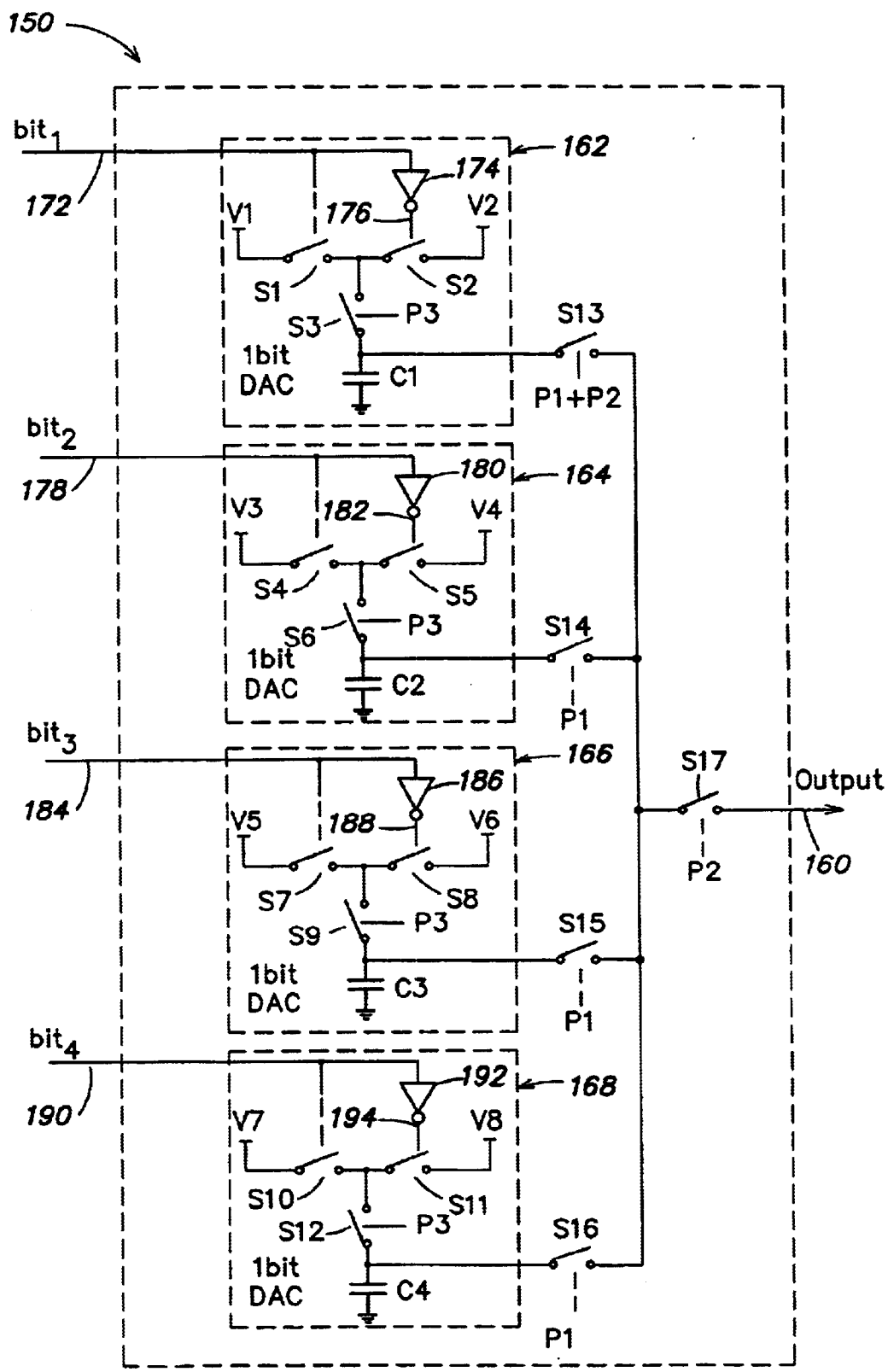
FIG. 5 is a block diagram of one embodiment of the switched capacitor DAC of FIG. 4 that is adapted to convert a four-bit digital input signal into a corresponding analog signal.

Referring now to FIG. 5, a block diagram shows one embodiment of the SC DAC 150 that is adapted to convert a 4-bit digital input signal bite, $bit_2$, $bit_3$, $bit_4$, into a corresponding analog signal, which is supplied to output terminal 160. The DAC 150 comprises four switched capacitor DACs 162, 164, 166, 168, sometimes referred to as sub-DACs. In this embodiment, each of the sub-DACs 162, 164, 166, 168 is a one bit DAC.

The one-bit DAC 162 has a reference voltage VI connected to a first terminal of a switch S1, the second terminal of which is connected to a first terminal of a switch S2 and a first terminal of a switch S3. A second terminal of the switch S2 is connected to a reference voltage V2. A second terminal of the switch S3 is connected to a first terminal of a capacitor C1 that has a second terminal connected to a reference voltage, e.g., ground. The digital signal $bit_1$ is presented to an input terminal 172 from where it is supplied to the one-bit DAC 162 to control the "on" (i.e., closed)/ "off" (i.e., open) condition of the switch S1. The digital signal $bit_1$ is further supplied to an inverter 174 that generates a signal at terminal 176 used to control switch S2.

The one-bit DAC 164 has a reference voltage V3 connected to a first terminal of a switch S4, the second terminal of which is connected to a first terminal of a switch S5 and a first terminal of a switch S6. A second terminal of the switch S5 is connected to a reference voltage V4. A second terminal of the switch S6 is connected to a first terminal of a capacitor C2 having a second terminal connected to a reference voltage, e.g., ground. The digital signal $bit_2$ is presented to an input terminal 178 from where it is supplied to the one-bit DAC 164 to control switch S4 and input to an inverter 180 that generates a signal at terminal 182 used to control switch S5.

The one-bit DAC 166 has a reference voltage V5 connected to a first terminal of a switch S7, the second terminal of which is connected to a first terminal of a switch S8 and a first terminal of a switch S9. A second terminal of the switch S8 is connected to a reference voltage V6. A second terminal of the switch S9 is connected to a first terminal of a capacitor C3 having a second terminal connected to a reference voltage, e.g., ground. The digital signal $bit_3$ is presented to an input terminal 184 from where it is supplied to the one-bit DAC 166 to control switch S7 and input to an inverter 186 that generates a signal at terminal 188 used to control switch S8.

The one-bit DAC 168 has a reference voltage V7 connected to a first terminal of a switch S10, the second terminal of which is connected to a first terminal of a switch S11 and a first terminal of a switch S12. A second terminal of the switch S11 is connected to a reference voltage V8, a second terminal of the switch S12 is connected to a first terminal of a capacitor C4 having a second terminal connected to a reference voltage, e.g., ground. The digital signal $bit_4$ is presented to an input terminal 190 from where it is supplied to the one-bit DAC 168 where it is used to control charging switch S10 and input to an inverter 192 that generates a signal at terminal 194 used to control switch S11.

The first terminal of each of the capacitors C1, C2, C3, C4 is supplied to a first terminal of a charge sharing switch S13, charge sharing switch S14, charge sharing switch S15, and charge sharing switch S16, respectively. The second terminal of each of the switches S13–S16 are connected to a first terminal of a charging switch S17, that has a second terminal connected to the output terminal 160.

In one embodiment, each of the digital signals $bit_1$, $bit_2$, $bit_3$, and $bit_4$ are equally-weighted. In such an embodiment, the one-bit DAC 162, the one-bit DAC 164, the one-bit DAC 166, and the one-bit DAC 168 may have similar configurations wherein, V1=V3=V5=V7, V2=V4=V6=V8, and the values of C1, C2, C3, and C4 are identical, or at least substantially identical. However, such similarity is not absolutely required. In other equally-weighted embodiments, the one-bit DAC 162, the one-bit DAC 164, the one-bit DAC 166 and the one-bit DAC 168 may not be identical. Each of the switched capacitor sub-DACs employs charge approximately equal to a constant K, times a weight(s) of the bit(s) into the switched capacitor sub-DAC.

In one embodiment, the reference voltages V1, V3, V5 and V7 are connected to a reference voltage $V_{ref}$, and reference voltages V2, V4, V6, V8 are connected to ground.

Figure 6:
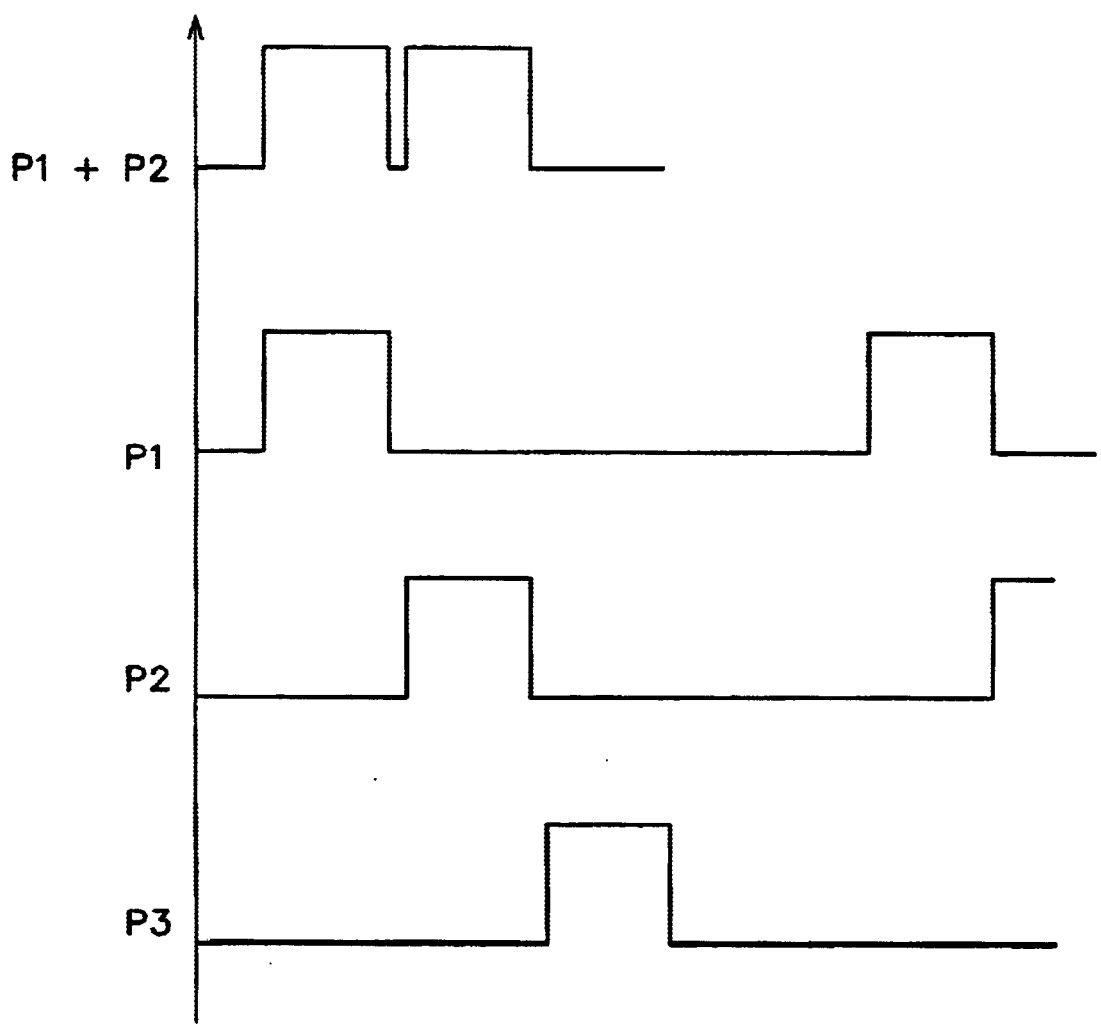
FIG. 6 illustrates one embodiment of a non-overlapping three phase clock used in the operation of the switched capacitor DAC of FIGS. 7A–7C.

The DAC 150 may receive a non-overlapping 3-phase clock, P1, P2, P3, shown in FIG. 6. The closed/open condition of the switches S3, S6, S9, and S12 is controlled by the P3 signal of the 3-phase clock. The P1 signal of the 3-phase clock controls the open/closed condition of the charge sharing switches S13, S14, S15, and S16. The P2 signal of the 3-phase clock controls the open/closed condition of the switch S17.

In particular, on clock phase P3, i.e., phase P3 has a logic high state (e.g. "1"), capacitors C1, C2, C3, and C4 are each charged to $V_{ref}$ or, alternatively, discharged to ground in response to the state of the associated one of the digital signals $bit_1$, $bit_2$, $bit_3$, $bit_4$, and charge sharing switches S13, S14, S15, and S16 and output switch S17, are all in the open condition. On clock phase P1, charging switches S3, S6, 89, and S12 are all in an open condition, and charge sharing switches S13, S14, S15 and S16 are all in a closed condition, wherein charge may be redistributed. On clock phase P2, all charging switches, i.e., S3, S6, S9, and S12, and charge sharing switches S14, S15, and S16, are in an open condition. Also on phase P2, charge sharing switch S13 and output switch S17 are each in a closed condition wherein charge may be delivered to the output terminal 160.

Figure 7A:
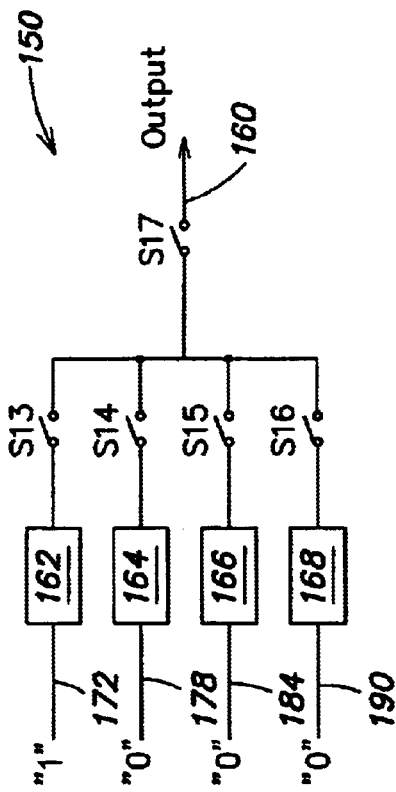
FIGS. 7A–7C are block diagrams showing the operation of the switched capacitor DAC of FIG. 5 for each of three clock phases of a non-overlapping three phase clock.
Figure 7B:
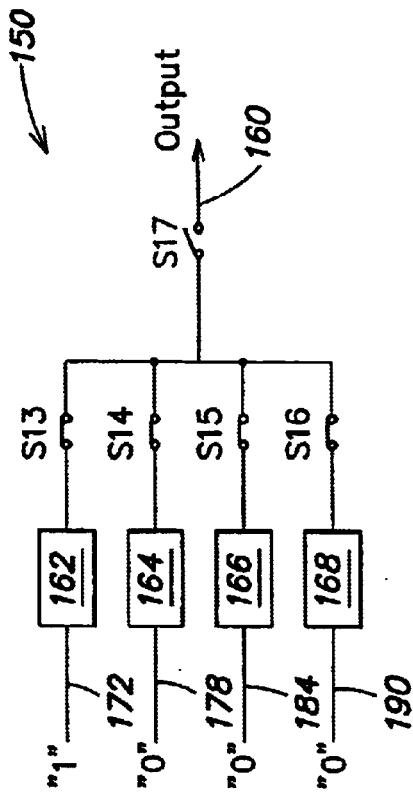
Figure 7C:
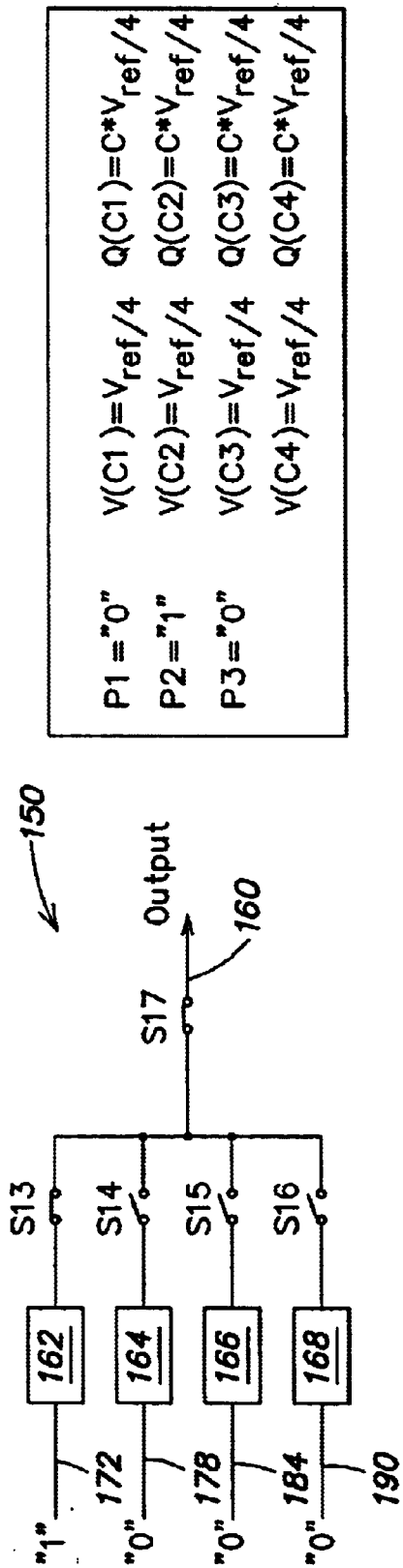

FIGS. 7A–7C are block diagrams showing the operation of the SC DAC 150 of FIG. 5 for each of the 3 clock phases in the event that input terminals 172, 178, 184, and 190 are supplied with digital bit signals $bit_1$, $bit_2$, $bit_3$, $bit_4$, having logic states 1, 0, 0, 0, respectively. Tables show the relationship between the clock phase, and the state (i.e., voltage and charge) of the capacitors in the one-bit DACs. In FIG. 7 and similarly labeled figures, the charges Q(C1) ... Q(CN) represent the charge on capacitors C1 ... CN, respectively. Referring now to FIG. 7A, on phase P3 of the 3-phase clock, all of the charge sharing switches S13, S14, S15, and S16 and the output switch S17, are in the open condition. The capacitor C1 is charged to $V_{ref}$ in response logic state 1 on terminal 172. Capacitors C2, C3 and C4 are all discharged to ground in response to the logic state 0 signals on terminals 178, 184, 190, respectively. Referring now to FIG. 7B, on phase P1 of the 3-phase clock, all of the charging switches S3, S6, S9 and S12 (FIG. 5) and the output switch S17 are in an open condition, and all of the charge sharing switches S13, S14, S15 and S16 are in a closed condition, whereby charge is redistributed and resulting in the total charge on all of the capacitors being divided among all of the capacitors. If the capacitors C1, C2, C3, C4 all have the same capacitance value C, then the charge is shared equally so that the voltage across each capacitor becomes $V_{ref}/4$. Referring now to FIG. 7C, on phase P2, charge sharing switches S14, S15, and S16 are in the open condition, output switch S17 is in the closed condition, and capacitor C1 (FIG. 5) of one-bit DAC 162 delivers its charge to the output terminal 160. On the next occurrence of phase P3 (not shown), the multi-bit digital signal $bit_1$, $bit_2$, $bit_3$, and $bit_4$ may be updated and provided to the DAC 150 via input terminals 172, 178, 184, 190.

In one or more embodiments charge sharing (i.e., mixing) before delivering may help reduce non-linear glitch energy. However, a reduction in glitch energy need not be sought nor obtained in every embodiment, and is not a requirement of the switched capacitor techniques disclosed herein.

The accuracy of the signal(s) out of the SC DAC 150 depends at least in part on the degree of correspondence between the capacitors C1, C2, C3, C4. In some embodiments it may be sought to have the components that are used to employ the switched capacitor techniques, e.g., C1, C2, C3, C4, match as closely as is possible limited only for example by limitations in manufacturing processes. In other embodiments however, such matching may not be required or desired, but rather, all that may be desired is a degree of correspondence to provide suitable DAC transfer characteristics. Thus, in some embodiments they may be substantially identical, but in other embodiments they may not be substantially identical.

In some embodiments, there may be one or more parasitic capacitance(s) that have an effect on the degree of correspondence, and it may be desirable, although not necessary to the techniques described herein, to provide a parasitic capacitance(s) that has an effect that offsets an effect of other parasitic capacitance.

The term switch as used herein is defined as any type of switching element. The term capacitor as used herein is defined as any type of capacitive element. The switches and the capacitors are not limited to any particular type(s) of switching element and capacitive element, respectively. Thus for example, a switching element may be a single element. As another example, a switching element may comprise a plurality of elements that function as a switch. As a further example, a capacitive element may be a capacitor. As a further example, a capacitive element may comprise one or more elements that provide capacitance.

A switch may include but is not limited to one or more active elements (for example one or more transistors) and may but need not employ MOS technology. A capacitor may include but is not limited to metal, polysilicon and double polysilicon metal metal, metal poly, poly diffusion, semiconductors, junction capacitors, parallel plate technology, adjacent conductors, fringing capacitors.

Although described above with respect to an input signal having logic states of 1, 0, 0, 0, the input signals can have logic states with any combination of ones and zeros.

In another embodiment, the digital signal $bit_1$, $bit_2$, $bit_3$, and $bit_4$ are binary-weighted bit signals. In such embodiment, the weight of the digital bit signals $bit_1$, $bit_2$, $bit_3$, and $bit_4$ are 1, 2, 4, and 8, respectively. To accommodate these various weights, each of the SC DACs utilize an amount of charge proportional to the weight of the bit signal supplied to the SC DAC. Thus, C1 is provided with ½ of the charge provided to C2, ¼ of the charge provided to C3, and ⅛ of the charge provided to C4. In other words, the charge provided to C4 is 8 times that provided to C1, 4 times that provided to C2, and 2 times that provided to C3. On clock phase P1, switches S13–S16 are in the closed condition, whereby charge is redistributed among the capacitors so that the voltage across each of the capacitors is indicative of the sum of the values of the bits in the multi-bit signal. The charge on each capacitor is equal to the voltage across that capacitor multiplied by its capacitance. On the phase P2, the output switch S17 is in the closed condition and one of the capacitors delivers its charge to the output terminal.

In one embodiment, the SC DAC 108 (FIG. 3) is formed using a SC DAC 150, where the size of each capacitor C1, C2, C3, C4 of the one-bit DACs 162, 164, 166, 168, respectively, is scaled directly proportionate to the weight of the binary-weighted bit input to the one-bit DACs 162, 164, 166, 168.

Figure 8A:
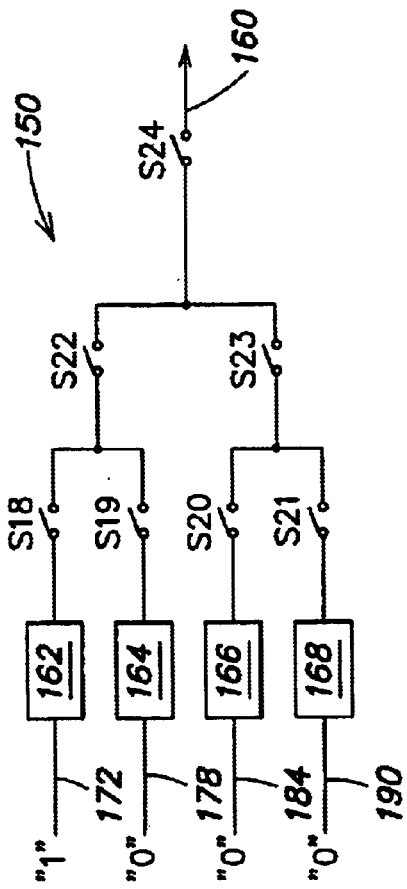
FIGS. 8A–8D are block diagrams showing the operation of another embodiment of the switched capacitor DAC for each of four phases of a non-overlapping four phase clock.
Figure 8B:
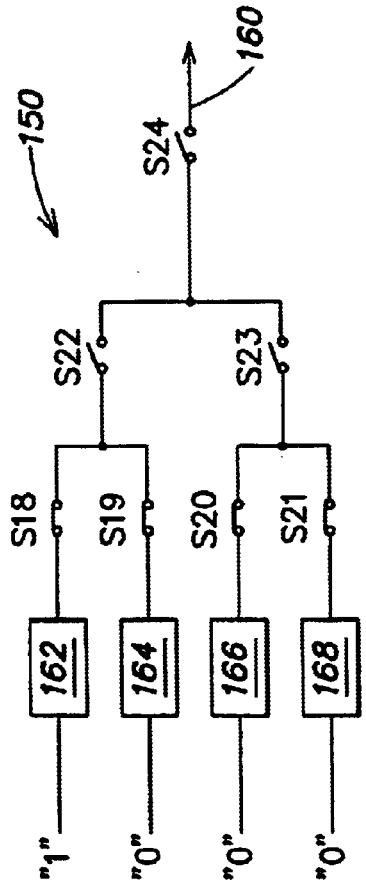

FIGS. 8A–8D are block diagrams showing the operation of another embodiment of the SC DAC 150, for each of 4 phases of a non-overlapping four phase clock (FIG. 9) if input terminals 172, 178, 184, 190, are supplied with digital bit signals $bit_1$, $bit_2$, $bit_3$, $bit_4$, having logic states of 1, 0, 0, 0, respectively. Tables show the relationship between the clock phase and the state (i.e., voltage and charge) of the capacitors in the one-bit DACs. The non-overlapping four phase clock may be derived from a master clock (FIG. 9). The embodiment shown in FIGS. 8A–8D is the same as that shown in FIG. 5 and FIGS. 7A–7C, except that switches S18–S24 replace switches S13–S17. Referring now to FIG. 8A, on phase P3 of the 4-phase clock, capacitor C1 of the one-bit DAC 162 is charged to a voltage $V_{ref}$ in response to the logic state 1 on input terminal 172. Capacitors C2, C3, and C4 of the one-bit DACs 164, 166, 168, respectively, are all discharged to ground in response to the logic state 0 on each of the input terminals 178, 184, 190. All of the charge sharing switches S18–S23 and the output switch S24 are in the open condition. Referring now to FIG. 8B, on phase P4 of the 4-phase clock, charge sharing switches S18, S19, S20, and S21 are in the closed condition wherein the charge on capacitor C1 (FIG. 5). of the one-bit DAC 162 is redistributed. Capacitor C1 retains ½ of the charge and capacitor C2 (FIG. 5) of one-bit DAC 164 receives ½ of the charge. In the event that either capacitor C3 or capacitor C4 had charge, the charge would be redistributed between capacitor C3 and capacitor C4.

Figure 8C:
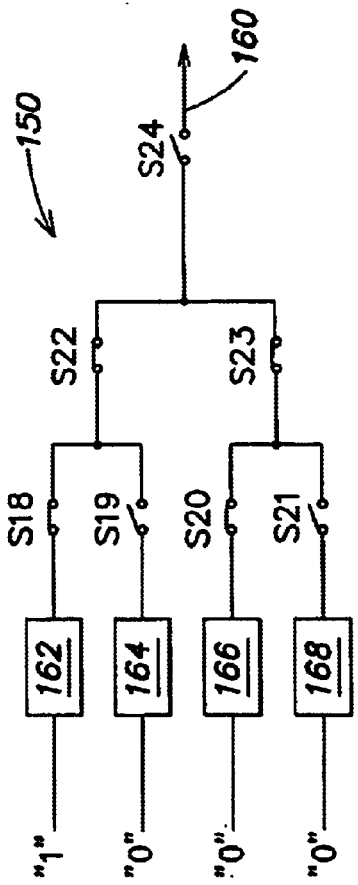
Figure 8D:
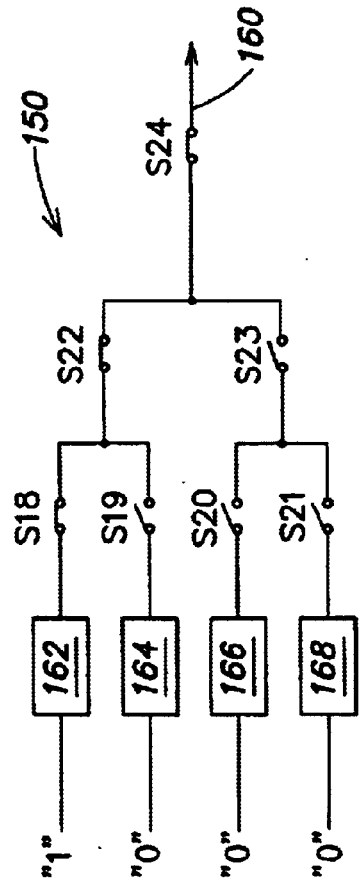
Figure 9:
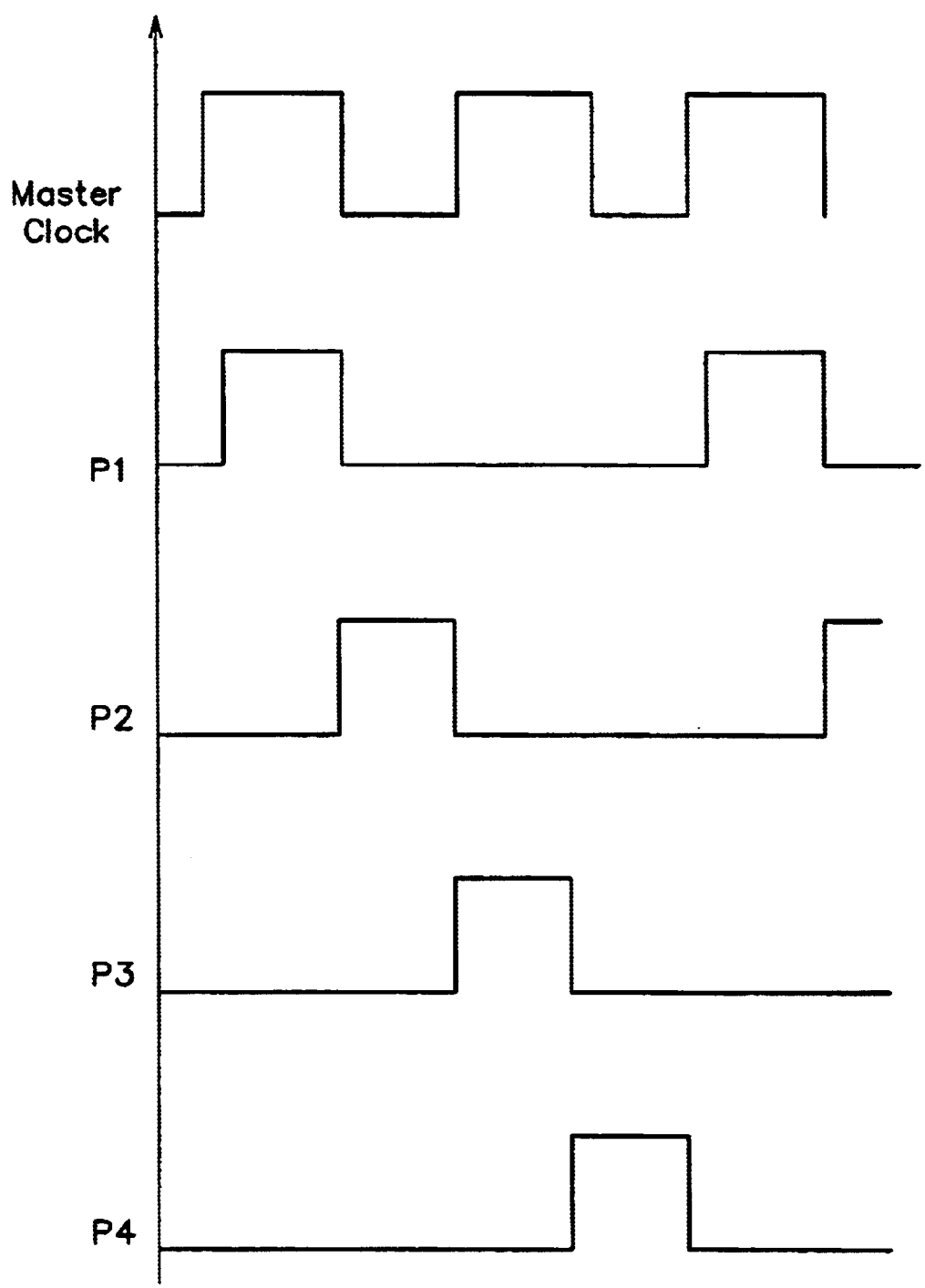
FIG. 9 shows one embodiment of a non-overlapping four phase clock used in the operation of the switched capacitor DAC of FIGS. 8A-8D.

Referring now to FIG. 8C, on phase P1 of the 4-phase clock, charge sharing switches S19 and S21 are in an open condition. Charge sharing switches S22 and S23 are in a closed condition, the charge on capacitor C1 of the one-bit DAC 162 is redistributed between capacitor C1 and capacitor C3 of the one-bit DAC 166. In particular, in one embodiment the charge on the capacitor C1 is divided substantially evenly between capacitor C1 and capacitor C3 such that each ends up with substantially one half of the charge on capacitor C1 in FIG. 8B, i.e., one quarter of the total charge on capacitor C1 in FIG. 8A. Referring now to FIG. 8D, on phase P2 charge-sharing switches S19, S20, S21, and S23 are in an open condition. Also on phase P2 switches S18, S22, and S24, are in a closed condition whereby capacitor C1 (FIG. 5) of the one-bit DAC 162 delivers its charge to the output terminal 160.

Figure 10:
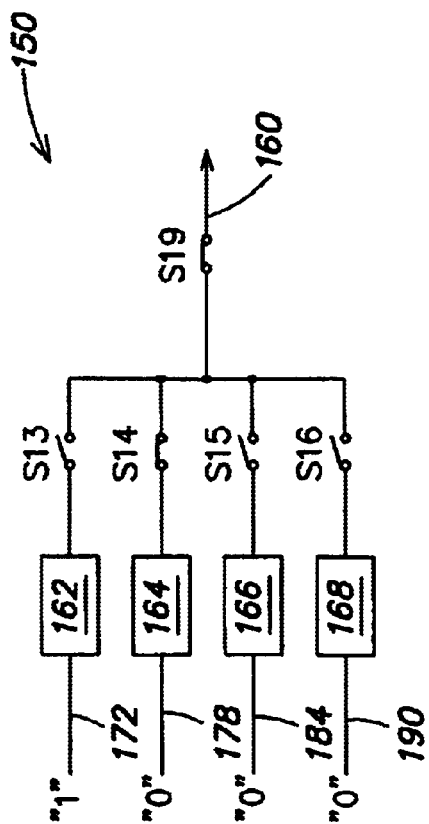
FIG. 10 shows the operation of the switched capacitor DAC of FIGS. 7A–7C on one phase of a non-overlapping four phase clock.

Referring now to FIG. 10, in another embodiment, the SC DAC 150 described with respect to FIGS. 7A–7C operates with a non-overlapping four-phase clock, e.g., the four-phase clock illustrated in FIG. 9 instead of the three phase of FIG. 6. On phase P3 of the four phase clock, the condition of the SC DAC 150 is the same as that described above with respect to FIG. 7A. On phase P4 of the four phase clock, the condition of the SC DAC 150 is the same as that described above with respect to FIG. 7B. On phase P1 of the four phase clock, the condition of the SC DAC 150 is the same as that described above with respect to FIG. 7C. FIG. 10 shows the state of the SC DAC 150 on phase P2 of the four phase clock. On phase P2 of the four phase clock, the charging switches S3, S6, S9, S12 (FIG. 5) are in the open condition, charge sharing switches S13, S15, S16 are in the open condition, and switch S14 and output switch S19 are in the closed condition, wherein C2 of the one-bit DAC delivers its charge to the output terminal 160. Thus, in such embodiment, two copies, each indicative of the sum of the values of the bits in the multi-bit digital input signal, are separately delivered to the output terminal. As described above, in this embodiment, they are delivered one after the other. However, in another embodiment, they may be delivered simultaneously.

FIGS. 11A–11D are block diagrams showing the operation of the embodiment of FIG. 5 for each of 4 phases of a non-overlapping four phase clock (FIG. 9) if input terminals 172, 178, 184, 190, are supplied with digital bit signals $bit_1$, $bit_2$, $bit_3$, $bit_4$, having logic states of 1, 0, 0, 0, respectively. Tables show the relationship between the clock phase and the state (i.e., voltage and charge) of the capacitors in the one-bit DACs. The embodiment shown in FIGS. 11A–11D is the same as that shown in FIG. 5 and FIGS. 7A–7C, except that switches S18–S27 replace switches S13–S17.

Referring now to FIG. 11A, on phase P3 of the 4-phase clock, capacitor C1 of the one-bit DAC 162 is charged to a voltage $V_{ref}$ in response to the logic state 1 on input terminal 172. Capacitors C2, C3, and C4 of the one-bit DACs 164, 166, 168, respectively, are all discharged to ground in response to the logic state 0 on each of the input terminals 178, 184, 190. All of the charge sharing switches S18–S21, S25–S27 are in the open condition. Referring now to FIG. 11B, on phase P4 charge sharing switches S18, S19, S20, and S21 are in a closed condition wherein the charge on capacitor C1 (FIG. 5) of the one-bit DAC 162 is redistributed, whereby capacitor C1 retains ½ of the charge and capacitor C2 (FIG. 5) of one-bit DAC 164 receives ½ of the charge. In the event that either capacitor C3 or capacitor C4 had charge, the charge would be redistributed between capacitor C3 and capacitor C4.

Referring now to FIG. 11C, on phase P1, charge sharing switches S19 and S21 are in an open condition and charge sharing switch S26 is in a closed condition. The charge on capacitor C1 of the one-bit DAC 162 is redistributed between capacitor C1 and capacitor C3 of the one-bit DAC 166. In particular, the charge on the capacitor C1 is divided substantially evenly between capacitor C1 and capacitor C3 such that each ends up with ½ the charge on capacitor C1 in FIG. 11B, i.e., ¼ of the total charge on capacitor C1 in FIG. 11A. Referring now to FIG. 11D, on P2 charge sharing switches S19, S20, S21, S26, and S27, are in an open condition, and switches S18, and S25, are in the closed condition whereby capacitor C1 of the one-bit DAC 162 (FIG. 5) delivers its charge to the output terminal 160. Although switch S27 is in an open condition on phase P2 and does not deliver charge, in other embodiments, switch S27 may be configured to be in a closed condition on phase P2 so that switch S27 delivers a copy of the charge, which is in addition to the copy delivered by switch S25. In still further embodiments, an additional clock phase, e.g., a phase P5, is provided and switch S27 is used to deliver a copy of the charge on phase P5.

Figure 12A:
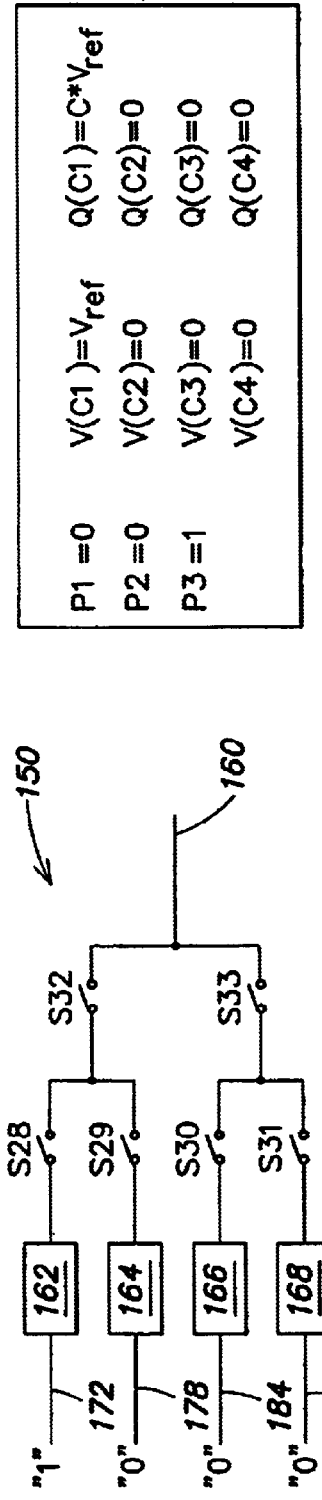
FIGS. 12A–12C are block diagrams showing the operation of another embodiment of the switched capacitor DAC of FIG. 5 for each of the three clock phases of a non-overlapping three phase clock.
Figure 12B:
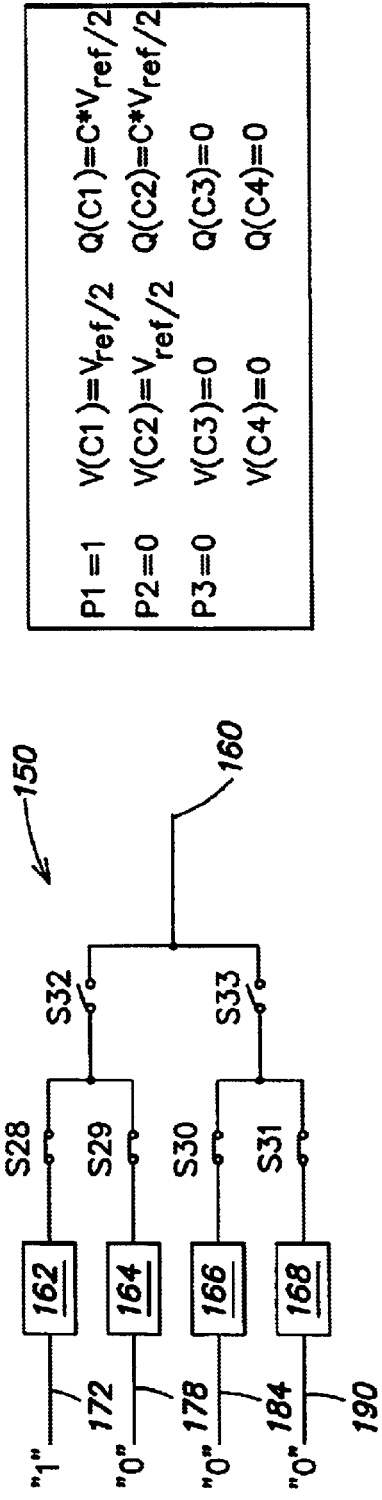
Figure 12C:
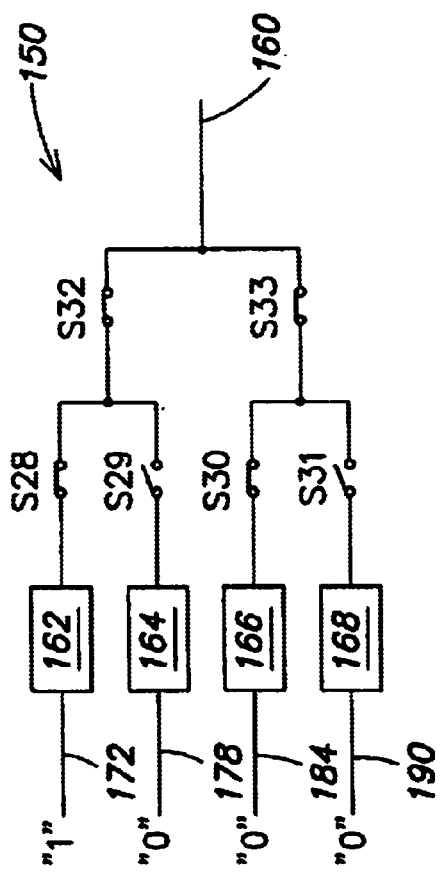

FIGS. 12A–12C are block diagrams showing the operation of another embodiment of the SC DAC 150 of FIG. 5 for each of the 3 clock phases if input terminals 172, 178, 184, and 190 are supplied with digital bit signals $bit_1$, $bit_2$, $bit_3$, bit, having logic states of 1, 0, 0, 0, respectively. Tables show the relationship between the clock phase and the state (i.e., voltage and charge) of the capacitors in the one-bit DACs. The embodiment shown in FIGS. 12A–12C is the same as that shown in FIG. 5 and FIGS. 7A–7C, except that switches S28–S33 replace switches S13–S17. Referring now to FIG. 12A, on phase P3 of the 3-phase clock, all of the switches S28–S33 are in the open condition. The capacitor C1 is charged to $V_{ref}$ in response to the logic state 1 on terminal 172. Capacitors C2, C3 and C4 are all discharged to ground in response to the logic state 0 signals on terminals 178, 184, 190, respectively. Referring now to FIG. 12B, on phase P1 of the 3-phase clock,, all of the charging switches S3, S6, S9 and S12 (FIG. 5) and the switches S32, S33 are in an open condition, and all of the charge sharing switches S28–S31 are in a closed condition, wherein the charge on capacitor C1 (FIG. 5) of the one-bit DAC 162 is redistributed, whereby capacitor C1 retains ½ of the charge and capacitor C2 (FIG. 5) of one-bit DAC 164 receives ½ of the charge. In the event that either capacitor C3 or capacitor C4 had charge, the charge would be redistributed between capacitor C3 and capacitor C4. Referring now to FIG. 12C, on phase P2 of the 3-phase clock charge sharing switches S29 and S31 are in the open condition, switches S32 and S33 are in the closed condition, and capacitors C1 of one-bit DAC 162 (FIG. 5) and C3 of one-bit DAC 166 (FIG. 5) delivers their charge to the output terminal 160. On the next phase P3 (not shown), the multi-bit digital signal $bit_1$, $bit_2$, $bit_3$, and $bit_4$ may be updated and provided to the DAC 150 via input terminals 172, 178, 184, 190.

Figure 13:
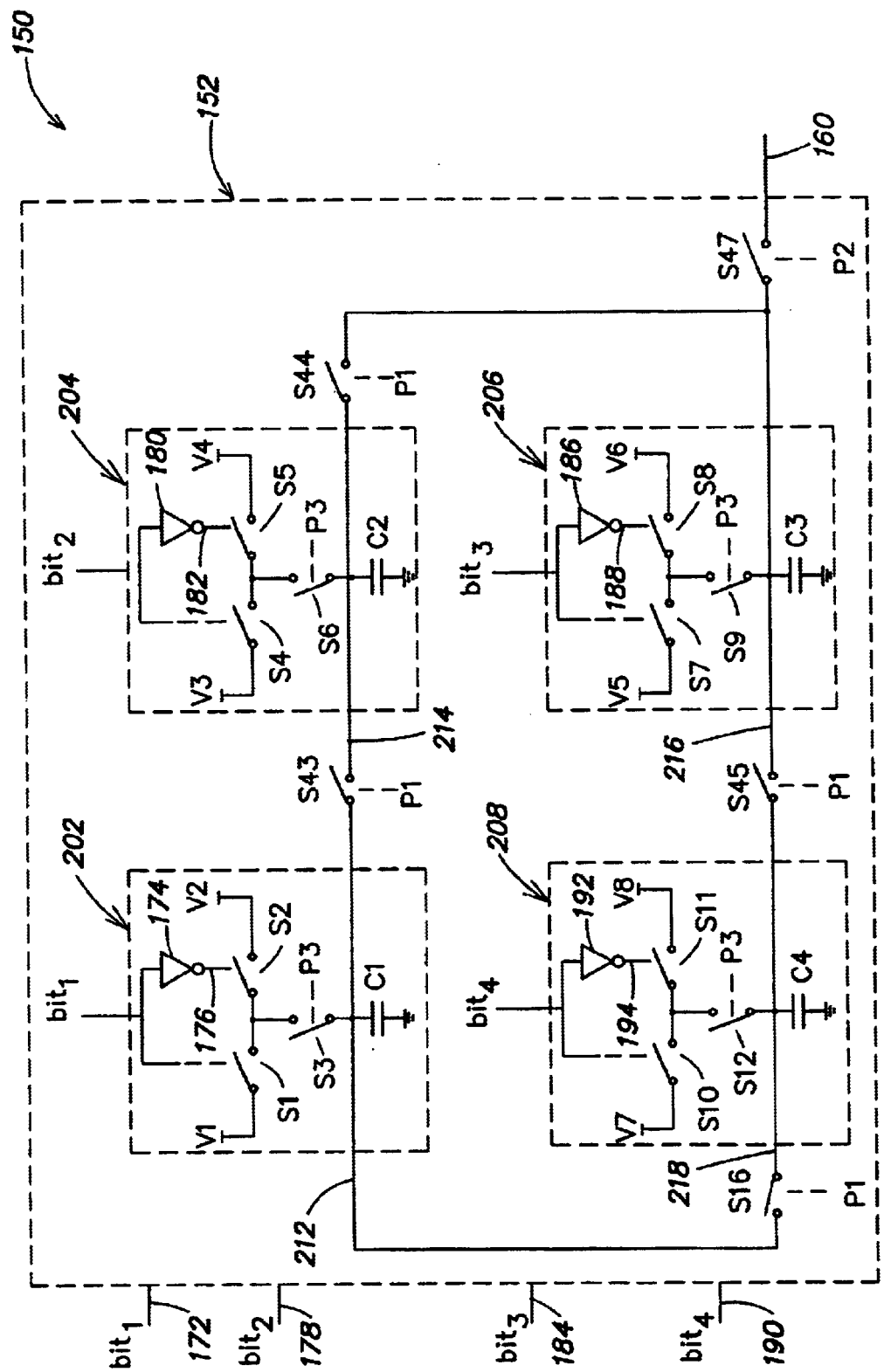
FIG. 13 is a schematic diagram of another embodiment of the switched capacitor DAC of FIG. 4.

FIG. 13 is a schematic diagram of another embodiment of the SC DAC 150, which receives the 4-bit digital signal, $bit_1$, $bit_2$, $bit_3$, $bit_4$, on input terminals 172, 178, 184, and 190, respectively, and outputs an analog signal on output terminal 160 indicative of a sum of the values of the bits in the 4-bit digital signal. In this embodiment, the SC DAC 150 comprises four one-bit DACs 202, 204, 206, 208 which are similar to the one-bit DACs 162, 164, 166, 168 (FIG. 5) except that the one-bit DACs 202, 204, 206, 208 each have an additional path 212, 214, 216, 218, respectively, that connects to the respective capacitor C1, C2, C3, C4. The first terminal of the capacitor C1 connects to a first terminal of a charge sharing switch S43, a second terminal of which connects to the first terminal of the capacitor C2. The first terminal of the capacitor C2 further connects to a first terminal of a charge sharing switch S44, a second terminal of which connects to the first terminal of the capacitor C3 which is further connected to a first terminal of a charge sharing switch S45. A second terminal of the charge sharing switch S45 is connected to the first terminal of the capacitor C4 which further connects to a first terminal of a charge sharing switch S46. A second terminal of the charge sharing switch S46 connects to the first terminal of the capacitor C1. The first terminal of the capacitor C3 is further connected to a first terminal of an output switch S47, a second terminal of which connects to the output terminal 160.

Figure 14A:
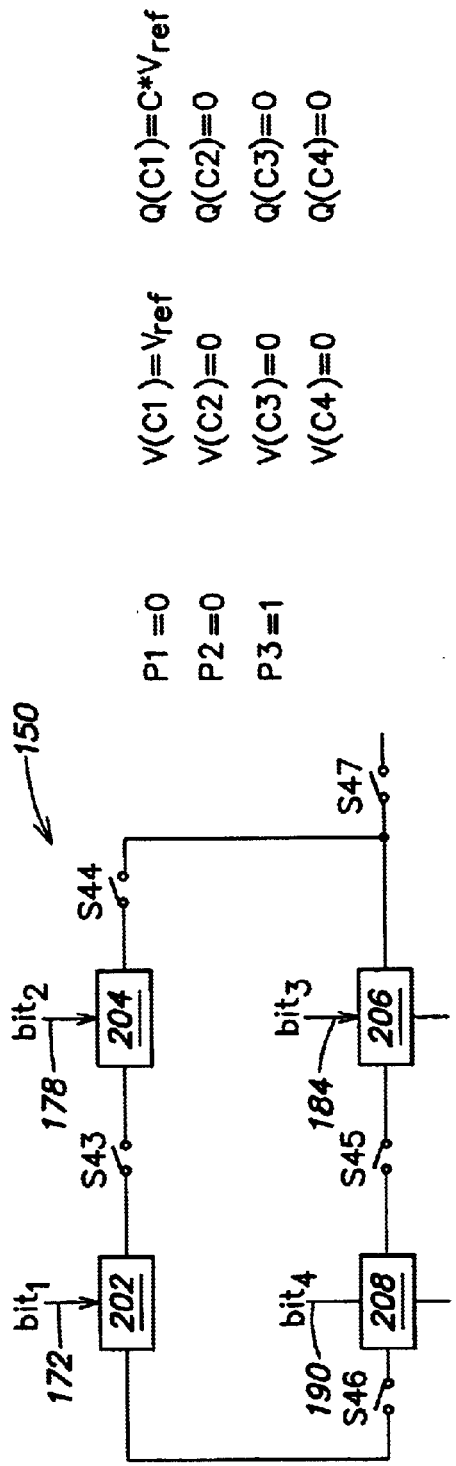
FIGS. 14A–14C are block diagrams showing the operation of the switched capacitor DAC of FIG. 13.
Figure 14B:
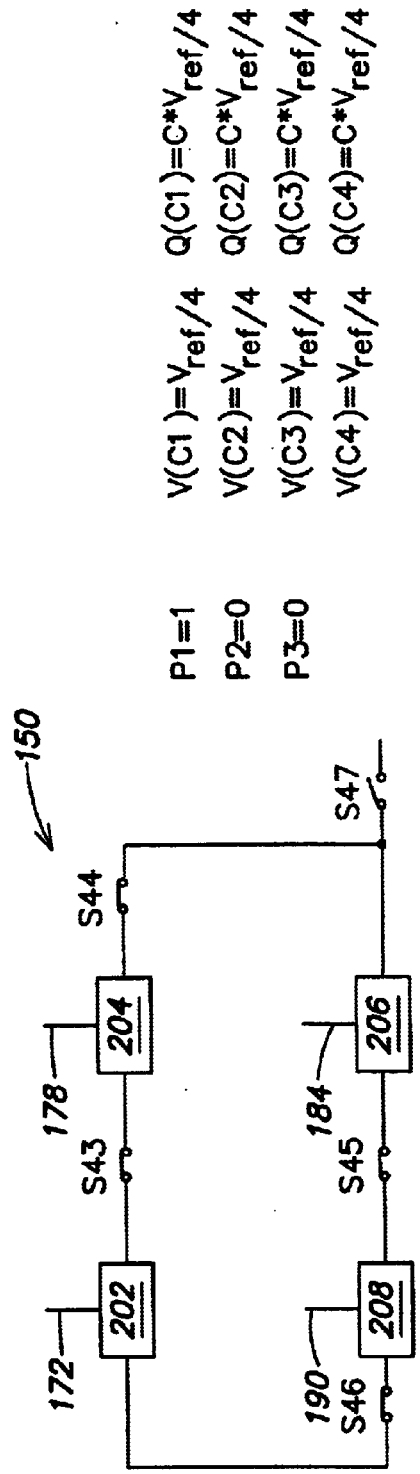
Figure 14C:
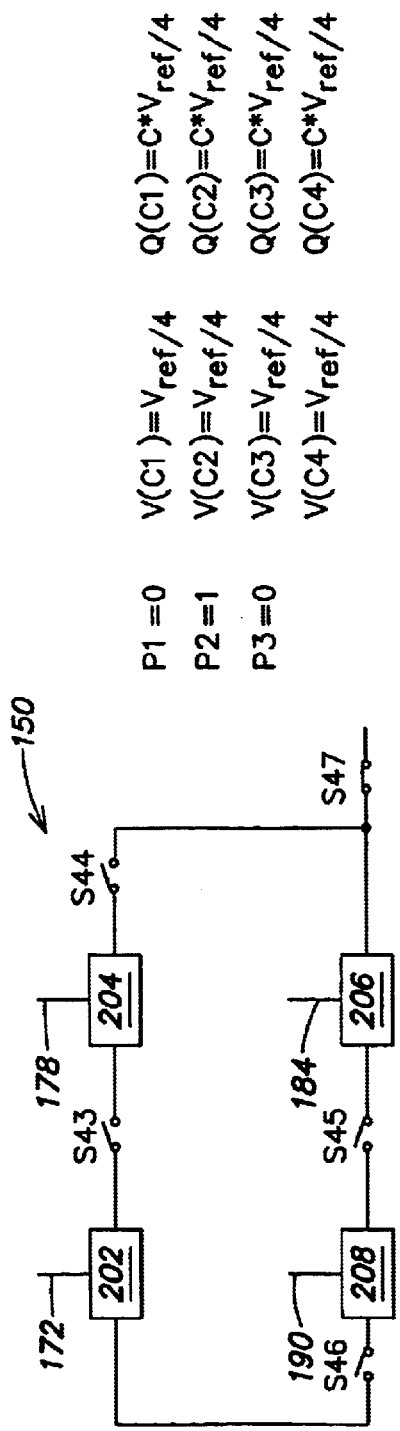

FIGS. 14A–14C are block diagrams showing the operation the SC DAC 150 of FIG. 13 if input terminals 172, 178, 184, and 190 are supplied with digital bit signals $bit_1$, $bit_2$, $bit_3$, $bit_4$, having logic states of 1, 0, 0, 0, respectively. Tables show the relationship between the clock phase and the state (i.e., voltage and charge) of the capacitors in the one-bit DACs. Referring now to FIG. 14A, on phase P3 of the 3-phase clock, all of the charge sharing switches S43, S44, S45, and S46 and the output switch S47, are in the open condition. The capacitor C1 is charged to $V_{ref}$ in response to the logic 1 on terminal 172. Capacitors C2, C3 and C4 are all discharged to ground in response to the logic 0 signals on terminals 178, 184, 190, respectively. Referring now to FIG. 14B, on phase P1 of the 3-phase clock all of the charging switches S3, S6, S9 and S12 (FIG. 13) and the output switch S47 are in an open condition, and all of the charge sharing switches S43, S44, S45 and S46 are in a closed condition, whereby charge is redistributed and results in the total charge on all of the capacitors being divided among all of the capacitors. Because the capacitors C1, C2, C3, C4 all have the same capacitance value, the charge is shared equally so that the voltage across each capacitor becomes $V_{ref}/4$. Referring now to FIG. 14C, on phase P2 charge sharing switches S43, S44, S45, and S46 are in the open condition, output switch S47 is in the closed condition, and capacitor C1 (FIG. 5) of one-bit DAC 202 delivers its charge to the output terminal 160. On the next phase P3 (not shown), the multi-bit digital signal $bit_1$, $bit_2$, $bit_3$, and $bit_4$ may be updated and provided to the DAC 150 via input terminals 172, 178, 184, 190.

Other embodiments have further DAC and switch arrangements and configurations. For example, in one embodiment, the DAC includes one-bit DACs that are substantially identical to one another, and interconnected through the switch network to form an "open arrangement", such embodiment being referred to herein as a "snake arrangement".

Figure 15:
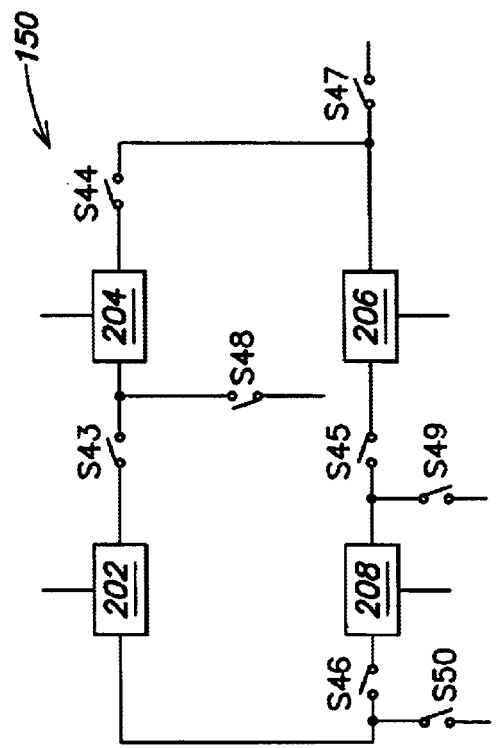
FIG. 15 is a block diagram of another embodiment of the switched capacitor DAC of FIG. 4.

FIG. 15 is a block diagram of another embodiment of the SC DAC 150, which is similar to the SC DAC 150 illustrated in FIGS. 9, 10A–10C, except that the SC DAC 150 of FIG. 15 further comprises a switch S48, a switch S49, and a switch S50. A first terminal of the switch S48 is connected to the second terminal of the charge sharing switch S43. A first terminal of the switch S49 is connected to the second terminal of the charge sharing switch S45. A first terminal of the switch S50 is connected to the second terminal of the charge sharing switch S46. Each of the switches S48, S49, and S50 may, but need not serve one or more of the functions noted hereinbelow. In one embodiment, one purpose of the switches S48, S49, S50 is to provide parasitic capacitance similar to that of output switch S47, so as to help cancel the effect of the parasitic capacitance of switch S47.

Figure 16A:
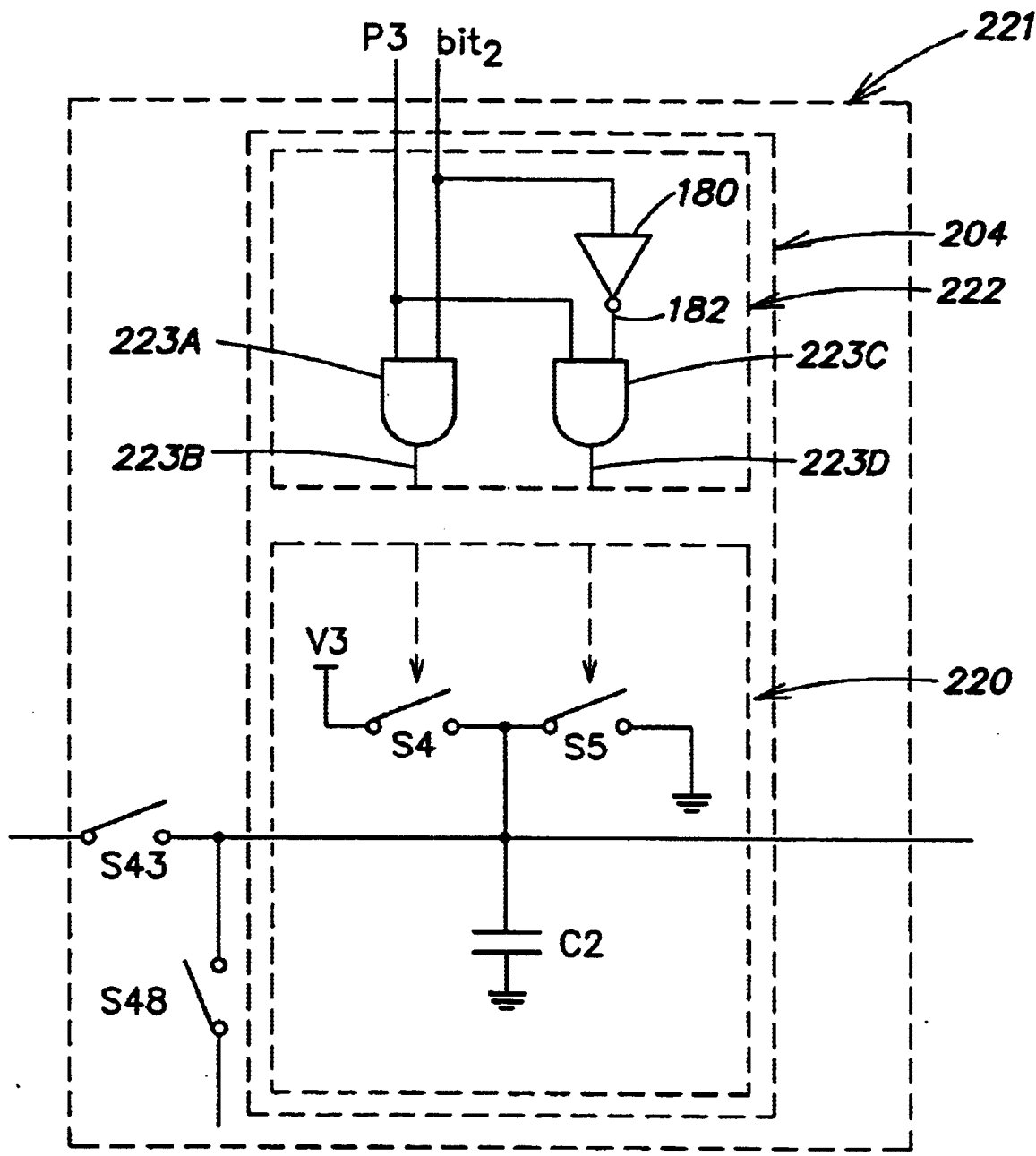
FIG. 16A shows a schematic diagram of another embodiment of the one-bit DAC of the switched capacitor DAC of FIG. 13.

FIG. 16A shows a schematic diagram of another embodiment of a one-bit DAC 221, that includes the one-bit DAC 204, the switch S43 and the switch S48 of the SC DAC 150 of FIG. 15. The one-bit DAC 204 includes a switched capacitor (SC) portion 220 and a switch control portion 222. The SC portion 220 includes the switch S4, the switch S5, and the capacitor C2. The switch control portion 222 has an AND gate 223A that receives the phase signal P3 and the digital signal $bit_2$ and outputs a signal, on signal line 223B, that is used to control the switch S4. The digital signal $bit_2$ is further provided to the inverter 180, which outputs a signal 182 that is supplied to an AND gate 223C that further receives the phase signal P3 and outputs a signal, on signal line 223D, that is used to control the switch S5.

Figure 16B:
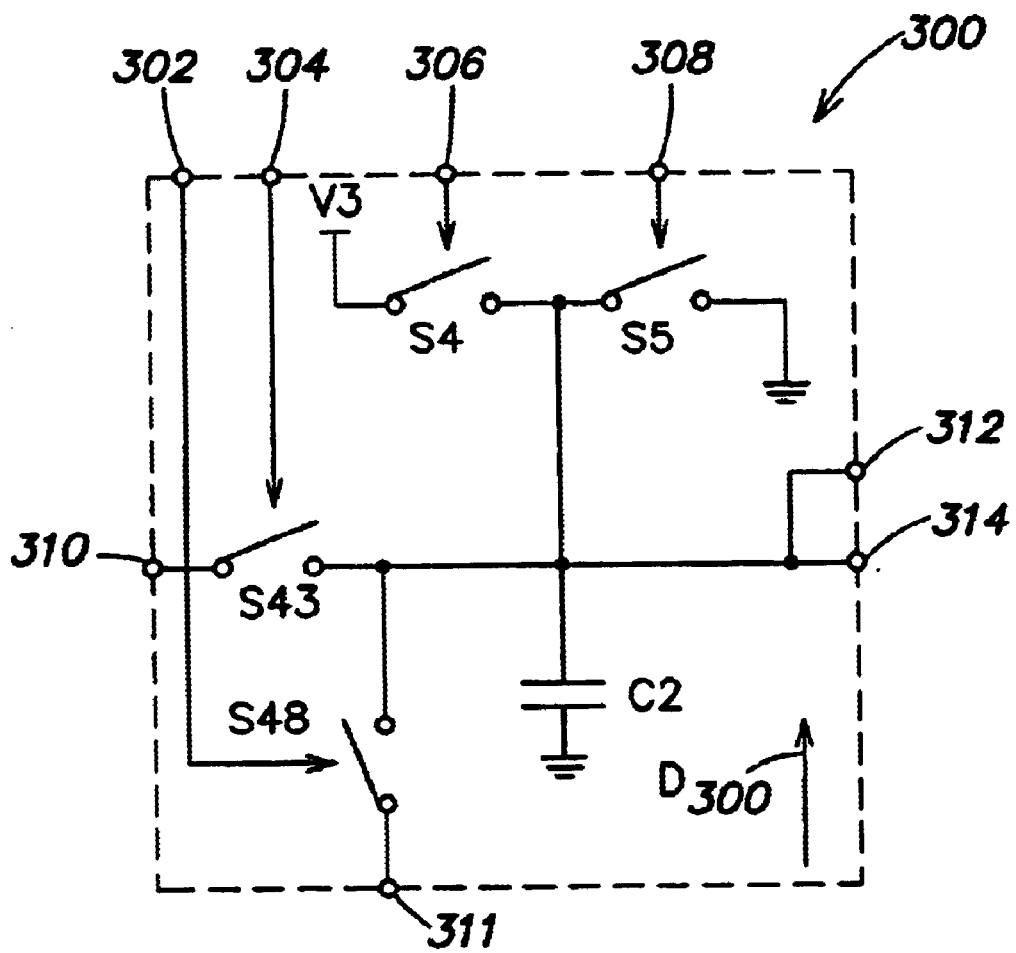
FIG. 16B shows a schematic diagram representative of one embodiment of a switched capacitor cell which may for example be used in forming a switched capacitor DAC.

FIG. 16B shows a schematic diagram representative of one embodiment of a layout of a switched capacitor cell (SC cell) 300, which may be used for example in forming a SC DAC. In this embodiment, the SC cell 300 comprises the SC portion 220 (FIG. 16A) of the one-bit DAC 204 (16A) including the switch S4, the switch S5, and the capacitor C2. The SC cell 300 further includes switch S43, switch S48, and conductors to provide control signals to the switches of the SC cell 300. For example, SC cell 300 includes a conductor with a terminal 302 to provide a control signal to switch S48, a conductor with a terminal 304 to provide a control signal to switch S43, a conductor with a terminal 306 to provide a control signal to switch S4, and a conductor with a terminal 308 to provide a control signal to switch S5. The SC cell further includes a conductor with a terminal 310 to connect to a terminal of the switch S43, a conductor with a terminal 311 to connect to a terminal of the switch S48, and further includes a conductor with a set of terminals 312, 314 to connect to the capacitor C2. The terminals 302, 304, 306, 308, 310, 311, 312, 314, are disposed along the perimeter of the SC cell 300. The SC cell has a reference direction $D_{300}$.

In this embodiment, the footprint of each SC cell is square or at least substantially square. In another example embodiment, the footprint may be octagonal or at least substantially octagonal. In one embodiment, switch terminal 310 has substantially identical composition and surface area as switch terminal 311, and contributes the same amount of capacitance as switch terminal 311. In one embodiment, the capacitor is disposed such that the center of the capacitor coincides with, or at least substantially overlays, the center of the footprint of the SC cell.

Figure 16C:
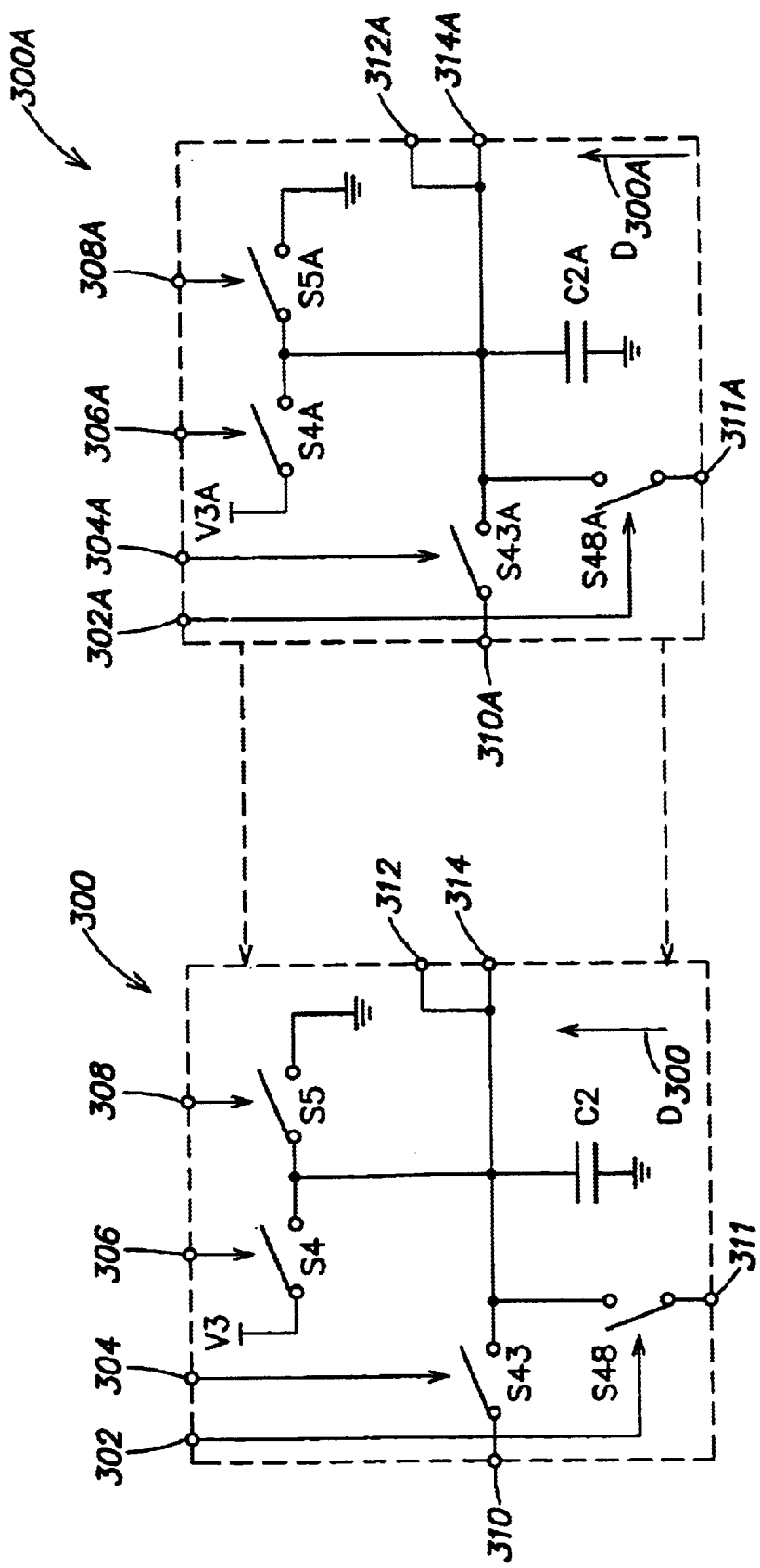
FIG. 16C shows a schematic diagram of one embodiment of two switched capacitor cells to be interconnected.

Referring now to FIG. 16C, an SC cell 300A is schematically identical to the SC cell 300. The SC cell 300A has a reference direction $D_{300A}$. The SC cell 300 is adapted to electrically connect to the SC cell 300A if the SC cell 300A is positioned adjacent to the SC cell 300 and oriented such that its reference direction $D_{300A}$ is directed in the same direction as the reference direction $D_{300}$ of the SC cell 300. In such position and orientation, the terminal 314 on SC cell 300 electrically connects to the terminal 310A on SC cell 300A, thereby coupling capacitor C2 of SC cell 300 to capacitor C2A of SC cell 300A through switch S43A.

Figure 16D:
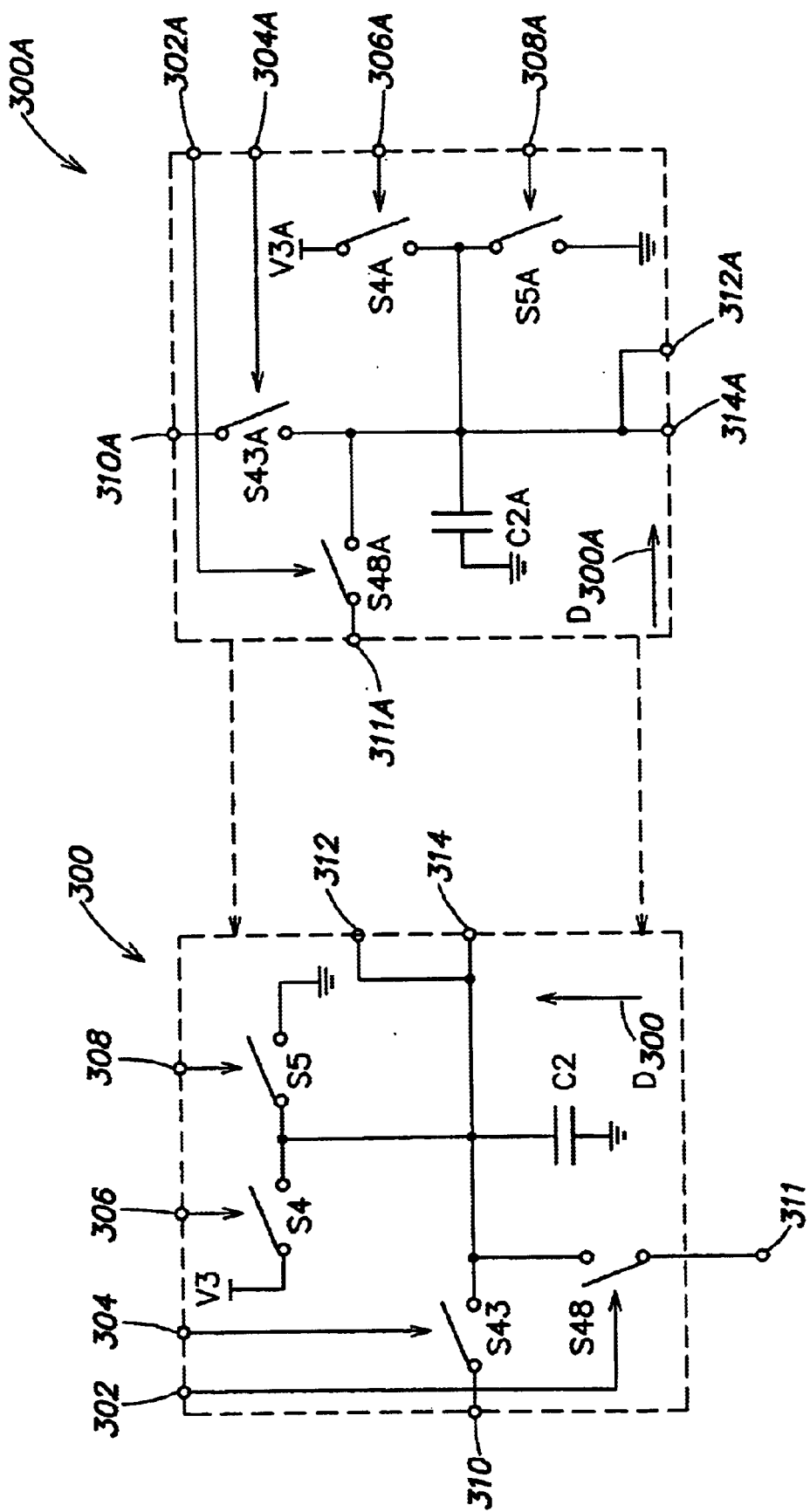
FIG. 16D shows a schematic diagram of one embodiment of two switched capacitor cells to be oriented substantially perpendicular to one another and interconnected.

Referring now to FIG. 16D, in some embodiments, the SC cell 300 is further adapted to electrically connect to the SC cell 300A if the SC cell 300A is positioned adjacent to the SC cell 300 and oriented such that its reference direction is directed in a direction having a predetermined angular offset from the reference direction $D_{300}$ of the SC cell 300. In this embodiment, the predetermined angular offset is ninety degrees. In other embodiments, other predetermined angular offsets may be employed. In such position and orientation, the terminal 312 on SC cell 300 electrically connects to the terminal 311A on SC cell 300A, thereby coupling capacitor C2 of SC cell 300 to capacitor C2A of SC cell 300A through switch S48A.

Figure 16E:
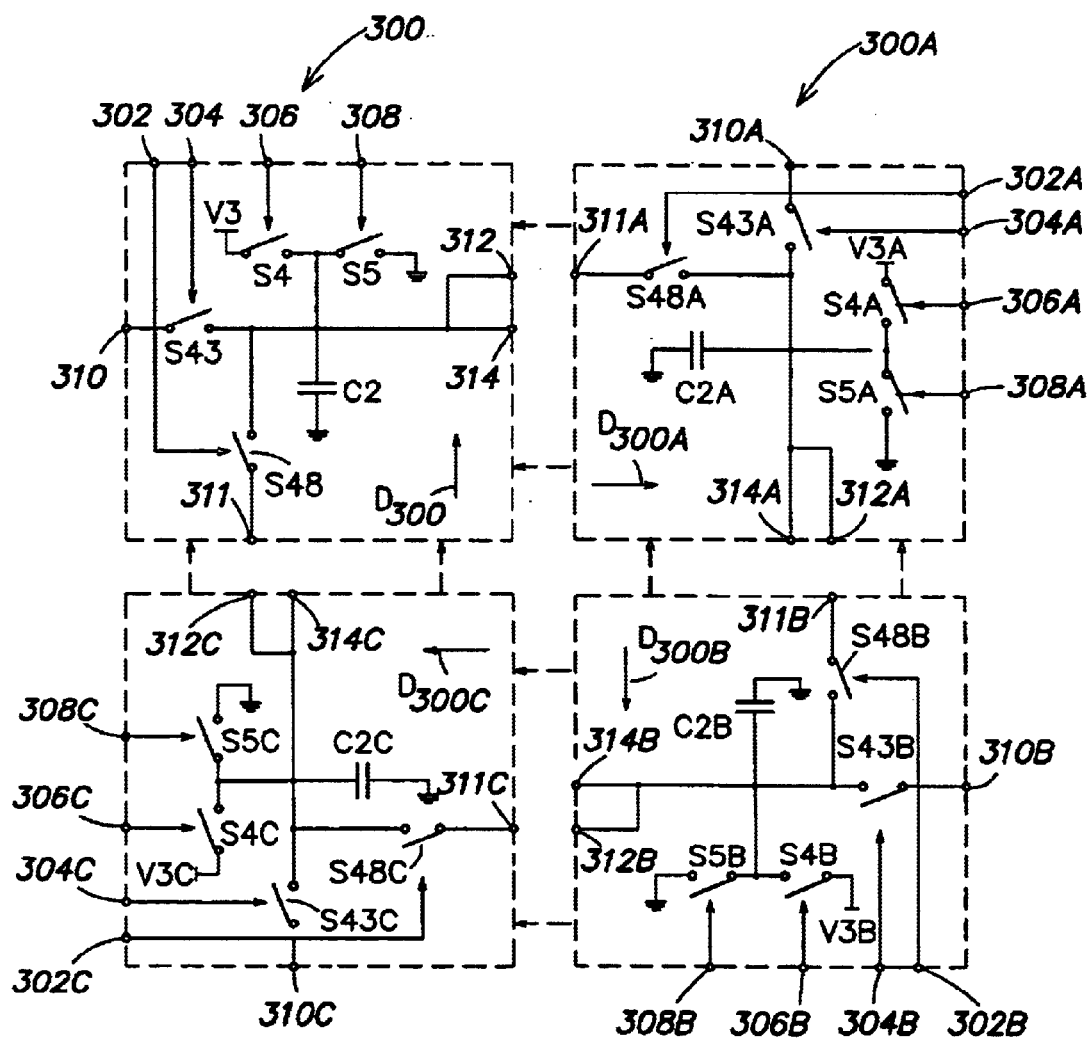
FIG. 16E shows a schematic diagram of one embodiment of four switched capacitor cells to be interconnected in a ring arrangement.

FIG. 16E shows four identical SC cells, i.e., an SC cell 300, an SC cell 300A, an SC cell 300B, and a SC cell 300C. The SC cell 300 has a reference direction $D_{300}$. The SC cell 300A has a reference direction D300A. The SC cell 300B has a reference direction $D_{300B}$. The SC cell 300C has a reference direction $D_{300C}$. The SC cell 300A is oriented such that its reference direction $D_{300B}$ is directed in a direction offset ninety degrees from the reference direction $D_{300}$. The SC cell 300B is oriented such that its reference direction $D_{300B}$ is directed in a direction offset ninety degrees from the reference direction $D_{300A}$. The fourth SC cell 300C is oriented such that its reference direction $D_{300C}$ is directed in a direction offset ninety degrees from the reference direction $D_{300B}$. Such embodiment is one type of a "ring arrangement". If the SC cells 300, 300A, 300B, 300C are positioned adjacent to one another and oriented as shown, then each of the SC cells has a switch terminal 311 connected to a capacitor terminal 312 of a neighboring SC cell, and further has a capacitor terminal 312 connected to a switch terminal 311 of a neighboring cell.

Figure 17:
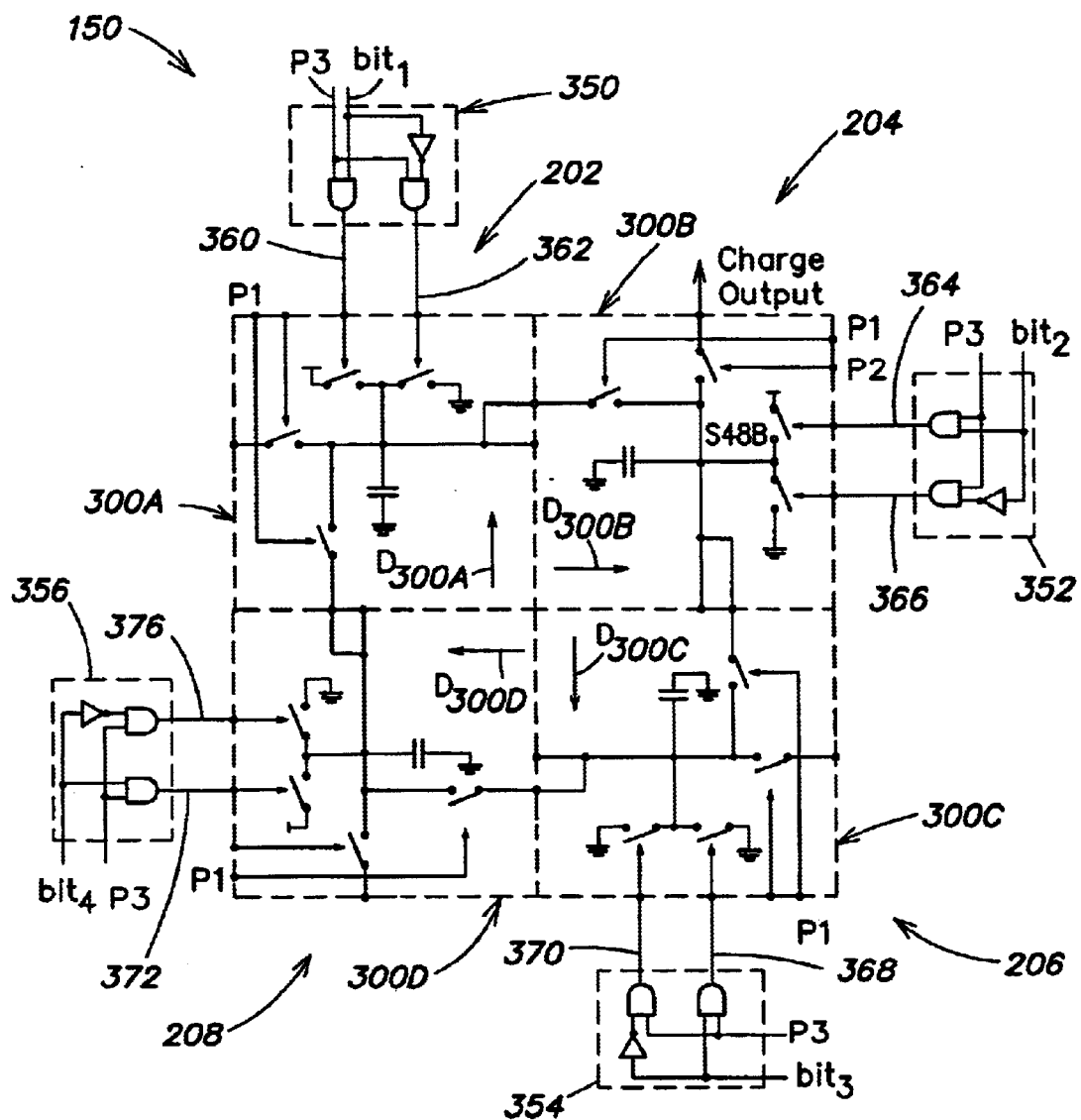
FIG. 17 shows one embodiment of a DAC formed in part by the switched capacitor cells of FIG. 16E.

FIG. 17 shows one embodiment of the SC DAC 150 that is formed, at least in part, by SC cells arranged into a "ring arrangement". In this embodiment, the SC DAC 150 includes four one-bit DACs 202, 204, 206, 208. The one-bit DAC 202 includes an SC cell 300A and a switch control portion 350. The one-bit DAC 204 includes an SC cell 300B and a switch control portion 352. The one-bit DAC 206 includes an SC cell 300C and a switch control portion 354. The one-bit DAC 208 includes the SC cell 300D and a switch control portion 356. The SC cell 300A has a reference direction $D_{300A}$. The SC cell 300B has a reference direction $D_{300B}$. The SC cell 300C has a reference direction $D_{300C}$. The SC cell 300D has a reference direction $D_{300D}$. The reference direction $D_{300B}$ is directed in a direction that is offset ninety degrees from the reference direction $D_{300A}$. The reference direction $D_{300C}$ is directed in a direction that is offset ninety degrees from the reference direction $D_{300B}$. The reference direction $D_{300D}$ is directed in a direction that is offset ninety degrees from the reference direction $D_{300C}$.

The digital signal $bit_1$ and the phase P3 signal are supplied to the switch control portion 350, which generates switch control signals, on signal lines 360, 362 supplied to the SC cell 300A. The digital signal $bit_2$ and the phase P3 signal are supplied to the switch control portion 352, which generates switch control signals, on signal lines 364, 366 supplied to the SC cell 300B. The digital signal $bit_3$ and the phase P3 signal are supplied to the switch control portion 354, which generates switch control signals on signal lines 368, 370 supplied to the SC cell 300C. The digital signal $bit_4$ and the phase P3 signal are supplied to the switch control portion 356, which generates switch control signals, on signal lines 372, 376 supplied to the SC cell 300D.

Figure 18:
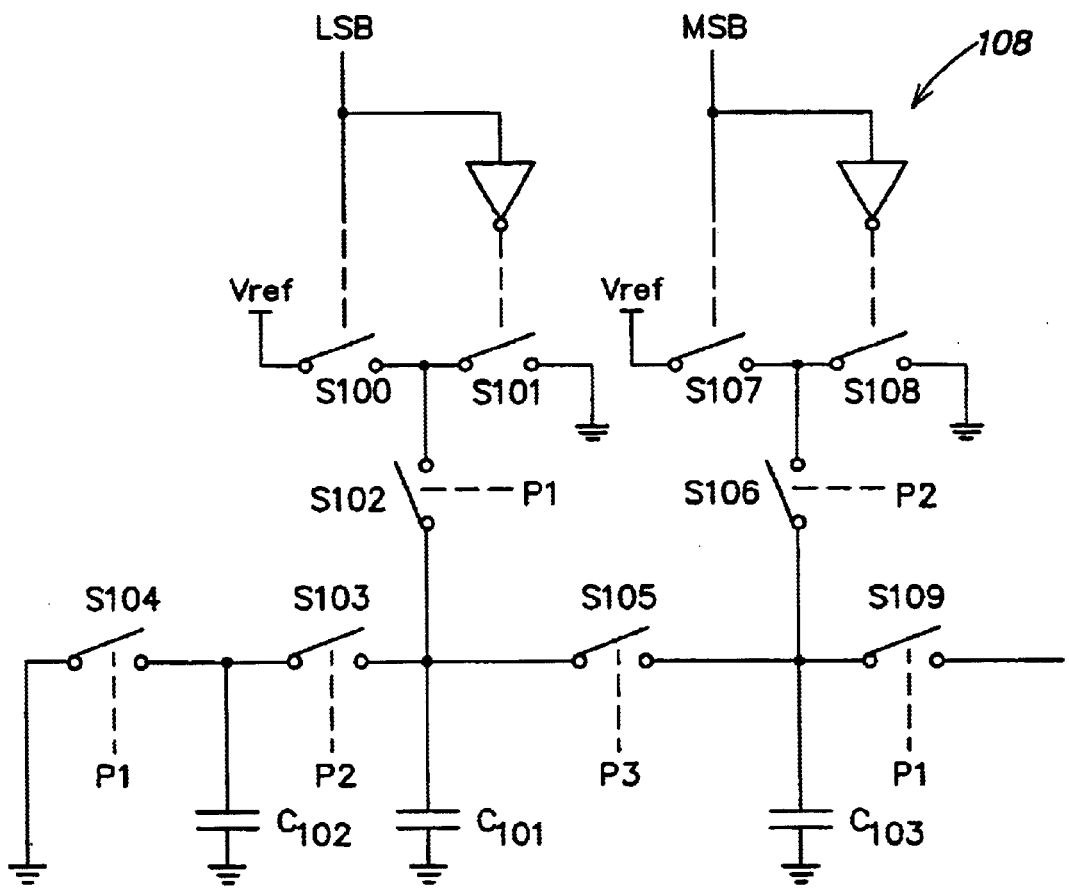
FIG. 18 shows an embodiment of a switched capacitor DAC adapted to convert a binary weighted input signal into a corresponding analog signal.

FIG. 18 shows an embodiment of the SC DAC 108 (FIG. 3) that is adapted to convert a two bit binary-weighted input signal $bit_1$, $bit_2$ into a corresponding analog signal. This embodiment of a switched capacitor DAC is disclosed in F-J. Wang et al., "A Quasi-Passive CMOS Pipeline D/A converter", IEEE Journal of Solid State Circuits, Vol. 24, no. 6, Dec 1989, pp. 1752–1755. In this embodiment of the SC DAC 108, the values of C101, C102, C103 are substantially identical. The SC DAC 108 receives a non-overlapping 3-phase clock, P1, P2, P3, e.g., shown in FIG. 3. The closed/open condition of the switches S102, S103, S104, S105, S106, S109 is controlled by the 3-phase clock. The closed/open condition of the switches S100, S101, and the switches S107, S108 are controlled by the logic state of the LSB and the MSB, respectively.

Figure 19A:
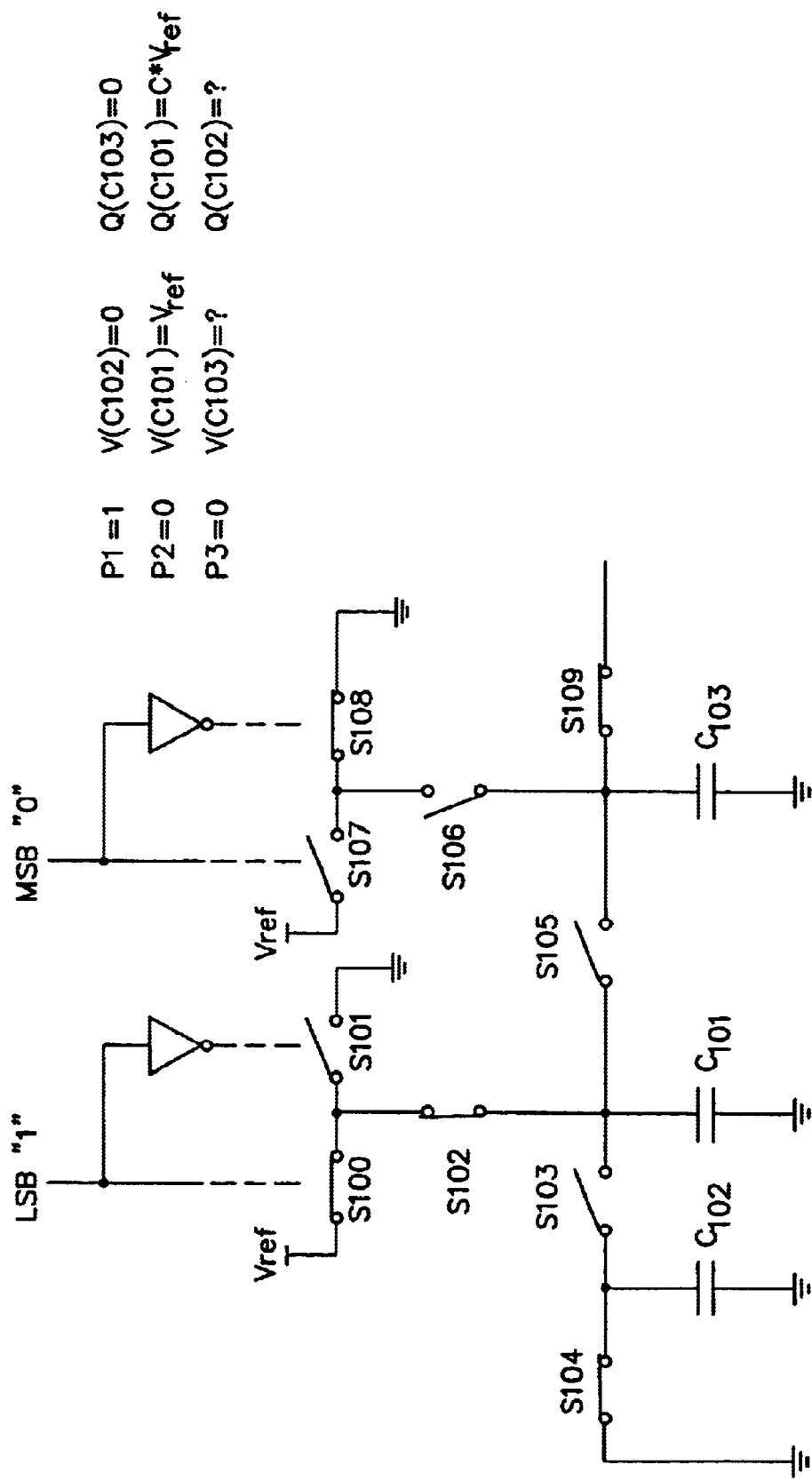
FIGS. 19A–19C are block diagrams showing the operation of the switched capacitor DAC of FIG. 18.
Figure 19B:
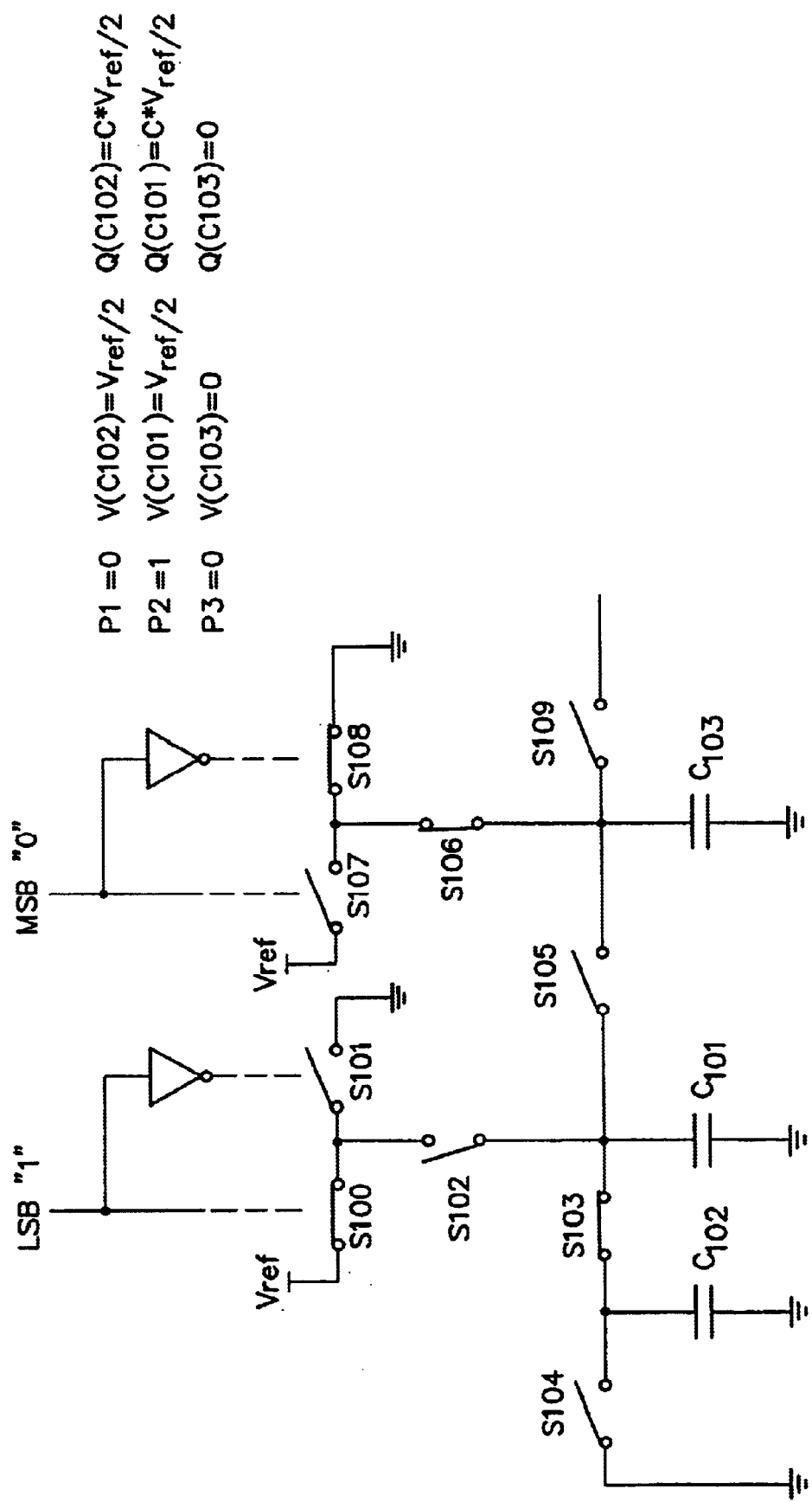
Figure 19C:
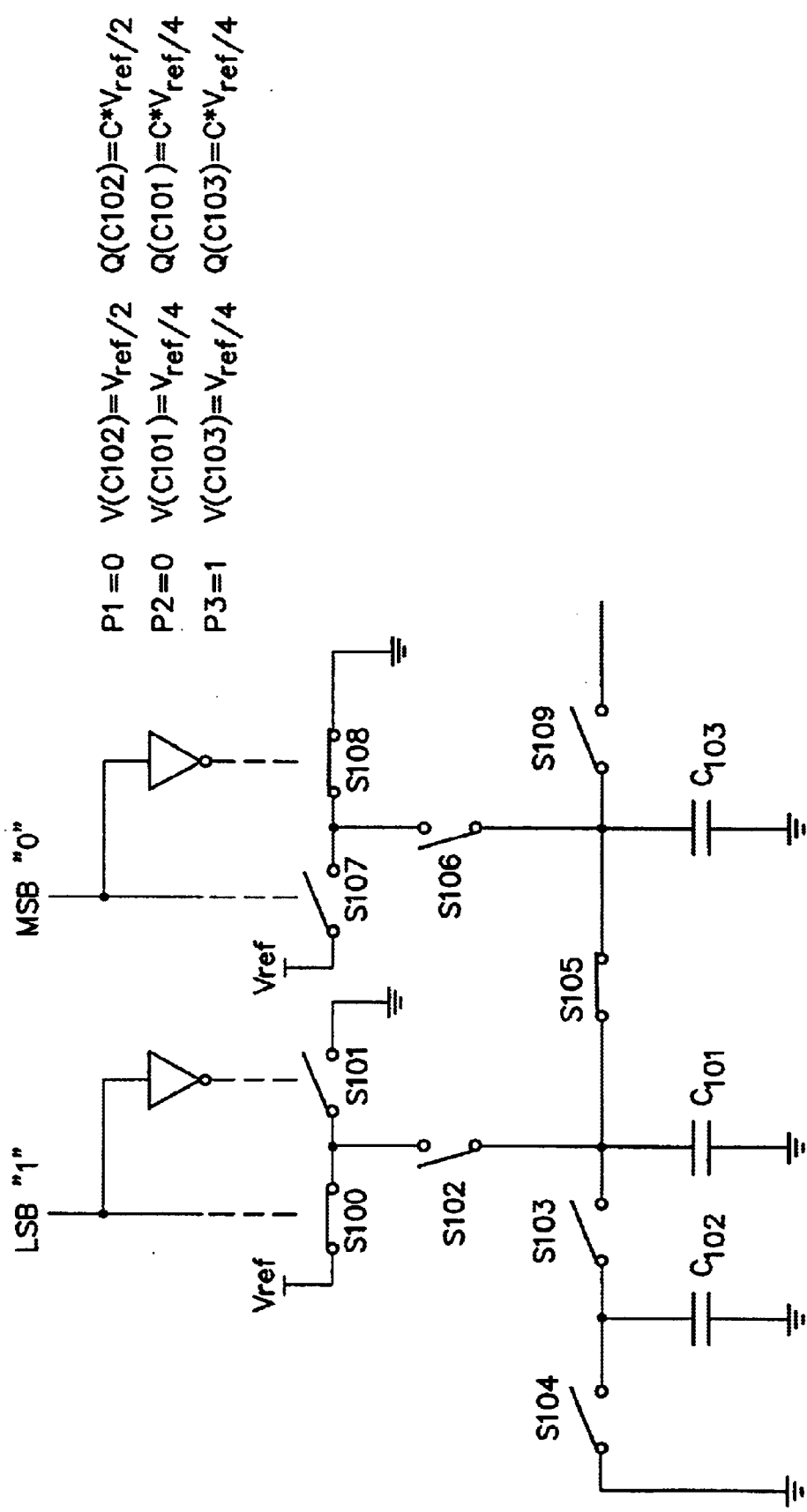

FIGS. 19A–19C are block diagrams showing the operation of the SC DAC 108 of FIG. 18 for each of the 3 clock phases in the event that the LSB and the MSB digital input signals have logic states of 1, 0, respectively. Tables show the relationship between the clock phase, and the state (i.e., voltage and charge) of the capacitors in the one-bit DACs. Referring now to FIG. 19A, on phase P1 of the 3-phase clock, switch S102 and switch S104 are in the closed condition whereby capacitor C102 is discharged to ground, and capacitor C101 is charged to $V_{ref}$ in response to the state of the LSB. Referring now to FIG. 19B, on phase P2 switches S102 and S104 are in the open condition. Switch S103 is in the closed condition whereby C101 and C102 split the charge initially stored on C101. Because the capacitors C101 and C102 have the substantially the same capacitance value, the charge is shared equally so that the voltage across each capacitor becomes $V_{ref}/2$. Referring now to FIG. 19C, on P3 of the 3-phase clock charge sharing switch S105 is in the closed condition, S102–S104, S106, and S109 are in the open condition. C101 and C103 share charge, in specific, C101 and C103 split the charge from C101. Because the capacitors C101 and C102 have substantially the same capacitance value, the charge is shared equally so that the voltage across each capacitor becomes $V_{ref}/4$. On the next phase P1 (see FIG. 19A for switch configuration), output switch S109 is in the closed condition, and capacitor C103 delivers its charge to the output.

Figure 20:
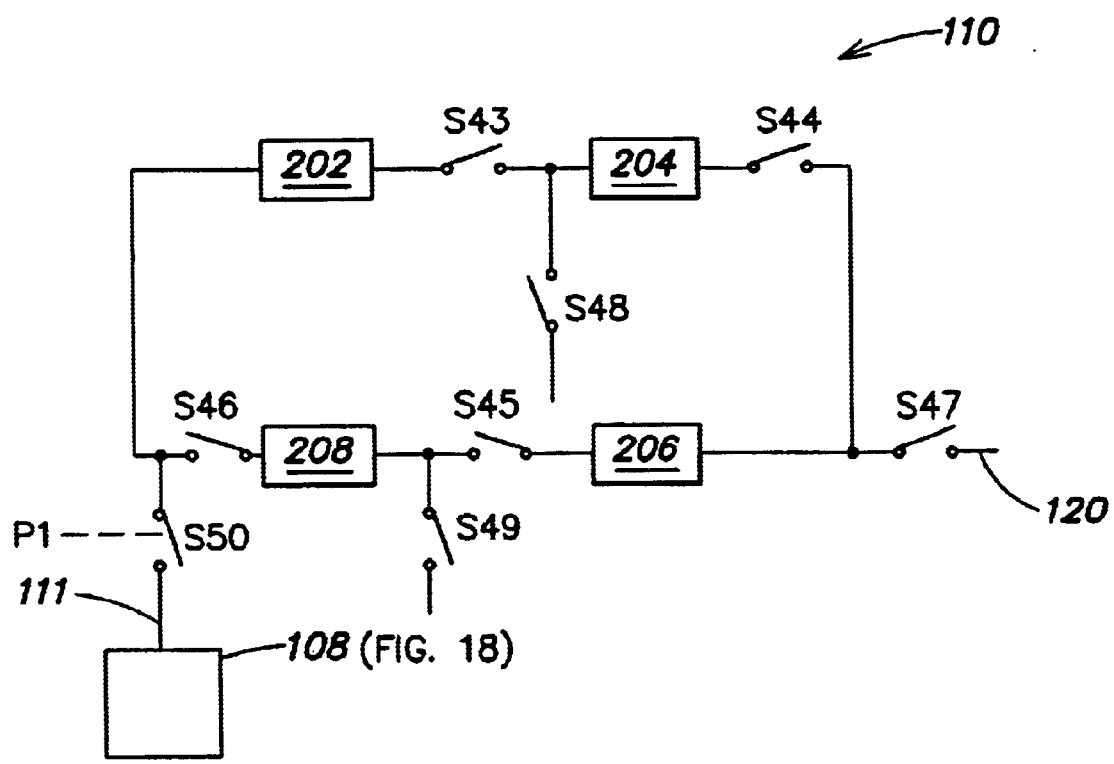
FIG. 20 is a block diagram of one embodiment of the DAC portion of FIG. 3.

FIG. 20 is a block diagram of another of the DAC portion 110 of the DAC stage 86 shown in FIG. 3. In this embodiment, an output terminal 111 of the SC DAC 108 for processing the MSB of the binary-weighted multi-bit digital input signal is coupled to one of the charge sharing switches of the segmented SC DAC 114 (FIG. 3).

Figure 21:
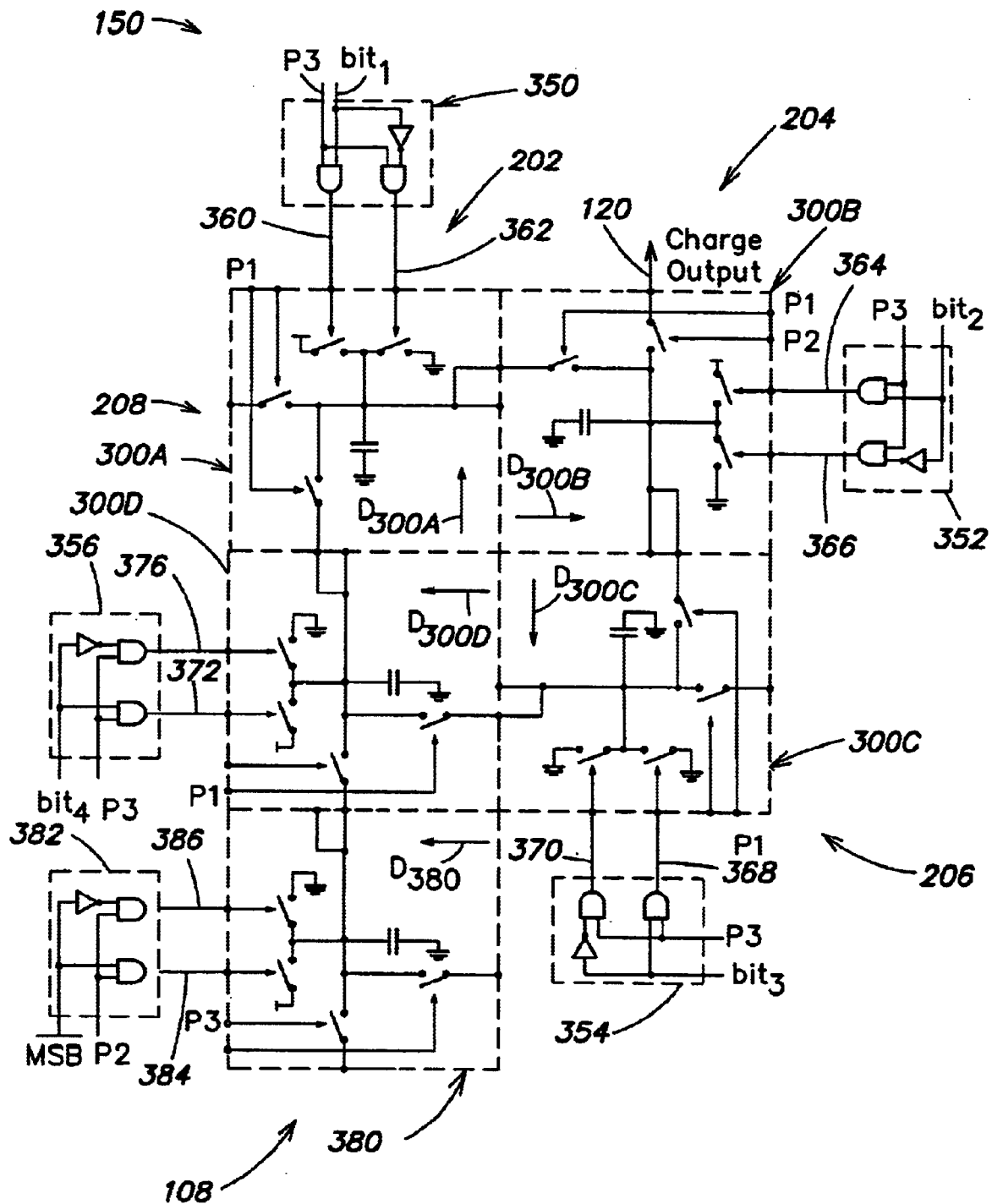
FIG. 21 is a schematic diagram representative of one embodiment of the DAC portion shown in FIG. 20.

FIG. 21 is a schematic representation of one embodiment of the DAC portion 110 shown in FIG. 20. In this embodiment, the DAC portion 110 includes an SC DAC 150 such as that described above with respect to FIG. 17. The DAC portion 110 further includes an SC DAC 108 (only MSB portion shown), such as that described above with respect to FIG. 18. A one-bit DAC for processing the MSB includes a SC cell 380 and a switch control portion 382. The digital signal MSB and the phase P2 signal are supplied to the switch control portion 382, which generates switch control signals on lines 384, 386, that are supplied to the SC cell 380. An output terminal of the SC cell 380 is coupled to one of the SC cells 300A, 300B, 300C, 300D, e.g., SC cell 300D.

In this embodiment, the SC DAC 108 and the SC DAC 150 each receive a non-overlapping three phase clock. On phase P2, the one-bit DAC of the MSB of the SC DAC 108 undergoes pre-charge in accordance with the logic state of the MSB signal into the SC DAC 108. On phase P3, a charge sharing switch of the SC DAC 108 is in the closed condition, whereby the one-bit DAC of the MSB portion of the SC DAC 108 shares charge with the preceding one-bit DAC of the SC DAC 108. Also on phase P3, the SC DAC 150 undergoes pre-charge in accordance with the multi-bit digital signal, $bit_1$, $bit_2$, $bit_3$, $bit_4$. On phase P1, the charge sharing switches of the SC DAC 150 are in the closed condition, whereby charge is redistributed among the one-bit DACs in the SC DAC 150 and the one-bit DAC of the MSB of the SC DAC 108. On phase P2, switch S48 is in the closed condition, and one of the one-bit DACs of the SC DAC 150 delivers charge, i.e., a data sample, to the output terminal 120 of the DAC portion 110 of the DAC stage 86 (FIG. 3).

Figure 22:
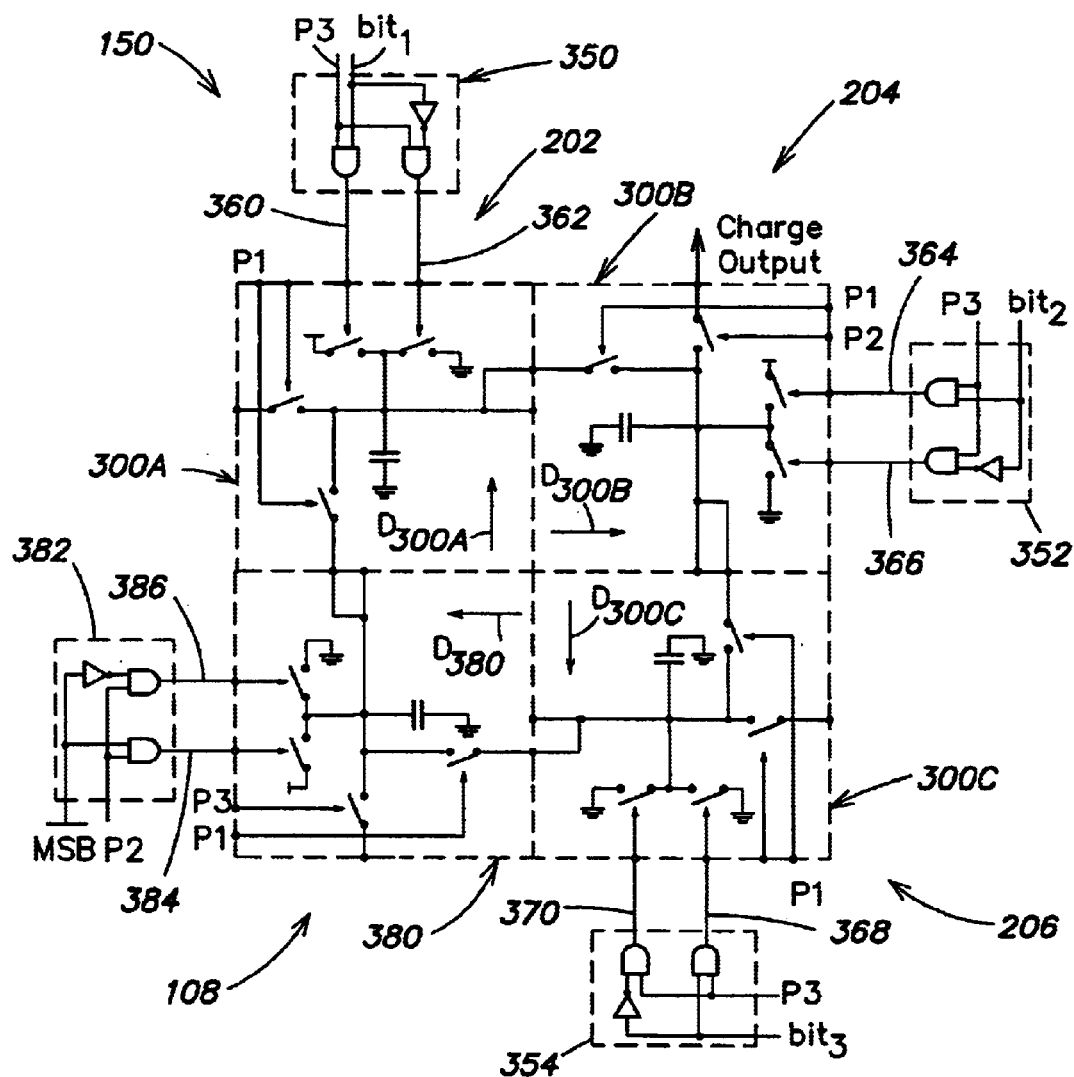
FIG. 22 is a schematic diagram representative of another embodiment of the DAC portion shown in FIG. 20.

FIG. 22 is a schematic representation of another embodiment of the DAC portion 110 shown in FIG. 20. In this embodiment, the SC DAC 150 includes 3 one-bit DACS, 202, 204, 206. In this embodiment, unlike the embodiment of FIG. 21, the ,MSB portion of the SC DAC 108 is positioned in the "ring arrangement" of the SC DAC 150. Thus, besides the SC cell 380 used for the MSB portion of the SC DAC 108 (FIG. 3) there are three other SC cells in the ring arrangement. Operation of the DAC portion 110 shown in FIG. 22 is similar to that described above with respect to the DAC portion 110 of FIG. 21.

Figure 23:
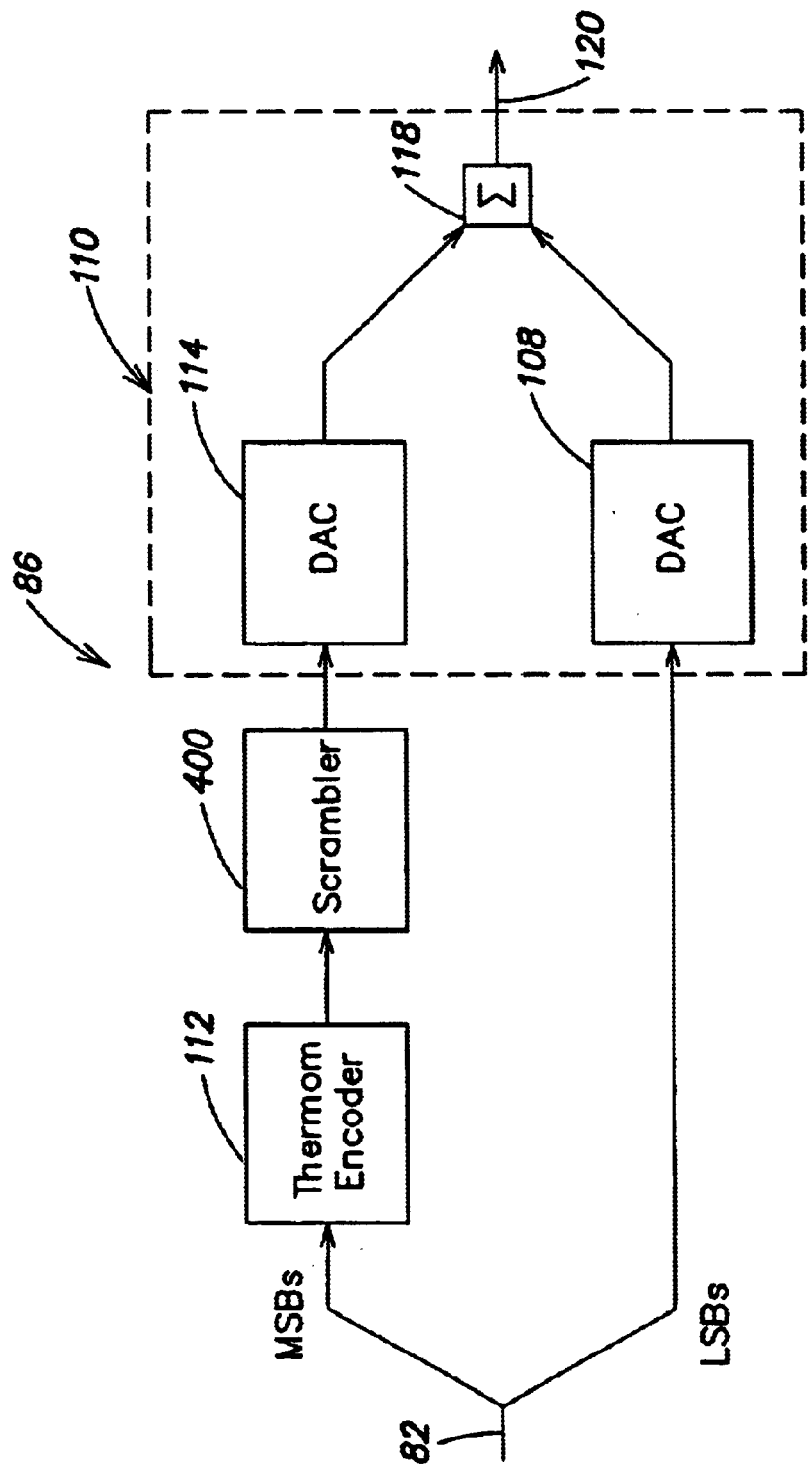
FIG. 23 is a block diagram of another embodiment of the DAC stage of FIG. 2 that includes a scrambler.

FIG. 23 is a block diagram of another embodiment of the DAC stage 86, which receives a binary-weighted multi-bit digital signal on signal lines 82. The binary-weighted multi-bit digital signal is divided into a binary-weighted LSB portion and a binary-weighted MSB portion. The LSB's are supplied to a switched capacitor (SC) DAC 108 that forms an analog signal corresponding to the value represented by the LSB's. The MSB's are supplied to a thermometer encoder 112 that converts the MSB's into an equally-weighted multi-bit digital signal. The equally-weighted multi-bit digital signal is input to a scrambler 400, and help reduce the effects of the noise and/or distortion produced by the digital to analog converter. The scrambler 400 outputs equally-weighted scrambled bits which are supplied to a switched capacitor (SC) DAC 114. The SC DAC 114 forms an analog signal corresponding to the value represented by the equally-weighted, scrambled, multi-bit digital signal. The analog signal from the SC DAC 108 and the analog signal from the segmented SC DAC 114 are summed at 118 to form an analog signal, output on signal line 120.

Figure 24:
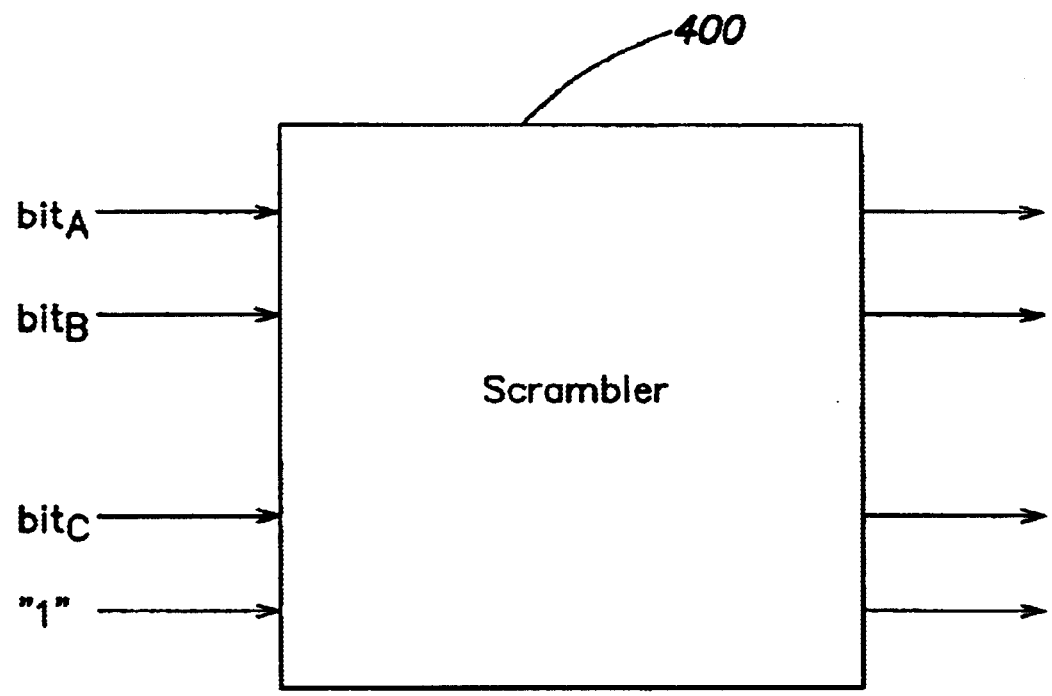
FIG. 24 is a block diagram of one embodiment of a four bit scrambler.

FIG. 24 is a block diagram of one embodiment of a four bit scrambler 400 that receives a three-bit digital input signal, $bit_A$, $bit_B$, $bit_C$, represented by the labeled arrows on the left, and outputs scrambled bits, represented by the arrows on the right. A scrambler is typically most effective when all of the scrambler inputs receive data. The extra input(s) of the scrambler may for example be "hardwired" to a logic state, i.e., a 1 or a 0. In this event that an input(s) of a scrambler is hardwired, it may be desirable to hardwire a corresponding number of DAC input(s), to a logic state opposite to that used for the extra input(s) of the scrambler.

The scrambler may be any type of scrambler. For example, various scramblers and scrambler configurations are disclosed in U.S. Pat. Nos. 5,977,899 and 5,404,142, and in Kwan, Tom, et al., "A Stereo Multibit Sigma-Delta DAC with Asynchronous Master-Clock Interface", IEEE Journal of Solid-State Circuits, Vol. 31, No. 12, Dec. 1996, pp. 1881–1887. In addition, the scrambler may use any of various schemes, e.g., data directed, random swapping.

Figure 25:
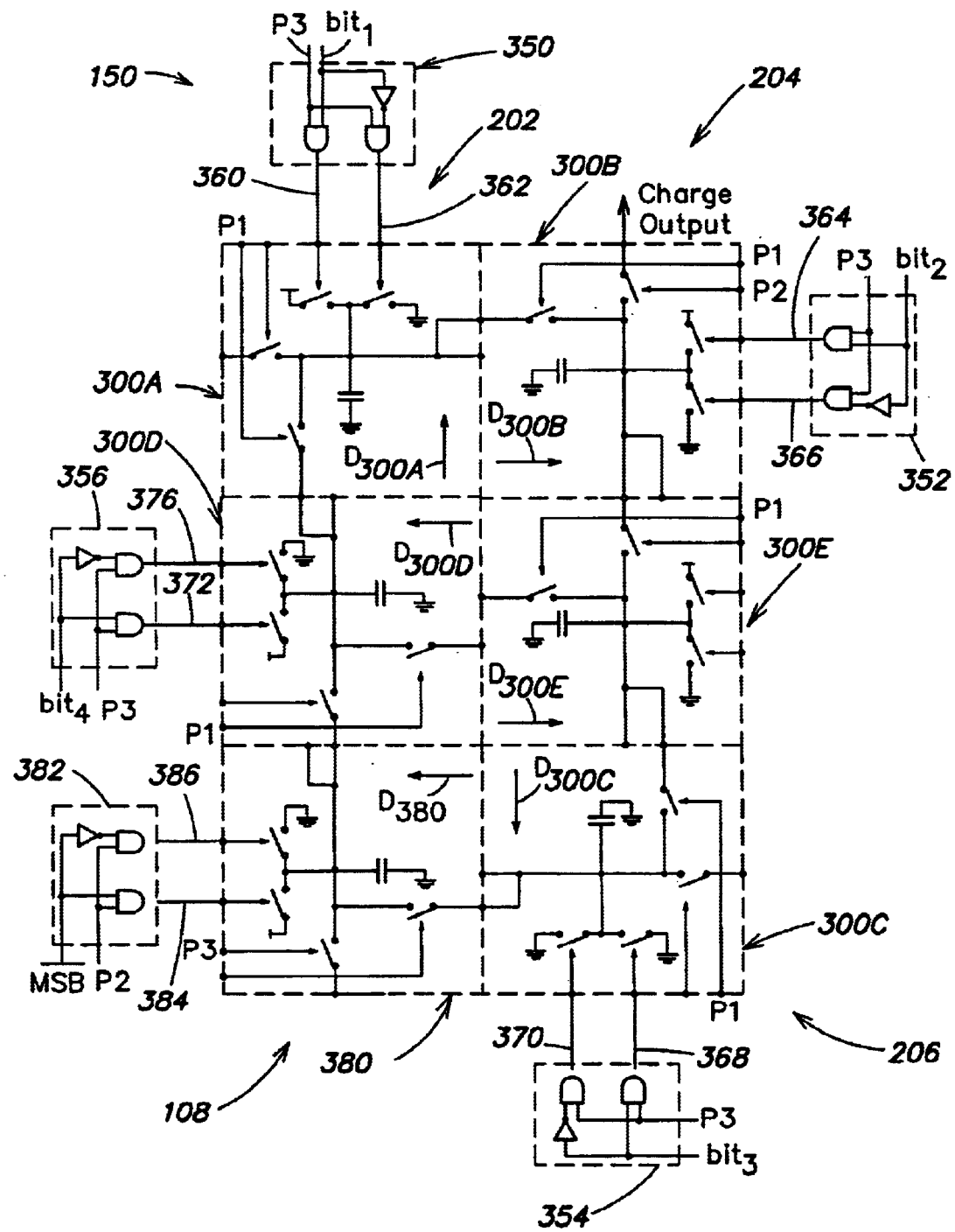
FIG. 25 is a schematic diagram representation of one embodiment of the DAC portion shown in FIG. 20.

FIG. 25 is a schematic representation of one embodiment of the DAC portion 110 of the DAC stage 86 shown in FIG. 20. In this embodiment, unlike the embodiment of FIG. 22, the MSB portion of the SC DAC 108 is one of six SC cells in a "ring arrangement". Thus, besides the SC cell 380 used for the MSB portion of the SC DAC 108 (FIG. 3) there are five other SC cells in the ring arrangement, namely, SC cells 300A–300E. In this embodiment, the five SC cells 300A–300E form a segmented SC DAC 114 (FIG. 3). SC cell 380 and SC cell 300D are similarly oriented to each other, i.e., D380 and D300$_D$ are directed in similar direction to each other. Likewise, SC cell 300B and SC cell 300E are similarly oriented to each other.

The bits bit$_1$, bit$_2$, bit$_3$, bit$_4$, of the multi-bit digital signal are supplied to the SC cells 300A, 300B, 300C, 300D, respectively. The SC cell 300E may be supplied with a signal having a "hardwired" logic state. In some embodiments, supplying such an input signal has an effect on the "gain" of the SC DAC 114 (FIG. 3). Some embodiments may provide compensation for any "gain" effect. Compensation may for example be provided in the digital signal processor stage 109 (FIG. 3), the signal conditioning stage 89 (FIG. 3), or in the DAC portion 110 (FIG. 3), or any combination thereof. In addition, the input signal may be of a type that does not result in a "gain" effect". If an input signal is supplied to the SC cell 300E, the signal is not limited to one hardwired to a logic state but rather may be any type of signal, and may be time varying or non-time varying.

Figure 26:
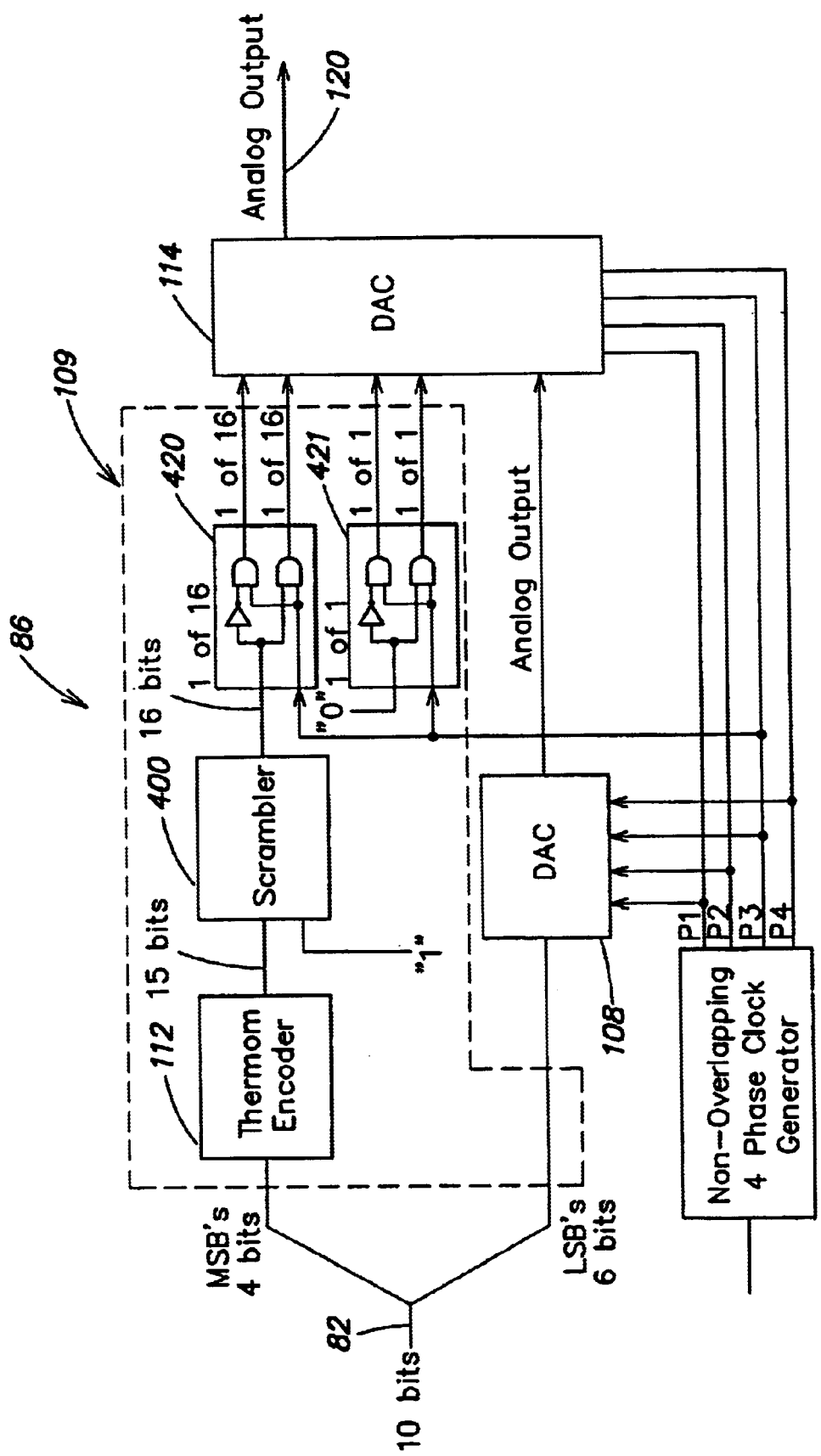
FIG. 26 is a schematic block diagram of another embodiment of the DAC stage of FIG. 2.

FIG. 26 is a schematic block diagram of another embodiment of the DAC stage 86 (FIG. 3). An MSB portion of an equally-weighted multi-bit digital signal is input to the scrambler 400, which outputs equally-weighted scrambled bits to a gating stage 420. The gating stage 420 (sixteen gating stages) further receives one of the clock phase signals, e.g., P3, and outputs gated, equally-weighted scrambled bits to a switched capacitor (SC) DAC 114. The SC DAC 114 forms an analog signal corresponding to the value represented by the equally-weighted, scrambled, multi-bit digital signal. The analog signal from the SC DAC 108 is supplied to the segmented SC DAC 114, which form an analog signal, on signal line 120, corresponding to the value represented by the multi-bit digital signal input to the DAC stage 86. Scrambler 400 further receives an input signal for example having a logic state of 1. An additional gating stage 421 receives an input signal for example having a logic state of 0. Thus there are seventeen gating stages in total.

In one embodiment, the DAC stage 86 (FIG. 3) operates at a cycle rate lower than that of the SC filter stage 90, for example, the DAC stage 86 (FIG. 3) may operate at a cycle rate of 6.5 MHz and the SC filter may operate at a cycle rate of 13 MHz.

Digital-to-analog conversion often results in noise, e.g., quantization noise, and/or distortion, caused for example, by non-linearities, e.g., integral and/or differential, within the digital-to-analog converter, which in turn is caused by, among other things, mismatching of analog components within the digital-to-analog converter. As stated above, signals from the digital to analog converter may be supplied to a signal conditioning stage that may comprise an analog filter, for example, a switched capacitor (SC) filter stage. The signal conditioning stage may help attenuate noise and/or distortion components of the analog signals, for example, by removing out of band noise. However, a reduction in any particular noise and/or distortion need not be sought nor obtained in every embodiment, and is not a requirement of the signal conditioning stage or the switched capacitor techniques disclosed herein.

Figure 27:
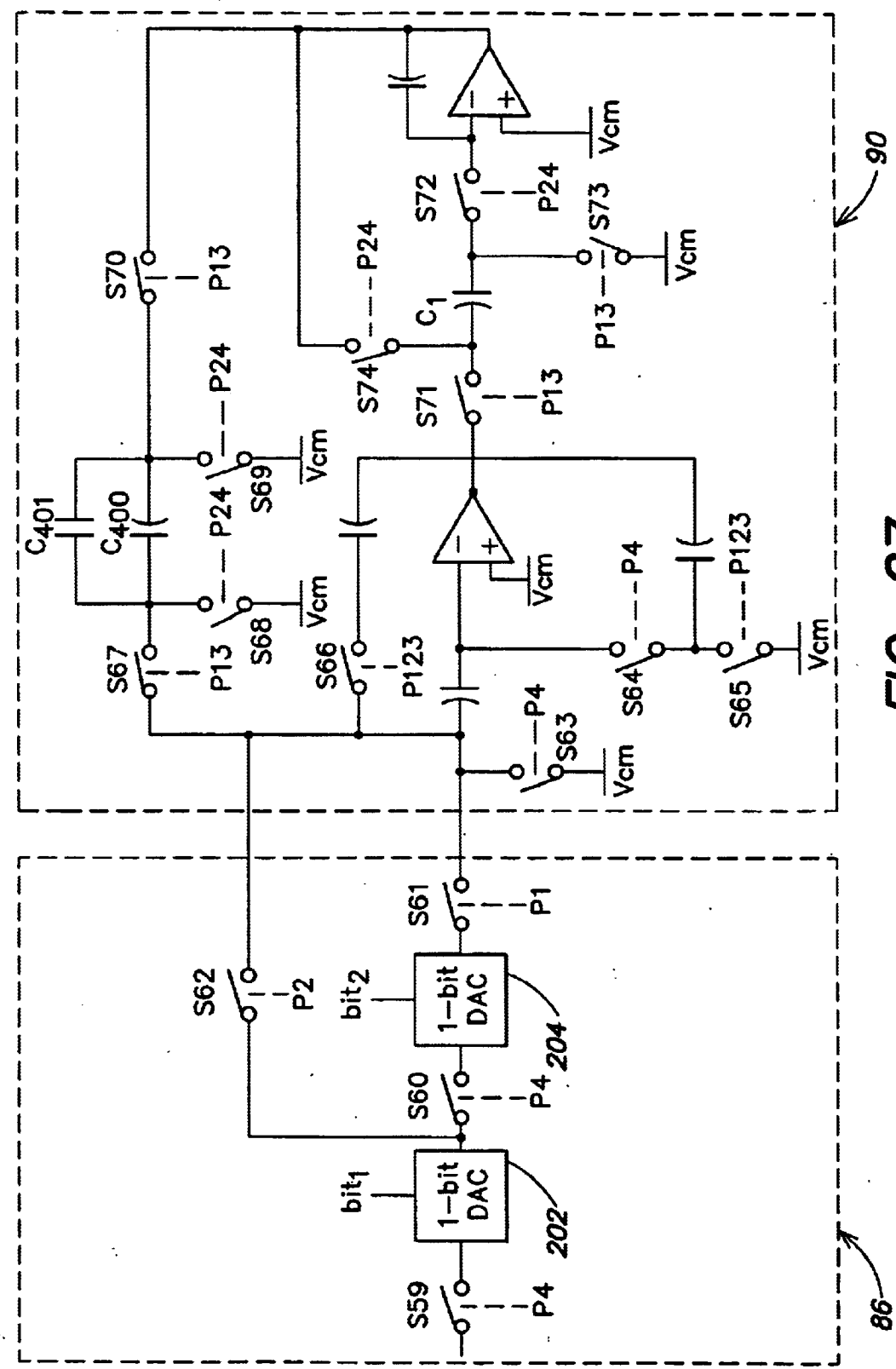
FIG. 27 is a schematic diagram of one embodiment of a portion of the DAC stage of FIG. 2 in combination with one embodiment of the switched capacitor filter stage of FIG. 2.

FIG. 27 is a schematic diagram of one embodiment of a portion of the DAC stage 86 in combination with one embodiment of the SC filter stage 90. In this embodiment, the DAC stage 86 and the SC filter stage 90 each receive a non overlapping four phase clock However, the cycle rate of the DAC stage, is less, e.g., about 50% less than the cycle rate of the SC filter stage 90. In this embodiment, the output of the SC DAC is in the form of charge packets, which are provided to the switched-capacitor filter as described below. Data may be pipelined through the digital-to-analog converter and into the switched capacitor filter, wherein the output data rate of the digital-to-analog converter is matched to the input data rate requirements of the switched capacitor filter.

The output of the input op amp is valid on phase P3 and on phase P1. On phase P3, the one-bit DAC 202 and one-bit DAC 204 pre-charge in response to the logic state of bit$_1$ and bit$_2$, respectively, as described above with respect to FIG. 13. DAC stage switches S59, S60, S61, and S62 are in the open condition. Also on phase P3, SC filter stage switches S63, S64, S68, S69, S72, and S74 are in the open condition. Switches S65, S66, S67, S70, S71, and S73 are in the open condition. On phase P4, the charge sharing switches, e.g. S59 and S60 of the SC DAC stage are in the closed condition, whereby charge is redistributed among the one-bit DACs. Also on phase P4, SC filter switches S63, S64, S68, S69, S72, and S74 are in the closed condition. Switches S65, S66, S67, S70, S71, and S73 are in the open condition, whereby the input op amp of the SC filter stage 90 undergoes offset and gain compensation. Gain compensation is most effective when the sample rate is much higher than the bandwidth of the analog signals from the DAC stage. On phase P1, switch S61 closes and one of the one-bit DACs of the SC DAC delivers charge, i.e. a data sample, to input of the SC filter stage, which in this embodiment appears as a offset and gain compensated virtual ground. Switches S59 and S60 are in the open condition. Also on P1, the SC filter stage 90 switches S67 and S70 are in the closed condition, through which the output of the SC filter stage 90 is connected back to the input of the SC filter stage 90. Switches S65, S71, and S73 are in the closed condition as well. Switches S63, S64, S68, S69, S72, and S74 are in the open condition. On phase P2, SC filter switches S62 and S63 are in the open condition thereby opening the connection between the output and the input of the SC filter stage 90. Switch S62 is in the closed condition whereby the one-bit DAC 202 delivers charge, i.e. a data sample, to input of the SC filter stage. Switches S61, S60, and S59 are in the open condition. Also on phase P2, switch S65, S66, S68, S69, S72, and S74 are in the closed condition. Switches S63, S64, S67, S70, S71, S73 are in the open condition On phase P3, switches S59, S60, S61, and S62 are in the open condition and the SC DAC undergoes another precharge in accordance with the multi-bit input signal.

Thus, the DAC stage delivers more than one analog signal (e.g., two analog signals in this embodiment), during each cycle of the DAC (e.g., each cycle of the four phase clock), whereby the output sample rate of the DAC matches the input sample rate of the SC filter stage. The analog signals may but need not be identical to one another. In some embodiments, the two analog signals from the DAC are not identical but the downstream stages provide appropriate compensation so that the two analog signals contribute equally to the output of the Digital to Analog Conversion System. Any type of SC DAC may be used so long as the DAC generates suitable "copies" of the analog signal. In some embodiments, a SC DAC of the type shown in FIGS.

18 and 19A–19C may be used because it can inherently provide multiple copies of the output signal.

The signal conditioner stage need not be a switched capacitor filter. Thus, although described above as including a SC filter stage, some embodiments may not include a an SC filter stage. Furthermore, in embodiments having a SC filter stage, offset and gain compensation is not required.

There are many ways to physically arrange the stages in each of the figures. For example, in one embodiment, one gate stage is integrated into each of the SC cells in order to reduce the number of data lines that are routed to the DAC stage. In another embodiment, the gate stages are integrated near the scrambler cell in order to reduce the size of the SC cells.

In some embodiments, the value of the capacitance used in the SC DAC may be selected in accordance with kT/C noise requirements, although this is not required.

In some embodiments, the value of the capacitance used in the SC DAC may be selected so as to be large enough to meet bit weight matching requirements. However, these are just two example criteria. The criteria for selecting the value(s) of the capacitance used in the SC DAC are not limited to those of noise requirements and/or bit weight matching requirements.

Although described with respect to a system for use in a GSM system that runs at 13 MHz, the systems described above are not limited to such.

Various switched capacitor filters and associated configurations are disclosed in Temes, Gabor C., et al. "Novel Pipeline Data Converters", ISCAS, 1988, pp. 1943–1946 and Yoshizawa, Hirokazu, et al., "Novel Design Techniques for High-Linearity MOSFET-Only Switched-Capacitor Circuits", Symposium on VLSI Circuits Digest of Technical Papers, 1996, pp. 152–153.

In some embodiments, the DAC stage simultaneously delivers multiple "copies" at the same time, which in effect increases the gain of the DAC.

Referring again to FIG. 27, in some embodiments the SC filter stage 90 has a switched capacitor, e.g., C400. The switched capacitor C400 may be but is not limited to a switched capacitor that does not have effects from associated parasitic capacitances. In other words, the parasitic capacitances may or may not be charged and/or discharged and do not pass parasitic signals from the charging and discharging events into the signal path. In this embodiment, the SC filter stage includes a switched capacitor C401 in parallel with the switched capacitor C400. Switched capacitor C400 may or may not share switches with the switched capacitor C401. The switched capacitor C401 may exhibit parasitic capacitance characteristics. The switched capacitor C401 may be for example, but is not limited to a switched capacitor formed of two diodes that are connected anode to anode or are connected cathode to cathode, where the junction between the two diodes is biased such that the diodes do not become forward biased during operation. In some embodiments, the DAC stage has parasitic sensitive switched capacitor elements and consequently the capacitor C401 in the switched capacitor filter may improve gain matching and/or gain drift between the DAC stage and the SC filter stage.

Figure 28A:
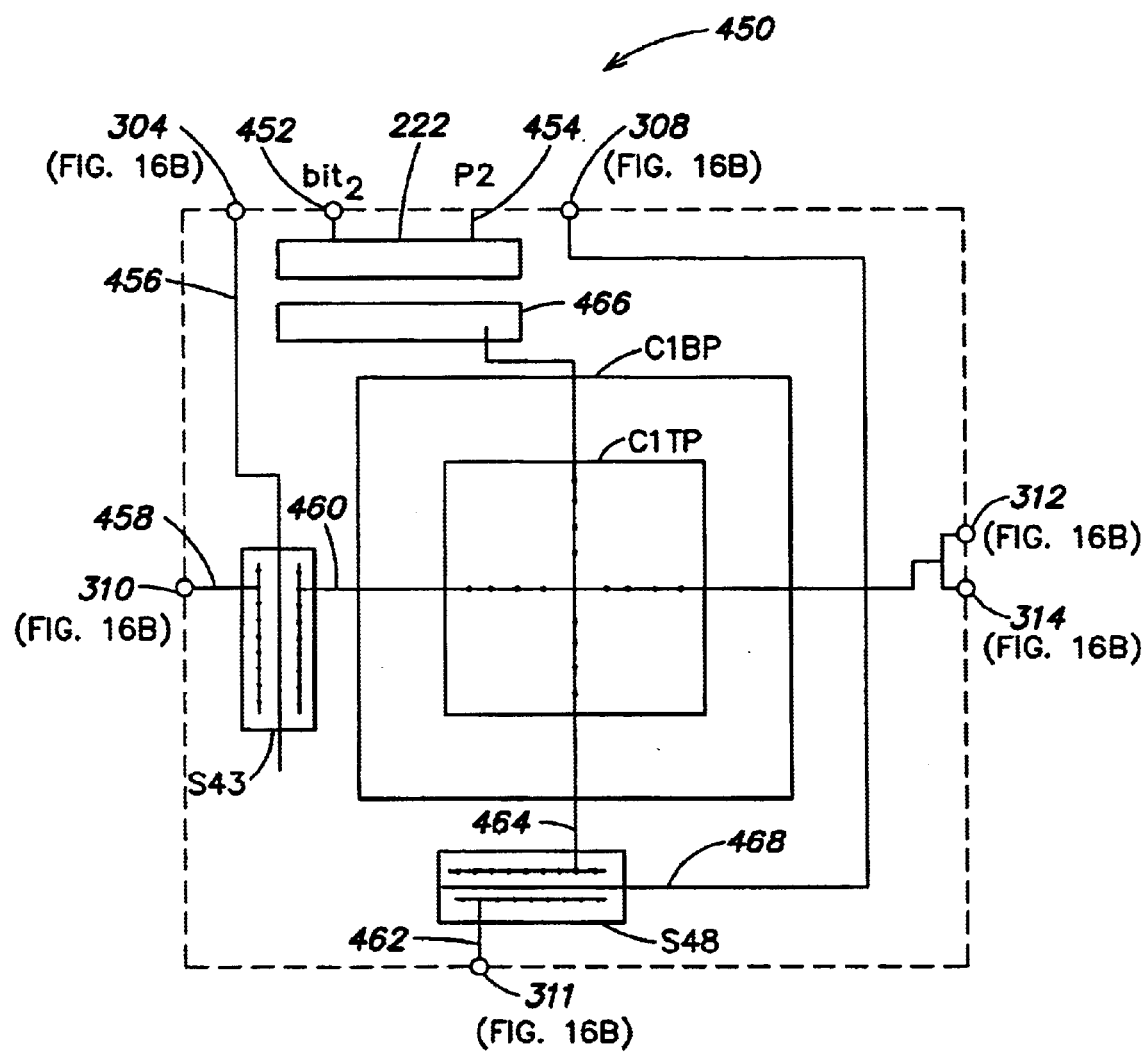
FIG. 28A is an illustration of a top view of one embodiment of a switched capacitor cell.

FIG. 28A is an illustration of a top view of one embodiment of a SC cell 450 implementing the one-bit DAC of FIG. 16A. The perimeter of the SC cell 450 is shown as a dotted line. The SC cell 450 includes a capacitor top plate C1TP and a capacitor bottom plate C1BP. A conductor 452 is provided to supply the digital signal $bit_2$ to a region of a control portion 222. A conductor 454 is provided to supply the phase signal P2 to a region representing a control portion 222. A conductor 456 runs from the perimeter of the SC cell 450 to a gate of a switch S43. A conductor 458 runs from the perimeter of the SC cell 450 to one of a source or a drain of the switch S43. A conductor 460 runs from the perimeter of the SC cell 450 to the top plate of the capacitor C1TP and to the other of the source or drain of the switch S43. A conductor 462 runs from the perimeter to one of a source or a drain of a switch S48. A conductor 464 runs from the other of the source or drain of the switch S48 to the top plate of the capacitor C1TP and to a region 466 representing a region of a switch S4, a switch S5, voltage reference V3, and voltage reference V4. A conductor 468 runs from a gate of the switch S48 to the perimeter of the SC cell 450.

Figure 28B:
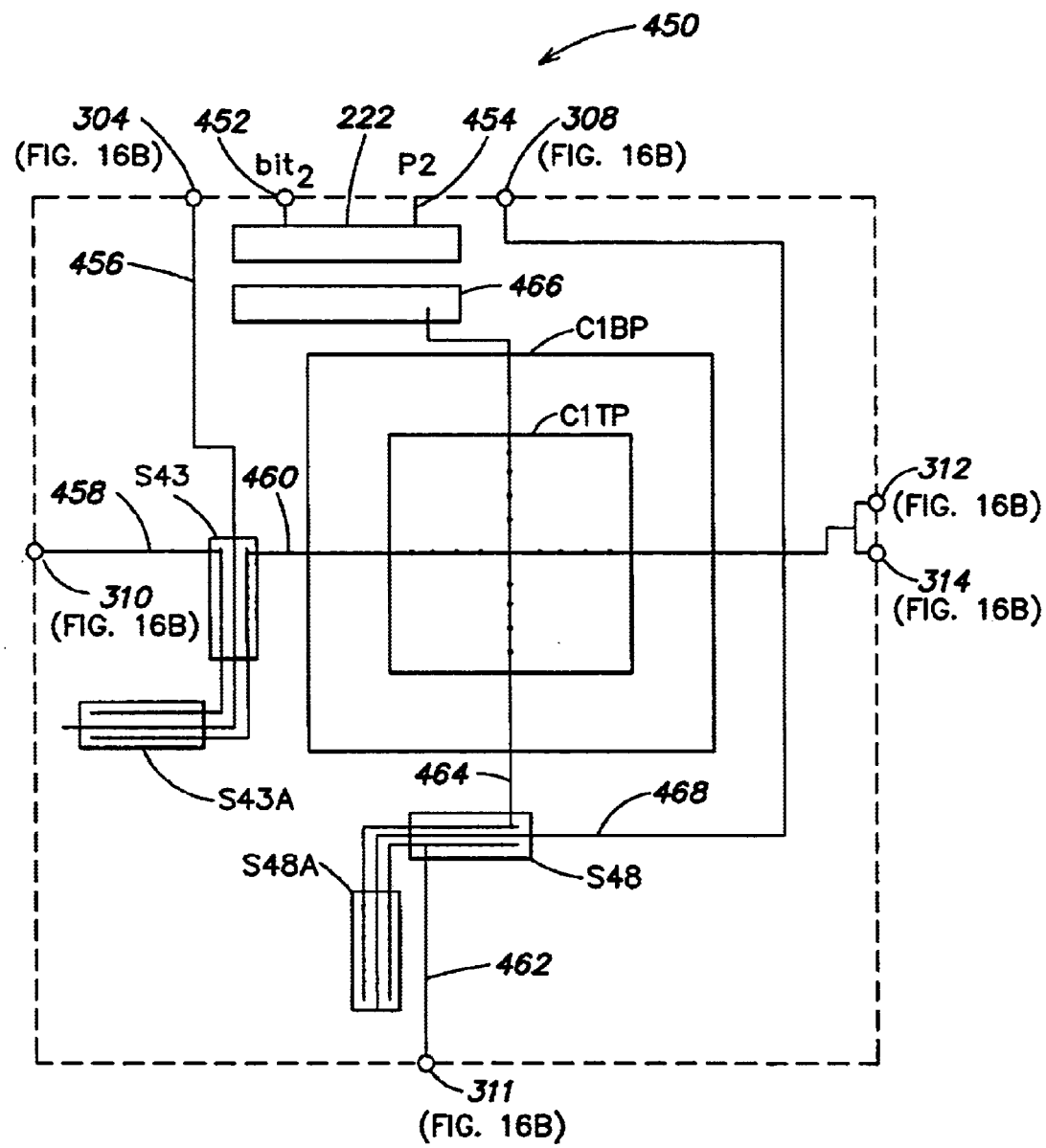
FIG. 28B is an illustration of a top view of another embodiment of a switched capacitor cell.

FIG. 28B is an illustration of a top view of another embodiment of a SC cell 450 implementing the one-bit DAC of FIG. 16A. This embodiment is substantially the same as the embodiment of FIG. 28A but further includes a switch S43A that is electrically in parallel with S43 and physically oriented substantially perpendicular to S43; and further includes a switch S48A that is electrically in parallel with S48 and physically oriented perpendicular to S48. For example, the switches S43, S43A may have a longitudinal axis, and the switches may be oriented such that the longitudinal axis of one switch is physically perpendicular to the longitudinal axis of the other switch. In one embodiment, the switches S43 and S43A are formed of two switches of approximately equal size.

Figure 29:
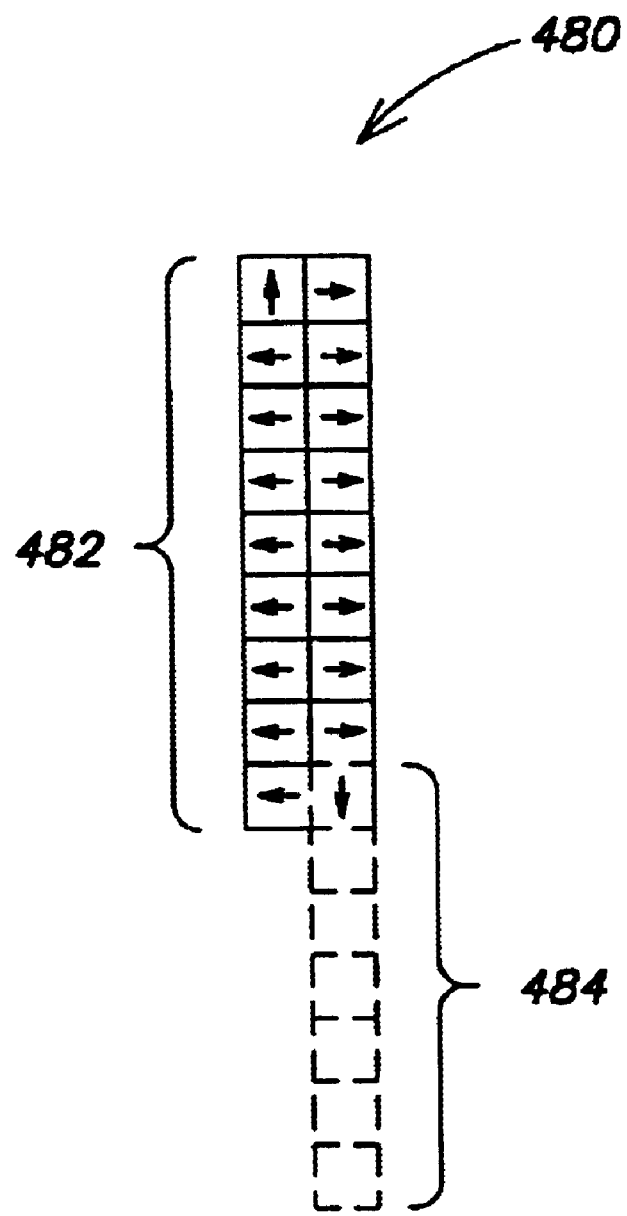
FIG. 29 is a representation of a top view of one embodiment of a die layout of a DAC portion having a plurality of SC cells.

FIG. 29 is a representation of a top view of one embodiment of a die layout 480 of a DAC portion 110 having eighteen SC cells arranged in a ring 482. Seventeen of the SC cells (shown in solid lines) in the ring form a segmented DAC adapted to receive a multi-bit digital input signal having up to seventeen bits. One of the SC cells (shown in dotted line) in the ring forms the MSB portion of a SC DAC (shown in dotted line) 484 formed of seven SC cells and adapted to receive a multi-bit digital input signal of up to seven bits. An arrow on each of the SC cells in the ring indicates the relative direction of orientation of the SC cell.

In one embodiment, the DAC stage is fabricated in a 0.25 micron ($\mu$) double-poly quad metal process in a GSM baseband/voiceband integrated circuit.

However, as stated above, the switches and the capacitors are not limited to the particular embodiments shown.

As stated above, switched capacitor techniques are used in many systems. Thus, the switched capacitor devices and techniques described above are not limited to mobile communication systems or even digital to analog converters.

Figure 30:
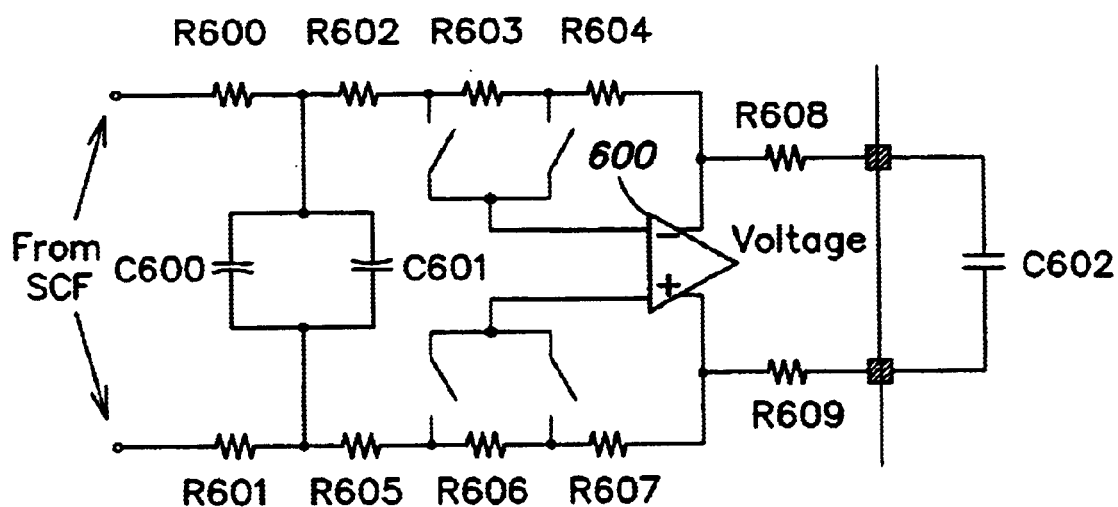
FIG. 30 is a schematic diagram of one embodiment of the continuous time filter stage of FIG. 2.

FIG. 30 is a schematic diagram of one embodiment of the CT filter stage 92 of FIG. 2, which includes a two resistors R600, R601 that each receive an analog signal from the SC filter stage, and form an RC filter with C600 and C601, to passively filter the images left by the switched capacitor filter. The images appear at multiples of the SC filter sample rate. The stage may have selectable gain formed by an amplifier 600 and resistors R602–R607. The CT filter stage may further provide resistors R608, R609, which form a passive pole in combination with an off-chip capacitor C602. Although not required, the resistors in the output pole may be integrated to improve I/Q channel matching, reduce external component count and to reduce the effects of loading from the pin capacitance on the output stage amplifier.

Figure 31:
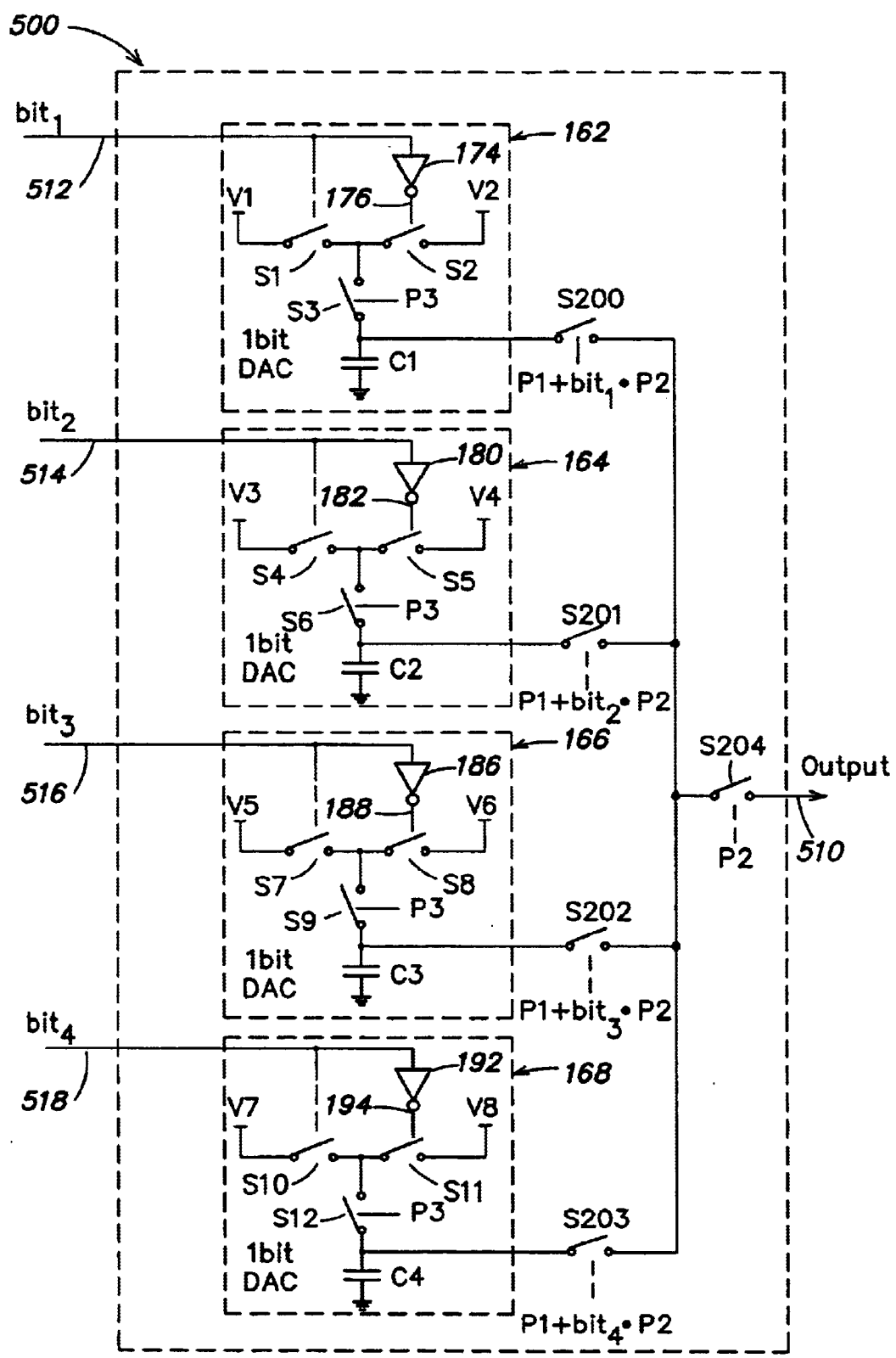
FIG. 31 is a block diagram of one embodiment of a squaring circuit.

FIG. 31 is a block diagram of one embodiment of a squaring circuit 500 that is adapted to convert a 4-bit digital input signal bit$_1$, bit$_2$, bit$_3$, bit$_4$, into an analog signal indicative of the square of the input signal. The analog signal is supplied to an output terminal 510. The squaring circuit 500 comprises four switched capacitor DACs 162, 164, 166, 168, described above with respect to FIG. 5. The digital signal bit, is presented to an input terminal 512 from where it is supplied to the one-bit DAC 162 to control the switch S1. The digital signal bit$_1$ is further supplied to an inverter 174 that generates a signal at terminal 176 used to control switch S2. The digital signal bit$_2$ is presented to an input terminal 514 from where it is supplied to the one-bit DAC 164 to control switch S4 and input to an inverter 180 that generates a signal at terminal 182 used to control switch S5. The digital signal bit$_3$ is presented to an input terminal 516 from where it is supplied to the one-bit DAC 166 to control switch S7 and input to an inverter 186 that generates a signal at terminal 188 used to control switch S8. The digital signal bit$_4$ is presented to an input terminal 518 from where it is supplied to the one-bit DAC 168 where it is used to control charging switch S10 and input to an inverter 192 that generates a signal at terminal 194 used to control switch S11. The first terminal of the capacitor C1 is supplied to a first terminal of a charge sharing switch S200. The first terminal of the capacitor C2 is supplied to a first terminal of a charge sharing switch S201. The first terminal of the capacitor C3 is supplied to a first terminal of a charge sharing switch S202. The first terminal of the capacitor C4 is supplied to a first terminal of a charge sharing switch S203. The second terminal of each of the switches S200–203 is connected to a first terminal of a switch S204. The second terminal of the switch S204 is connected to the output terminal 510.

Figure 32:
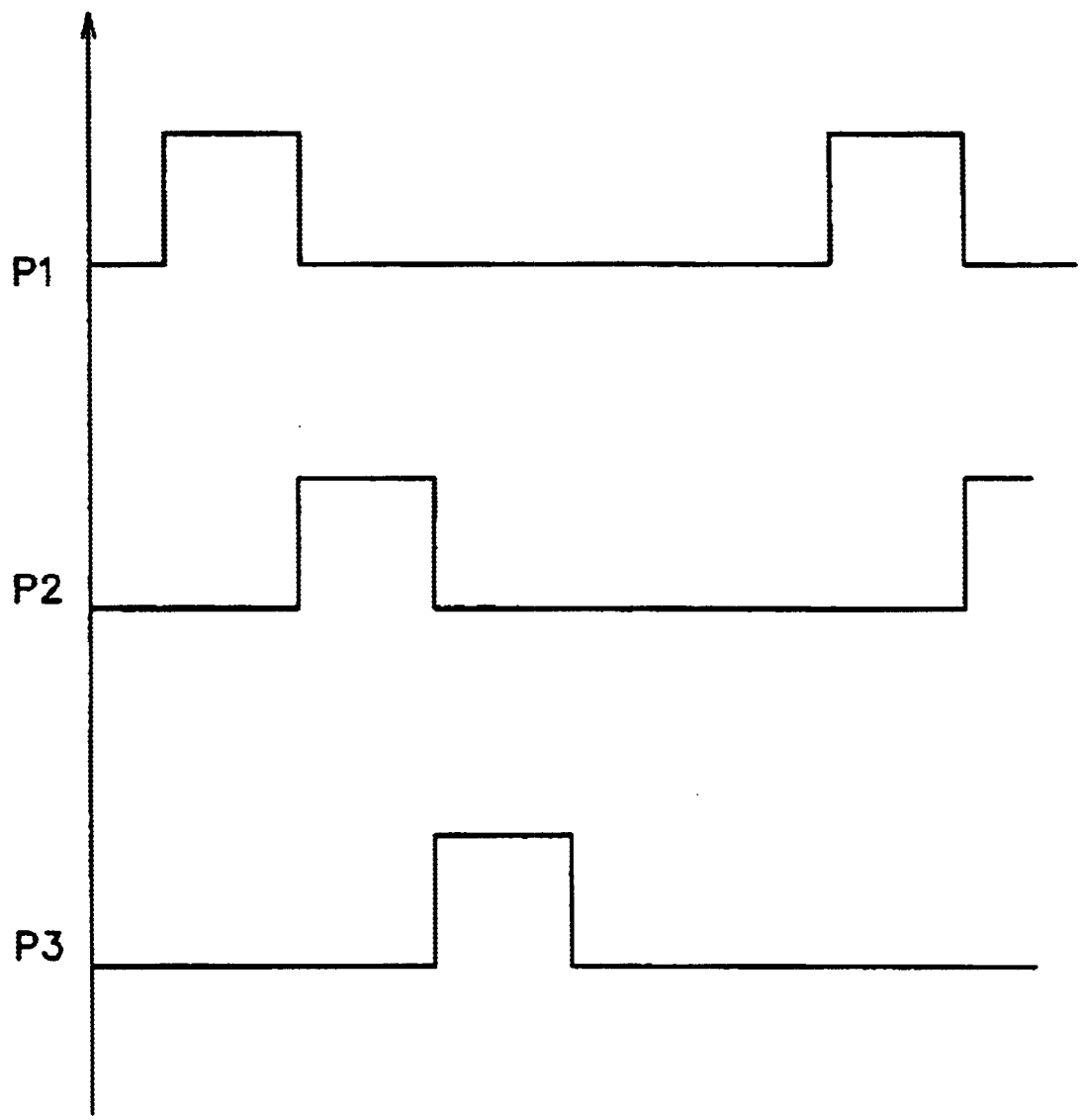
FIG. 32 shows a three phase clock.
Figure 33A:
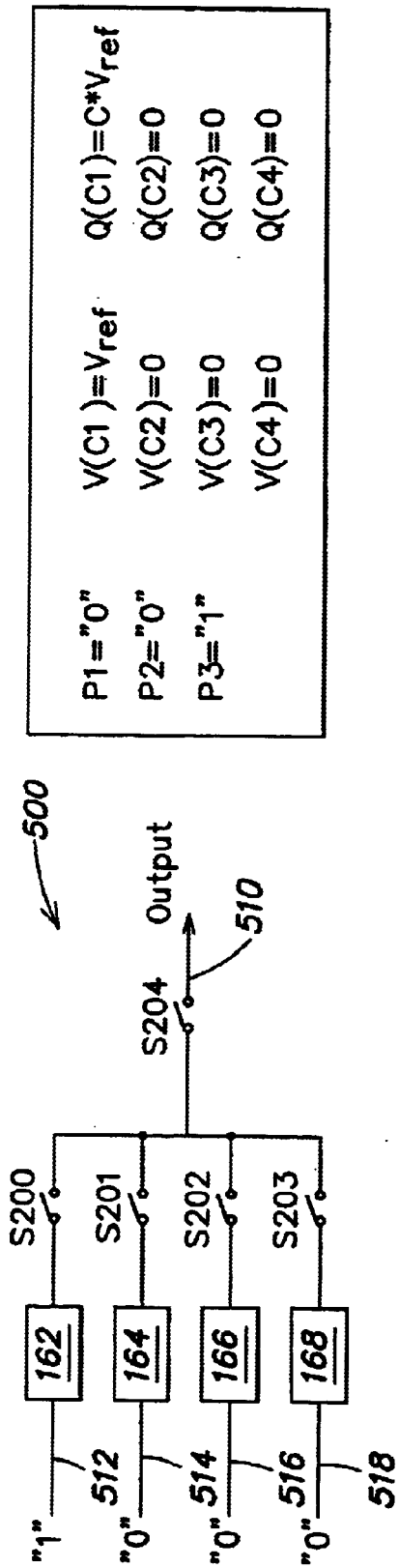
FIGS. 33A–33C are block diagrams showing operation of one embodiment of the squaring circuit of FIG. 32.
Figure 33B:
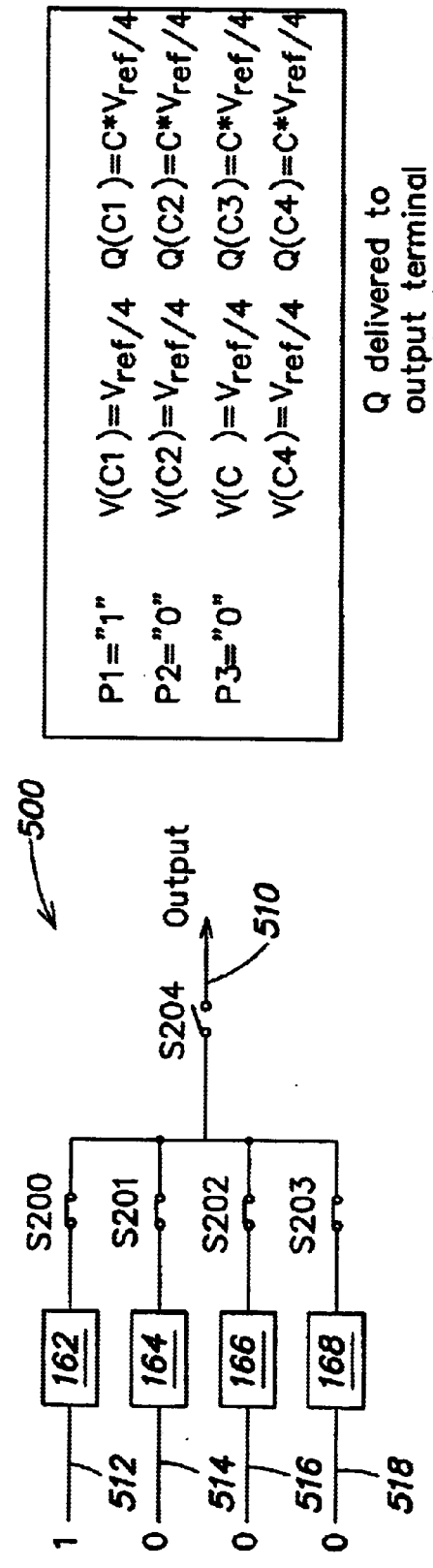
Figure 33C:
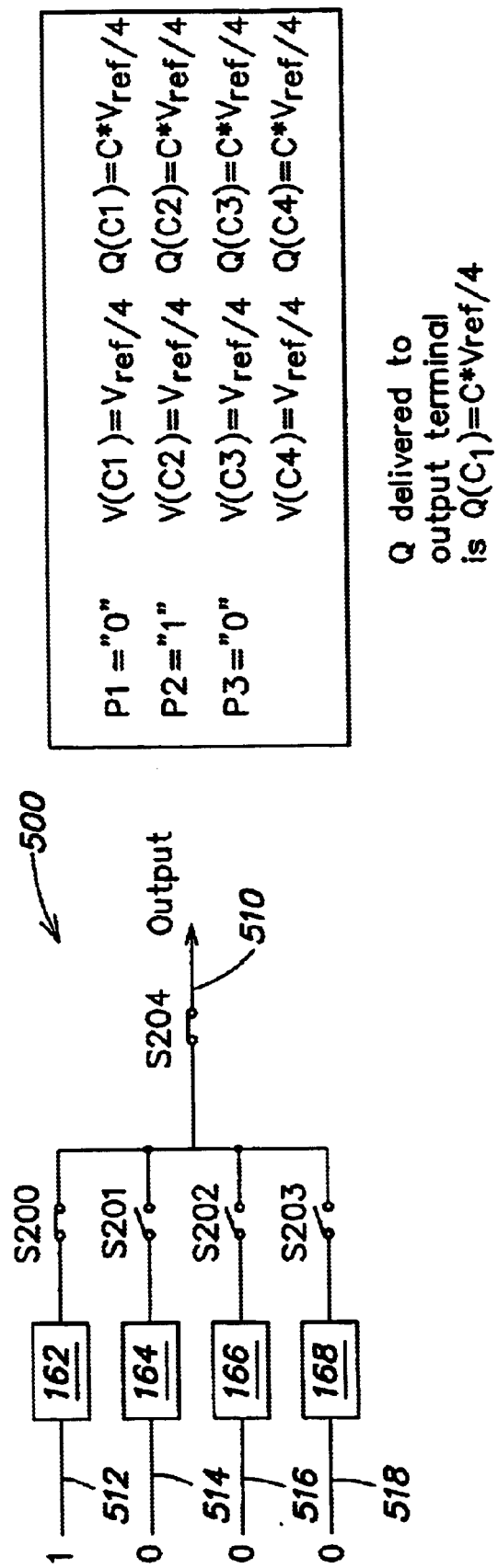

FIGS. 33A–33C are block diagrams showing the operation of the squaring circuit 500 of FIG. 31 for each of the three clock phases (see FIG. 32) in the event that input terminals 512, 514, 516, 518 are supplied with digital bit signals bit$_1$, bit$_2$, bit$_3$, bit$_4$ having logic states of 1, 0, 0, 0, respectively. Tables show the relationship between the clock phase, and the state (i.e., voltage and charge) of the capacitors in the one-bit DACs. Referring now to FIG. 33A, on phase P3 of the 3-phase clock (FIG. 32), all of the charge sharing switches S200, S201, S202, and S203 and the output switch S204, are in the open condition. The capacitor C1 is charged to V$_{ref}$ in response to the logic state 1 on terminal 512. Capacitors C2, C3 and C4 are all discharged to ground in response to the logic state 0 signals on terminals 514, 516,518, respectively. Referring now to FIG. 33B, on phase P1 of the 3-phase clock (FIG. 32) all of the charging switches S3, S6, S9 and S12 (FIG. 31) and the output switch S204 are in an open condition, and all of the charge sharing switches S200, 201, 202, 203 are in a closed condition, whereby charge is redistributed and resulting in the total charge on all of the capacitors being divided among all of the capacitors. If the capacitors C1, C2, C3, C4 all have the same capacitance value C, then the charge is shared equally so that the voltage across each capacitor becomes V$_{ref}$/4. Referring now to FIG. 33C, on P2 of the 3-phase clock (FIG. 32) switch S200 is in the closed condition because P2 has a logic 1 state and bit, has a logic state 1. Switches S201, S202, S203 are in the open condition because bit$_2$, bit$_3$, bit$_4$, have a logic state 0. Output switch S204 is in the closed condition, and capacitor C1 (FIG. 31) of one-bit DAC 162 delivers its charge to the output terminal 510. Consequently, the total charge delivered to the output terminal 510 is equal to C*Vref/4.

Figure 34A:
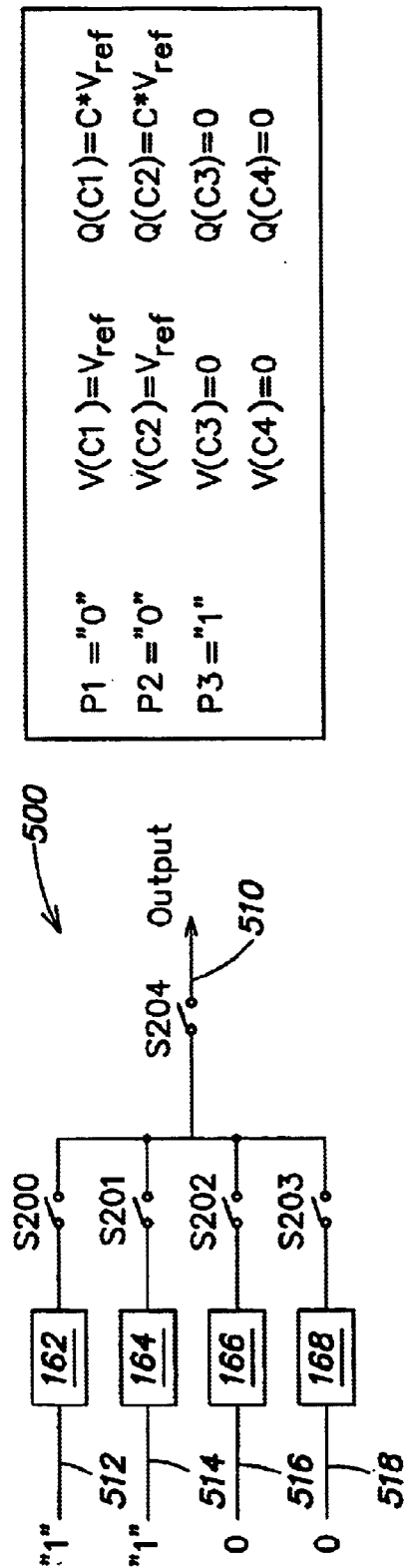
FIGS. 34A–34C are block diagrams showing operation of one embodiment of the squaring circuit of FIG. 32.
Figure 34B:
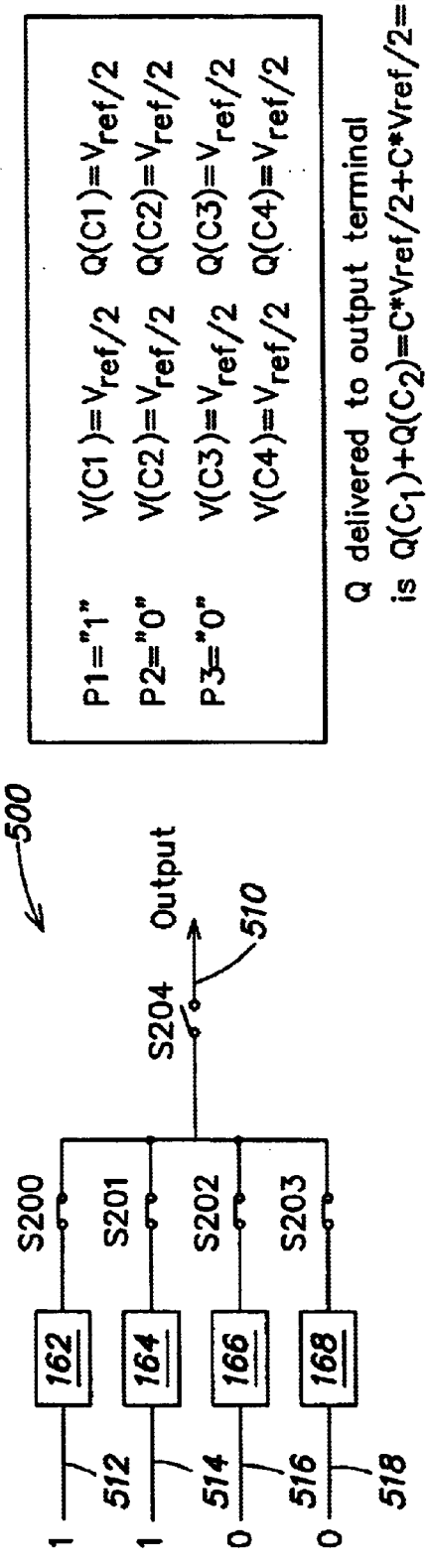
Figure 34C:
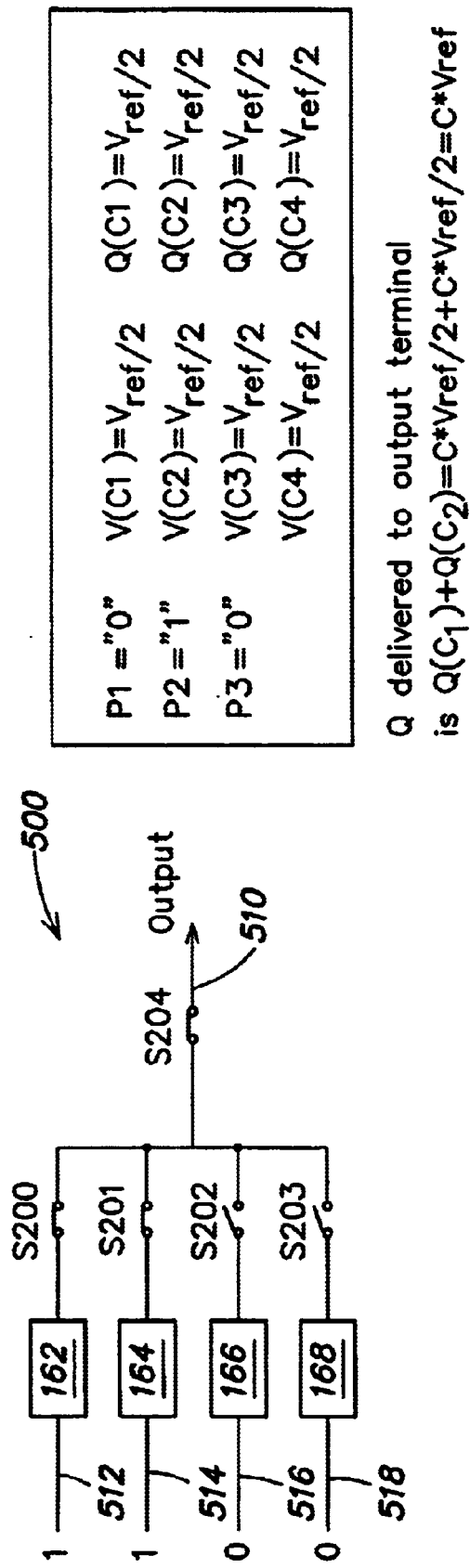

FIGS. 34A–34C are block diagrams showing the operation of the squaring circuit 500 of FIG. 31 for each of the 3 clock phases in the event that input terminals 512, 514, 516, 518 are supplied with digital bit signals bit$_1$, bit$_2$, bit$_3$, bit$_4$, having logic states of 1, 1, 0, 0, respectively. Tables show the relationship between the clock phase, and the state (i.e., voltage and charge) of the capacitors in the one-bit DACs. Referring now to FIG. 33A, on phase P3 of the 3-phase clock, all of the charge sharing switches S200, S201, S202, and S203 and the output switch S204, are in the open condition. The capacitor C1 and the capacitor C2 are each charged to V$_{ref}$ in response to the logic state 1 on terminal 512 and 514, respectively. Capacitors C3 and C4 are all discharged to ground in response to the logic 0 signals on terminals 516, 518, respectively. Referring now to FIG. 34B, on phase P1, all of the charging switches S3, S6, S9 and S12 (FIG. 31) and the output switch S204 are in an open condition, and all of the charge sharing switches S200, 201, 202, 203 are in a closed condition, whereby charge is redistributed and resulting in the total charge on all of the capacitors being divided among all of the capacitors. If the capacitors C1, C2, C3, C4 all have the same capacitance value C, then the charge is shared equally so that the voltage across each capacitor becomes V$_{ref}$/2. Referring now to FIG. 33C, on P2 of the 3-phase clock, switch S200 is in the closed condition because P2 has a logic state 1 and bit$_1$ has a logic state 1. Switch S201 is in the closed condition because P2 has a logic state 1 and bit$_2$ has a logic state 1. Switches S202, S203 are in the open condition because bit$_3$, bit$_4$, have a logic state 0. Output switch S204 is in the closed condition, and capacitors C1 and C2 (FIG. 31) of one-bit DACs 162, 164 delivers charge to the output terminal 510. Consequently, the total charge delivered to the output terminal 510 is equal to C*Vref.

Thus, for this embodiment, the charge may be determined as follows:

$$\text{Charge} = (C^* ref^* (\text{value of digital input})^2)/4 \quad \text{(Equation 1)}$$

In other embodiments, the multi-bit digital input signal to the SC squaring circuit need not be equally-weighted bits, but rather may have binary-weighting or any other weighting.

Figure 35:
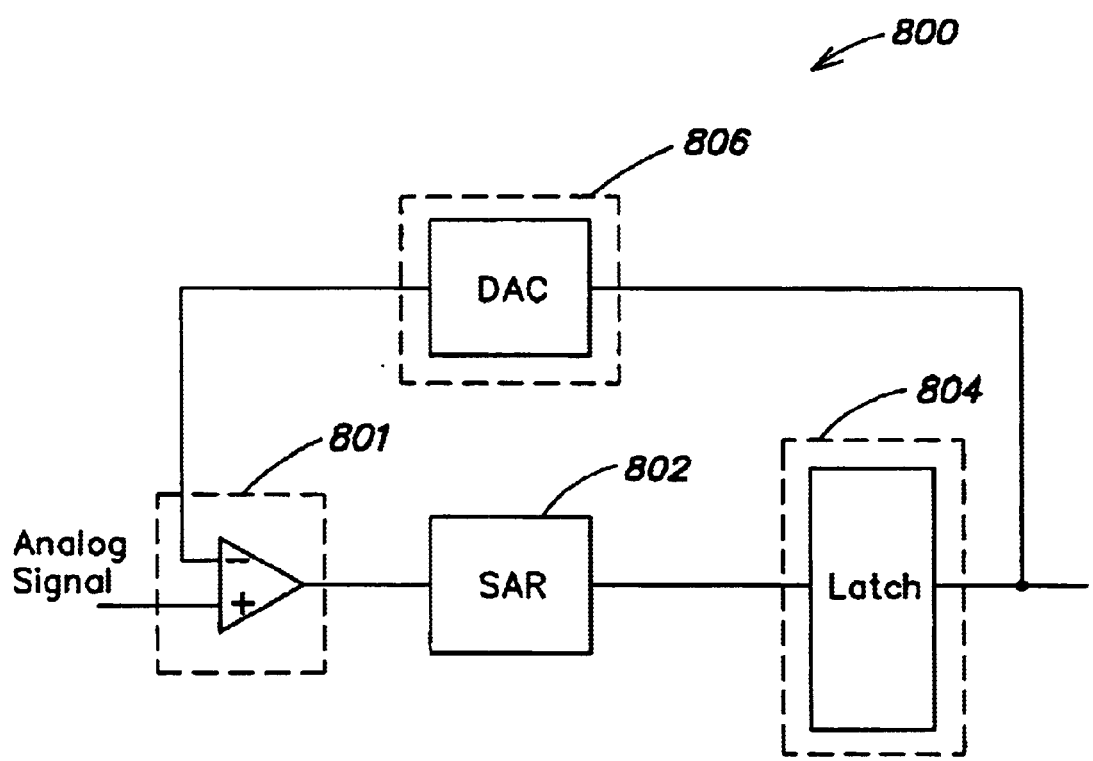
FIG. 35 is a block diagram of one embodiment of an analog to digital converter.

FIG. 35 shows one embodiment of an analog to digital converter 800. The analog to digital converter 800 is a successive approximation type having an analog comparison stage 801 that receives an analog signal. The analog comparison stage 801 generates an output signal that is supplied to a successive approximation register (SAR), which generates an output signal that is supplied to a latch stage 804. A digital output signal from the latch stage 804 is fed back to an input of the analog comparison stage through a feedback element 806. The feedback element 806 may be a digital to analog converter that employs one or more of the methods or devices described hereinabove. In some embodiments, the feedback element may comprise a squaring circuit such as for example, the squaring circuit described hereinabove with respect to FIGS. 31–34. In such embodiments, the feedback DAC has the characteristic that the analog output is proportional to the square of the digital input. This produces a square root transfer function for the overall analog to digital converter, wherein the digital output is proportional to the square root of the analog input. In contrast, the AD574 analog to digital converter, manufactured by Analog Devices, Inc. produces a linear transfer function, wherein the digital output is directly proportionate to the analog input of the analog to digital converter.

Referring again to FIG. 31, in another embodiment, a digital to analog converter may receive a first multi-bit digital signal and a second multi-bit digital signal, and generate an analog signal indicative of a product of the first multi-bit digital signal and the second multi-bit digital signal. Such embodiment is similar to the squaring circuit of FIG. 31 except that the switches S200, S201, S202, and S203 are controlled by the second multi-bit digital signal. For example, the switch S200 may be controlled according to an equation: P1+(($bit_1$ of second multi-bit digital signal) *P2). The switch S201 may be controlled according to an equation: P1+(($bit_2$ of second multi-bit digital signal)*P2). The switch S202 may be controlled according to an equation: P1+(($bit_3$ of second multi-bit digital signal)*P2). The switch S203 may be controlled according to an equation: P1+($bit_4$ of second multi-bit digital signal)*P2). In another embodiment, such a digital to analog converter may be employed in the feedback loop of a analog to digital converter, as in FIG. 35.

In another embodiment, the digital signal processing stage includes a sigma delta modulator.

Although shown in an embodiment adapted to receive an acoustical signal 56, in other embodiments, the handset 50 is not limited to such. The input signal may be one or more signal of any type including but not limited to electromagnetic, electrical, microwave, acoustical, ultrasound, and optical signal, may have any form, and may be from any source. The invention may be used in any type of system which may but need not include a digital to analog conversion stage.

The multi-bit digital signal may be parallel data, e.g., provided by way of plurality of signal lines, serial data, e.g., provided by way of a single signal line, or any combination thereof, e.g., some parallel data and some serial data.

Although the SC cell is shown in embodiments for use in forming a SC DAC, the SC cell is not limited to such, but rather may be used in any application.

The switched capacitor devices and techniques described above are not limited to embodiments in which the elements are substantially identical.

As stated above, the switches and the capacitors may be of any type and are not limited to the particular embodiments disclosed above.

While there have been shown and described various embodiments, it will be understood by those skilled in the art that various changes and modifications may be made.

What is claimed is:

1. A DAC comprising:
a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, the DAC having a charge sharing operating state in which at least two of the plurality of sub DACs share charge with one another, and having an operating state, initiated subsequent to the charge sharing operating state, in which the switched capacitor network outputs at least one analog signal indicative of a sum of values of each bit in the multi-bit signal.

2. The DAC of claim 1, wherein the multi-bit digital signal is an equally-weighted multi-bit digital signal, and the associated amount of charge is the same for each of the plurality of sub DACs.

3. The DAC of claim 1, wherein the multi-bit digital signal is an equally-weighted multi-bit digital signal, and the associated capacitance is the same for each of the plurality of sub DACs.

4. The DAC of claim 1, wherein each of the plurality of sub DACs shares charge with one another, and the switched capacitor network outputs an analog signal indicative of a sum of values of each bit in the multi-bit signal.

5. The DAC of claim 1, wherein the DAC comprises a plurality of switched capacitor cells used in forming the switched capacitor network, each of at least two of the plurality of switched capacitor cells has a orientation direction, and the at least two of the plurality of switched capacitor cells are oriented such that the orientation direction of at least one of the at least two of the plurality of switched capacitor cells is angularly offset relative to the orientation direction of at least one other of the at least two of the plurality of switched capacitor cells, the angular offset being substantially, ninety degrees.

6. The DAC of claim 1, wherein the DAC comprises a plurality of switched capacitor cells used in forming the switched capacitor network, each of at least four of the plurality of switched capacitor cells has a orientation direction, and the orientation direction of each one of the at least four of the plurality of switched capacitor cells is angularly offset relative to the orientation directions of the others of the at least four of the plurality of switched capacitor cells.

7. The system of claim 1 wherein the first analog signal and the second analog signal are substantially equal to each other.

8. The system of claim 1 wherein the first analog signal and the second analog signal are not substantially equal to each other.

9. The system of claim 1 wherein each of the at least two analog signals is indicative of a sum of values of all of the bits in the multi-bit digital signal.

10. The system of claim 1, wherein the at least two analog signals are not all substantially equal to each other.

11. The system of claim 1 wherein the signal conditioning stage generates a signal that is responsive to each of the at least two of the at least two analog signals.

12. The DAC of claim 1 wherein each of the plurality of sub DACs shares charge with at least one other of the plurality of sub DACs to generate at least one analog signal indicative of a sum of values of each bit in the multi-bit signal.

13. The DAC of claim 1 wherein the switched capacitor network generates the at least one analog signal in response to the charge received by the capacitance of each of the plurality of sub DACs in response to the associated bit.

14. The DAC of claim 1 wherein the DAC has more than one charge sharing operating state in which at least two of the plurality of sub DACs share charge with one another.

15. The DAC of claim 1 wherein the DAC has more than one operating state, subsequent to the charge sharing operating state, in which the switched capacitor network outputs at least one analog signal indicative of a sum of values of each bit in the multi-bit signal.

16. The DAC of claim 1, wherein for each of the plurality of sub DACs, the associated capacitance comprises a single capacitor.

17. The system of claim 16 wherein the signal conditioning stage comprises a switched capacitor filter stage.

18. The system of claim 16 wherein the signal conditioning stage generates a signal responsive in the sequence of analog signals.

19. The system of claim 16 wherein the DAC receives one digital input signal per operating cycle and the analog signals are output at a non periodic rate over the operating cycle.

20. A DAC comprising:
a switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally-weighted values of each bit in the multi-bit signal.

21. The DAC of claim 20, wherein the DAC comprises a plurality of switched capacitor cells used in forming the switched capacitor network, each of at least two of the plurality of switched capacitor cells has a orientation direction, and the at least two of the plurality of switched capacitor cells are oriented such that the orientation direction of at least one of the at least two of the plurality of switched capacitor cells is angularly offset relative to the orientation direction of at least one other of the at least two of the plurality of switched capacitor cells.

22. The DAC of claim 20, wherein the DAC comprises a plurality of switched capacitor cells used in forming the switched capacitor network, each of the at least four of the plurality of switched capacitor cells has an orientation direction, and the orientation direction of each one of the at least four of the plurality of switched capacitor cells is angularly offset relative to the orientation directions of the others of the at least four of the plurality of switched capacitor cells.

23. The DAC of claim 20 wherein each of the plurality of sub DACs shares charge with at least one other of the plurality of sub DACs to generate at least one analog signal indication of a sum of values of each bit in the multi-bit signal.

24. The DAC of claim 20 wherein the switched capacitor network generates the at least one analog signal in response to the charge received by the capacitance of each of the plurality of sub DACs in response to the associated bit.

25. The DAC of claim 21 wherein the angular offset is substantially ninety degrees.

26. A DAC comprising:
a switched capacitor network that receives an equally-weighted multi-bit digital signal and outputs one or more analog signals, where at least one of the one or more analog signals comprises a single packet of charge indicative of a sum of equally-weighted values of each bit in the multi-bit signal.

27. The DAC of claim 20, wherein for each of the plurality of sub DACs, the associated capacitance comprises a single capacitor.

28. The method of claim 27 wherein the at least two analog signals are substantially equal to one another.

29. A method of converting a multi-bit digital signal to an analog signal indicative of a sum of value of each bit in the multi-bit digital signal comprising:
charging each of a plurality of capacitors to a valve corresponding to a value of a bit in the multi-bit signal, wherein the charge on each capacitor corresponds to a weight of the value of a corresponding bit;
temporarily connecting at least two of the plurality of capacitors to one another to share charge; and
providing at least one analog output signal indicative of a sum of values of each bit in the multi-bit signal, after disconnecting the at least two of the plurality of capacitors from one another.

30. The system of claim 29 wherein the at least two analog signals are substantially equal to one another.

31. The method of claim 29, wherein the method further comprises connecting all of the capacitors together so each has substantially the same value.

32. The system of claim 29 wherein the means for generating comprises a switched capacitor DAC.

33. The method of claim 29 further comprising generating at least one analog signal indicative of a sum of the values of the bits in the multi-bit digital signal in response to the cahrge stored on each of the plurality of capacitors by the step of charging.

34. The method of claim 29 wherein connecting comprises connecting each of the plurality of sub DACs with at least one other of the plurality of sub DACs to share charge and generate at least one analog signal indicative of a sum of the values of the bits in the multi-bit digital signal.

35. A method of converting a equally-weighted multi-bit digital signal to an analog signal indicative of a sum of value of each bit in the multi-bit digital signal comprising:
charging each of a plurality of capacitors in a value corresponding to a value of a bit in the equally-weighted multi-bit signal, and
generating a single packet of charge on at least one capacitor indicative of a sum of equally-weighted values of each bit in the multi-bit signal.

36. A method of converting an equally weighted multi-bit digital signal to an analog signal indicative of a sum of value of each bit in the multi-bit digital signal comprising:
charging each of a plurality of capacitors to a value corresponding to a value of a bit in the equally-weighted multi-bit signal, and
connecting at least two of the plurality of capacitors to one another to share charge.

37. The method of claim 36 further comprising generating at least one analog signal indicative of a sum of the values of the bits in the multi-bit digital signal in response to the cahrge stored on each of the plurality of capacitors by the step of charging.

38. The method of claim 36 wherein connecting comprises connecting each of the plurality of sub DACs with at least one other of the plurality of sub DACs to share charge and generate at least one analog signal indicative of a sum of the values of the bits in the multi-bit digital signal.

39. A DAC comprising:
means for charging each of a plurality of capacitors to a value corresponding to a value of a bit in a multi-bit signal, wherein the charge on each capacitor corresponds to a weight of the value of a corresponding bit;
means for temporarily connecting at least two of the plurality of capacitors to one another to share charge; and
means for providing at least one analog output signal indicative of a sum of values of each bit in the multi-bit signal, after disconnecting the at least two of the plurality of capacitors from one another.

40. The DAC of claim 39 further comprising means for generating at least one analog signal indicative of a sum of the values of the bits in the multi-bit digital signal in response to the charge stored on each of the plurality of capacitors by the step of charging.

41. The DAC of claim 39 wherein means for connecting comprises means for connecting each of the plurality of sub DACs with at least one other of the plurality of sub DACs to share charge and generate at least one analog signal indicative of a sum of the values of the bits in the multi-bit digital signal.

42. A method comprising:
receiving a multi-bit digital signal;
generating at least two analog signals including a first analog signal that is indicative of a sum of values of bits in the multi-bit digital signal, and a second analog signal that is indicative of said sum of values of said bits in the multi-bit digital signal; and providing at least two of the at least two analog signals to a signal conditioning stage, the at least two of the at least two analog signals including the first analog signal and the second analog signal.

43. The method of claim 42 wherein the first analog signal and the second analog signal are each indicative of a sum of values of all of the bits in the multi-bit digital signal.

44. The method of claim 42 wherein the first analog signal and the second analog signal are not substantially equal to each other.

45. The method of claim 42 wherein the at least two analog signals are each indicative of said sum of values of said bits in the multi-bit digital signal.

46. The method of claim 42 wherein the at least two analog signals are substantially equal to each other.

47. The method of claim 42 wherein the at least two analog signals are not substantially equal to each other.

48. A DAC comprising:
means for charging each of a plurality of capacitors to a value corresponding to a value of a bit in an equally-weighted multi-bit signal, and
means for generating a single packet of charge on at least one capacitor indicative of a sum of equally-weighted values of each bit in the multi-bit signal.

49. A DAC comprising:
means for charging each of a plurality of capacitors to a value corresponding to a value of a bit in an equally-weighted multi-bit signal, and
means for connecting at least two of the plurality of capacitors to one another to share charge.

50. The DAC of claim 49 further comprising means for generating at least one analog signal indicative of a sum of the values of the bits in the multi-bit digital signal in response to the charge stored on each of the plurality of capacitors by the step of charging.

51. The DAC of claim 49 wherein means for connecting comprises means for connecting each of the plurality of sub DACs with at least one other of the plurality of sub DACs to share charge and generate at least one analog signal indicative of a sum of the values of the bits in the multi-bit digital signal.

52. An integrated circuit comprising:
an integrated switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, the integrated switched capacitor network having a charge sharing operating state in which at least two of the plurality of sub DACs share charge with one another, and
having an operating state, initiated subsequent to the charge sharing operating state, in which the switched capacitor network outputs at least one analog signal indicative of a sum of values of each bit in the multi-bit signal.

53. The DAC of claim 52 wherein each of the plurality of sub DAC shares charge with at least one other of the plurality of sub DACs to generate at least one analog signal indicative of a sum of values of each bit in the multi-bit signal.

54. The DAC of claim 52 wherein the switched capacitor network generates the at least one analog signal in response to the charge received by the capacitance of each of the plurality of sub DACs in response to the associated bit.

55. An integrated circuit comprising:
an integrated switched capacitor network that receives an equally-weighted multi-bit digital signal and outputs one or more analog signals, wherein at least one of the one or more analog signals comprises a single packet of charge indicative of a sum of equally-weighted values of each bit in the multi-bit signal.

56. An integrated circuit comprising:
an integrated switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally-weighted values of each bit in the multi-bit signal.

57. The DAC of claim 56 wherein each of the plurality of sub DACs shares charge with at least one other of the plurality of sub DACs to generate at least one analog signal indicative of a sum of values of each bit in the multi-bit signal.

58. The DAC of claim 56 wherein the switched capacitor network generates the at least one analog signal in response to the charge received by the capacitance of each of the plurality of sub DACs in response to the associated bit.

59. A DAC comprising:
a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associate bit, wherein the associated amount of charge for each of the plurality of sub DACs is in direct proportion to a weight of the bit, the DAC having an operating state in which at least two of the plurality of sub DACs share charge with one another, and having an operating state in which fewer than all of the plurality of sub DACs are connected to an output terminal and the switched capacitor network outputs at least one analog signal indicative of a sum of values of each bit in the multi-bit signal.

60. The DAC of claim 59 wherein the DAC has more than one charge sharing operating state in which at least two of the plurality of sub DACs share charge with one another.

61. The DAC of claim 59 wherein the DAC has more than one operating state in which fewer than all of the plurality of sub DACs are connected to an output terminal and the switched capacitor network outputs at least one analog signal indicative of a sum of values of each bit in the multi-bit signal.

62. The DAC of claim 59 wherein in the operating state in which fewer than all of the plurality of sub DACs are connected to an output terminal and the switched capacitor network outputs at least one analog signal indicative of a sum of values of each bit in the multi-bit signal, the sub DACs that are connected to the output terminal deliver charge to said output terminal.

63. A method of converting a multi-bit digital signal to an analog signal indicative of a sum of value of each bit in the multi-bit digital signal comprising the steps of:
charging each of a plurality of capacitors to a value corresponding to a value of a bit in the multi-bit signal, wherein the charge on each capacitor corresponds to a weight of the value of a corresponding bit;

connecting at least two of the plurality of capacitors to one another to share the charge; and connecting fewer than all of the plurality of sub DACs to an output terminal to provide at least one analog output signal indicative of a sum of values of each bit in the multi-bit signal.

64. A DAC comprising:

means for charging each of a plurality of capacitors to a value corresponding to a value of a bit in a multi-bit signal, wherein the charge on each capacitor corresponds to a weight of the value of a corresponding bit;

means for connecting at least two of the plurality of capacitors to one another to share charge; and means for connecting fewer than all of the plurality sub DACs to an output terminal to provide at least one analog output signal indicative of a sum of values of each bit in the multi-bit signal.

65. An integrated circuit comprising:

an integrated switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, the integrated switched capacitor network having an operating state in which at least two of the plurality of sub DACs share cahrge with one another, and having an operating state in which fewer than all of the plurality of sub DACs are connected to an output terminal and the switched capacitor network outputs at least one analog signal indicative of a sum of values of each bit in the multi-bit signal.

* * * * *

UNITED STATES PATENT AND TRADEMARK OFFICE
CERTIFICATE OF CORRECTION

PATENT NO.        : 6,917,321 B1  
APPLICATION NO. : 09/575562  
DATED             : July 12, 2005  
INVENTOR(S)       : Haurie et al.

Page 1 of 17

It is certified that error appears in the above-identified patent and that said Letters Patent is hereby corrected as shown below:

Please delete column 1 line 1 through column 32 line 18 and insert column 1 line 1 through column 32 line 20 as attached Signed and Sealed this Twenty-fourth Day of February, 2009

JOHN DOLL  
*Acting Director of the United States Patent and Trademark Office*

METHOD AND APPARATUS FOR USE IN SWITCHED CAPACITOR SYSTEMS

TECHNICAL FIELD

This invention relates to methods and apparatus for switched capacitor systems.

RELATED ART

Many systems employ switched capacitor techniques, for example, making use of capacitors and packets of charge to perform a function.

Digital to analog converters are one type of system that frequently use switched capacitor techniques, for example as part of a digital to analog conversion system for use in a mobile communications system. Mobile communications often include a cellular handset that uses digital baseband I/Q modulation and synthesis in a transmit path.

A digital-to-analog converter generates analog data in response to digital input data. One type of digital-to-analog converter receives binary-weighted data. Another type of digital-to-analog converter receives equally-weighted data.

Using digital-to-analog conversion to create an analog signal often results in signal noise, and/or distortion. Thus, in systems employing switched capacitor techniques, there is often a need for a solution which helps reduce noise and/or distortion. To help meet the noise and distortion requirements, a digital to analog converter is sometimes preceded by a scrambler. Output data from a digital-to-analog converter may be presented to a signal conditioner stage, e.g., an analog filter stage, to condition the noise and/or the distortion. One type of signal conditioner stage is a switched capacitor filter.

Analog to digital converters are another type of system that frequently uses switched capacitor techniques, for example as part of a digital to analog converter used as a feedback element in a successive approximation type of analog to digital converter. One example of a successive approximation analog to digital converter is an AD574 manufactured by Analog Devices, Inc.

In addition to reducing noise and/or distortion, there is often a need in switched capacitor systems to further reduce power requirements, size, and/or cost.

SUMMARY OF THE INVENTION

According to a first aspect, a DAC includes a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, at least two of the plurality of sub DACs sharing charge with one another, and the switched capacitor network outputs at least one analog signal indicative of a sum of values of each bit in the multi-bit signal.

According to a second aspect, A DAC includes a switched capacitor network that receives an equally-weighted multi-bit digital signal and outputs one or more analog signals, wherein at least one of the one or more analog signals comprises a single packet of charge indicative of a sum of equally weighted values of each bit in the multi-bit signal.

According to a third aspect a DAC includes a switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally weighted values of each bit in the multi-bit signal.

According to a fourth aspect, a method of converting a multi-bit digital signal to an analog signal indicative of a sum of value of each bit in the multi-bit digital signal includes charging each of a plurality of capacitors to a value corresponding to a value of a bit in the multi-bit signal, wherein the charge on each capacitor corresponds to a weight of the value of a corresponding bit; and connecting at least two of the plurality of capacitors to one another to share charge with one another.

According to a fifth aspect, a method of converting a equally weighted multi-bit digital signal to an analog signal indicative of a sum of value of each bit in the multi-bit digital signal includes charging each of a plurality of capacitors to a value corresponding to a value of a bit in the equally-weighed multi-bit signal, and generating a signal packet of charge on at least one capacitor indicative of a sum of equally weighted values of each bit in the multi-bit signal.

According to a sixth aspect, a method of converting an equally weighted multi-bit digital signal to an analog signal indicative of a sum of value of each bit in the multi-bit digital signal includes charging each of a plurality of capacitors to a value corresponding to a value of a bit in the equally-weighted multi-bit signal, and connecting at least two of the plurality of capacitors to one another to share charge with one another.

According to a seventh aspect, A DAC includes means for charging each of a plurality of capacitors to a value corresponding to a value of a bit in the multi-bit signal, wherein the charge on each capacitor corresponds to a weight of the value of a corresponding bit; and means for connecting at least two of the plurality of capacitors to one another to share charge with one another.

According to an eighth aspect, a DAC includes means for charging each of a plurality of capacitors to a value corresponding to a value of a bit in the equally-weighted multi-bit signal, and means for generating a single packet of charge on at least one capacitor indicative of a sum of equally weighted values of each bit in the multi-bit signal.

According to a ninth aspect, a DAC includes means for charging each of a plurality of capacitors to a value corresponding to a value of a bit in the equally-weighed multi-bit signal, and means for connecting at least two of the plurality of capacitors to one another to share charge with one another.

According to a tenth aspect, an integrated circuit includes an integrated switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, at least two of the plurality of sub DACs sharing charge with one another, and the switched capacitor network outputs at least one analog signal indicative of a sum of values of each bit in the multi-bit signal.

According to an eleventh aspect, an integrated circuit includes an integrated switched capacitor network that receives an equally-weighted multi-bit digital signal and outputs one or more analog signals, wherein at least one of the one or more analog signals comprises a single packet of charge indicative of a sum of equally weighted values of each bit in the multi-bit signal.

According to a twelfth aspect, an integrated circuit includes an integrated switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally weighted values of each bit in the multi-bit signal.

According to a thirteenth aspect, a system includes a DAC that receives a multi-bit digital signal and outputs at least two analog signals each indicative of a sum of values of bits in the multi-bit digital signal; and a signal conditioning stage that receives at least two of the at least two analog signals.

According to a fourteenth aspect, a system includes a DAC that receives digital input signals at an input data rate and outputs analog signals indicative of the digital signals to a signal conditioning stage at an output data rate different than the input data rate.

According to a fifteenth aspect, a method includes receiving a multi-bit digital signal, generating at least two analog output signals each indicative of a sum of values of bits in the multi-bit digital signal; and filtering at least two of the at least two analog output signals.

According to a sixteenth aspect, a system includes means for receiving a multi-bit digital signal, means for generating at least two analog output signals each indicative of a sum of values of bits in the multi-bit digital signal; and means for filtering at least two of the at least two analog output signals.

According to a seventeenth aspect, a system includes a DAC that receives a multi-bit digital signal and outputs at least two analog signals each indicative of a sum of values of bits in the multi-bit digital signal.

According to eighteenth aspect, a method includes receiving a multi-bit digital signal, and generating at least two analog output signals each indicative of a sum of values of bits in the multi-bit digital signal.

According to an eighteenth aspect, a system includes means for receiving a multi-bit digital signal, and means for generating at least two analog output signals each indicative of a sum of values of bits in the multi-bit digital signal.

According to a nineteenth aspect, a switched capacitor filter has a first switched capacitor comprising a switched capacitor without substantial effects from parasitic characteristics, and a second switched capacitor in parallel with the first switched capacitor, the second switched capacitor having effects from parasitic characteristics.

According to a twentieth aspect, a system includes a switched capacitor filter having a first switched capacitor comprising a switched capacitor and a second switched capacitor in parallel with the first switched capacitor, the second switched capacitor having characteristics including parasitic effects; and a DAC having a switched capacitor having characteristics including parasitic effects substantially corresponding to the parasitic effects of the second switched capacitor of the switched capacitor filter.

According to a twenty first aspect, an apparatus includes a first switched capacitor cell having a reference direction and being adapted to electrically connect to a second switched capacitor cell substantially identical to the first switched capacitor cell, the second switched capacitor cell having a reference direction and being oriented such that the reference direction of the second switched capacitor cell is directed in substantially the same direction as the reference direction of the first switched capacitor cell, and being adapted to electrically connect to a third switched capacitor cell substantially identical to the first switched capacitor cell, the thrid switched capactior cell having a reference direction and being oriented such that the reference direction of the third switched capacitor cell is directed in direction angularly offset from the direction in which the reference direction of the first switched capacitor cell is directed.

According to a twenty second aspect, a system includes a binary weighted DAC; and a segmented DAC, coupled to the binary weighted DAC, the segment DAC comprising a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, at least two of the plurality of sub DACs sharing charge with one another, and the switched capacitor network outputs at least one analog signal indicative of a sum of values of each bit in the multi-bit signal.

According to a twenty-third aspect, a system includes a scrambler that receives input and provides output; and a switched capacitor DAC that has a plurality of capacitors and redistributes charge between at least two of the plurality of capacitors, coupled to the scrambler, that receives digital output of the scrambler.

According to a twenty fourth aspect, a system includes a digital to analog converter that receives a multi-bit digital signal and produces an analog output that is proportional to the square of the multi-bit digital signal.

According to a twenty-fifth aspect of the invention, an analog-to-digital converter has an analog comparison stage coupled to a digital latch stage, the analog-to-digital converter including a feedback element through which an output of the digital latch stage is fed back to an input of the analog comparison stage, wherein the feedback element includes a digital-to-analog converter.

According to a twenty sixth aspect of the invention, a method for use in an analog to digital converter having an analog comparison stage coupled to a digital latch stage includes coupling an output of the digital latch stage back to an input of the analog comparison stage through a digital to analog converter that receives a multi-bit digital signal and produces an analog output proportional to the square of the multi-bit digital signal.

According to a twenty seventh aspect of the invention, a handset for a mobile communication system includes an input stage that receives an input signal and outputs a multi-bit digital signal to a digital-to-analog conversion system that receives the multi-bit digital signal and outputs an analog signal indicative of a sum of values of bits in the multi-bit signal, and including a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associate bit, wherein the associated amount of charge for each of the plurality of sub DACs is in direct proportion to a weight of the bit, at least two of the plurality of sub DACs sharing charge with one another, and the switched capacitor network outputs at least one analog signal indicative of a sum of values of bits in the multi-bit signal.

According to a twenty eighth aspect, a system includes a digital signal processing stage that receives input and provides output; and a switched capacitor DAC that has a plurality of capacitors and redistributes charge between at least two of the plurality of capacitors, coupled to the digital signal processing stage, that receives digital output of the digital signal processing stage.

According to a twenty ninth aspect, a digital to analog converter receives a first multi-bit digital signal and a second multi-bit digital signal, and produces an analog output that is indicative a product of the first multi-bit digital signal and the second multi-bit digital signal.

According to a thirtieth aspect, in an analog-to-digital converter having an analog comparison stage coupled to a digital latch stage, a feedback element through which an output of the digital latch stage is coupled back to an input of the analog comparison stage, wherein the feedback element includes a digital-to-analog converter that receives a first multi-bit digital signal and a second multi-bit digital signal, and produces an analog output that is indicative of a product of the first multi-bit digital signal and the second multi-bit digital signal.

BRIEF DESCRIPTION OF THE DRAWINGS

FIG. 1 is a block diagram of one embodiment of a portion of a handset for a mobile communication system that includes a digital-to-analog conversion system;

FIG. 2 is a block diagram of one embodiment of the digital-to-analog conversion system of FIG. 1 and including a DAC portion with two DAC stages;

FIG. 3 is a block diagram of one embodiment of the DAC stage of FIG. 2 that includes a switched capacitor DAC;

FIG. 4 is a block diagram of one embodiment of the switched capacitor DAC of FIG. 3;

FIG. 5 is a block diagram of one embodiment of the switched capacitor DAC of FIG. 4 that is adapted to convert a four-bit digital input signal into a corresponding analog signal;

FIG. 6 illustrates one embodiment of a non-overlapping three phase clock used in the operation of the switched capacitor DAC of FIGS. 7A-7C;

FIGS. 7A-7C are block diagrams showing the operation of the switched capacitor DAC of FIG. 5 for each of three clock phases of a non-overlapping three phase clock;

FIGS. 8A-8D are block diagrams showing the operation of another embodiment of the switched capacitor DAC for each of four phases of a non-overlapping four phase clock;

FIG. 9 shows one embodiment of a non-overlapping four phase clock used in the operation of the switched capacitor DAC of FIGS. 8A-8D;

FIG. 10 shows the operation of the switched capacitor DAC of FIGS. 7A-7C on one phase of a non-overlapping four phase clock;

FIGS. 11A-11D are block diagrams showing the operation of another embodiment of the switched capacitor DAC of FIG. 5 for each of four phases of a non-overlapping four phase clock;

FIGS. 12A-12C are block diagrams showing the operation of another embodiment of the switched capacitor DAC of FIG. 5 for each of the three clock phases of a non-overlapping three phase clock;

FIG. 13 is a schematic diagram of another embodiment of the switched capacitor DAC of FIG. 4;

FIGS. 14A-14C are block diagrams showing the operation of the switched capacitor DAC of FIG. 13;

FIG. 15 is a block diagram of another embodiment of the switched capacitor DAC of FIG. 4;

FIG. 16A shows a schematic diagram of another embodiment of the one-bit DAC of the switched capacitor DAC of FIG. 13;

FIG. 16B shows a schematic diagram representative of one embodiment of a switched capacitor cell which may for example be use in forming a switched capacitor DAC;

FIG. 16C shows a schematic diagram of one embodiment of two switched capacitor cells to be interconnected;

FIG. 16D shows a schematic diagram of one embodiment of two switched capacitor cells to be oriented substantially perpendicular to one another and interconnected;

FIG. 16E shows a schematic diagram of one embodiment of four switched capacitor cells to be interconnected in a ring arrangement;

FIG. 17 shows one embodiment of a DAC formed in part by the switched capacitor cells of FIG. 16E;

FIG. 18 shows an embodiment of a switched capacitor DAC adapted to convert a binary weighted input signal into a corresponding analog signal;

FIGS. 19A-19C are block diagrams showing the operation of the switched capacitor DAC of FIG. 18;

FIG. 20 is a block diagram of one embodiment of the DAC portion of FIG. 3;

FIG. 21 is a schematic diagram representative of one embodiment of the DAC portion shown in FIG. 20;

FIG. 22 is a schematic diagram representative of another embodiment of the DAC portion shown in FIG. 20;

FIG. 23 is a block diagram of another embodiment of the DAC stage of FIG. 2 that includes a scrambler;

FIG. 24 is a block diagram of one embodiment of a four bit scrambler;

FIG. 25 is a schematic diagram representation of one embodiment of the DAC portion shown in FIG. 20;

FIG. 26 is a schematic block diagram of another embodiment of the DAC stage of FIG. 2;

FIG. 27 is a schematic diagram of one embodiment of a portion of the DAC stage of FIG. 2 in combination with one embodiment of the switched capacitor filter stage of FIG. 2;

FIG. 28A is an illustration of a top view of one embodiment of a switched capacitor cell;

FIG. 28B is an illustration of a top view of another embodiment of a switched capacitor cell;

FIG. 29 is a representation of a top view of one embodiment of a die layout of a DAC portion having a plurality of SC cells;

FIG. 30 is a schematic diagram of one embodiment of the continuous time filter state of FIG. 2;

FIG. 31 is a block diagram of one embodiment of a squaring circuit;

FIG. 32 shows a three phase clock;

FIGS. 33A-33C are block diagrams showing operation of one embodiment of the squaring circuit of FIG. 32;

FIGS. 34A-34C are block diagrams showing operation of one embodiment of the squaring circuit of FIG. 32; and FIG. 35 is a block diagram of one embodiment of an analog to digital converter.

DETAILED DESCRIPTION

FIG. 1 is a block diagram of one embodiment of a portion of a handset 50 for a mobile communication system. The handset 50 includes an input portion 52 having a transducer 54 that receives an input signal 56, e.g., a voice or other acoustical signal, representing information to be communicated via the mobile communication system. The transducer 54 converts the input signal 56 into an electrical signal, typically an analog signal, which is supplied to an analog-to-digital converter (ADC) 58, for example a voiceband ADC. The ADC 58 periodically samples the electrical signal and generates a sequence of multi-bit digital signals, which are supplied to a digital baseband processor 60. The baseband processor 60 performs further signal processing, including for example, compression. The output of the baseband processor 60 is supplied to burst store stage 62, which feeds a GMSK modulator 64. The GMSK modulator 64 produces multi-bit digital signals, which is supplied via signal lines, represented by a signal line 66, to a digital to analog conversion system (DAC) 68. The digital to analog conversion system 68 converts the sequence of multi-bit digital signals into an analog signal, which is supplied via signal line 70 to an output portion 72. The output portion 72 includes a mixer 74 that receives the analog signal on signal line 70 and feeds a transmitter 76, which in turn transmits the signal. DAC can be used in any digital to analog conversion.

FIG. 2 is a block diagram of one embodiment of the digital to analog conversion system 68, which utilizes a differential I/Q configuration. An I channel 78 of the digital to analog conversions system 68 includes a block 80 that receives the sequence of multi-bit digital signals on signal line 66. The block 80 generates two sequences of multi-bit digital signals, i.e., a first sequence of multi-bit digital signals that is output on signal line 82, and a second sequence of multi-bit digital signals that is output on signal line 84. The second sequence of multi-bit digital signals is generated to be the complement of the first sequence of multi-bit digital signals. The first sequence of multi-bit digital signals represents a positive version of the input signal. The second sequence of multi-bit digital signals represents a negative version of the input signal.

The first sequence of multi-bit digital signals is supplied to a first digital to analog converter stage 86, which generates analog signals that correspond to the first sequence of multi-bit digital signals. The second sequence of multi-bit digital signals is supplied to a second digital to analog converter stage 88, which generates analog signals that correspond to the second sequence of multi-bit digital signals. The analog signals from the first and the second DAC stages 86, 88 may be supplied to signal conditioning stage 89 that may comprise an analog filter, for example, a switched capacitor (SC) filter stage 90, which may help attenuate noise and/or distortion components of the analog signals. The SC filter 90 feeds a differential analog signal to the continuous time (CT) filter stage 92, which further attenuates noise and/or distortion. The CT filter stage 92 passes a differential analog signal to a pad driver stage 94. The CT filter stage 92 has a first output that connects via a first resistor 96 to a first pad 98. The CT filter stage 92 has a second output that connects via a second resistor 100 to a second pad 102. A capacitor 104 has a first terminal connected to the first pad 98, and a second terminal connected to the second pad 102.

A Q channel 106 of the digital to analog conversion system 68 contains substantially the same components as the I channel 78.

The output data rate from each of the DAC stages is typically the same as the input sample rate of the SC filter. However, as is explained hereinbelow, in the present system, the DAC stages may or may not operate at the same clock frequency as the SC filter stage. For example, one embodiment of the mobile communication system uses a system clock running at 13 MHz, wherein the output data rate from the GMSK modulator is 6.5 MHz, the cycle frequency of each of the DAC stages is 6.5 MHz, and the input sample rate of the SC filter stage 90 is 13 MHz.

FIG. 3 is a block diagram of one embodiment of the DAC stage 86, which receives a binary-weighted multi-bit digital signal on signal lines 82. The binary-weighted multi-bit digital signal is divided into a binary-weighed LSB portion and a binary-weighed MSB portion. In one embodiment, for example, the binary weighted multi-bit digital signal is ten bits, the MSB portion is four bits, and the LSB portion is six bits. The LSB's are supplied to a switched capacitor (SC) DAC 108 of a DAC portion 110 of the DAC stage 86. The SC DAC 108 forms an analog signal corresponding to the value represented by the LSB's. The MSB's are supplied to a digital signal processing stage 109 having a thermometer encoder 112 that converts the MSB's into an equally-weighted multi-bit digital signal. The equally-weighted multi-bit digital signal is input to a switched capacitor (SC) DAC 114, or the DAC portion 110 of the DAC stage 108. The SC DAC 114 is referred to herein as a segmented SC DAC because it forms an analog signal corresponding to the value represented by the equally-weighted multi-bit digital signal. The analog signal from the SC DAC 108 and the analog signal from the segmented SC DAC 114 are summed at 118 to form an analog signal, output on signal line 120. In one embodiment of the handset, the DAC stage generates 6.5 million samples per second (MS/s).

FIG. 4 is a block diagram of one embodiment of a SC DAC 150 that may be used to form one or both of the SC DAC 108 and the SC DAC 114 in the handset 50. The SC DAC 150 receives a multi-bit digital signal, e.g., $bit_1$-$bit_N$. Each bit has an associated weight, $weight_{bit1}$-$weight_{bitN}$. In one embodiment, the weight of each bit is different than those of the other bits. For example, $bit_1$-$bit_N$ may represent binary-weighted bits. In another embodiment, $bit_1$-$bit_N$ are equally-weighted, and all of the weights, i.e., $weight_{bit1}$-$weight_{bitN}$, are the same.

The SC DAC includes a plurality of switched capacitor sub-DACs (SC sub-DACs) further described hereinbelow. Each of the SC sub-DACs shares charge via a charge sharing network with at least one other of the SC sub-DACs. The SC DAC 150 outputs one or more analog signals, e.g., $output_1$-$output_M$, each indicative of a sum of values of the bits in the multi-bit signal.

FIGS. 5, 7A–7C, 8A–8C, 10, 11A–11D, 12A–12C, 13, 17, 14A–14C, 15, 20, 21, 22, 25, disclose various embodiments of the SC DAC 150.

Referring now to FIG. 5, a block diagram shows one embodiment of the SC DAC 150 that is adapted to convert a 4-bit digital input signal $bit_1$, $bit_2$, $bit_3$, $bit_4$, into a corresponding analog signal, which is supplied to output terminal 160. The DAC 150 comprises four switched capacitor DACs 162, 164, 166, 168, sometimes referred to as sub-DACs. In this embodiment, each of the sub-DACs 162, 164, 166, 168 is a one bit DAC.

The one-bit DAC 162 has a reference voltage V1 connected to a first terminal of a switch S1, the second terminal of which is connected to a first terminal of a switch S2 and a first terminal of a switch S3. A second terminal of the switch S2 is connected to a reference voltage V2. A second terminal of the switch S3 is connected to a first terminal of a capacitor C1 that has a second terminal connected to a reference voltage, e.g., ground. The digital signal $bit_1$ is presented to an input terminal 172 from where it is supplied to the one-bit DAC 162 to control the "on" (i.e., closed)/"off" (i.e., open) condition of the switch S1. The digital signal $bit_1$ is further supplied to an inverter 174 that generates a signal at terminal 176 used to control switch S2.

The one-bit DAC 164 has a reference voltage V3 connected to a first terminal of a switch S4, the second terminal of which is connected to a first terminal of a switch S5 and a first terminal of a switch S6. A second terminal of the switch S5 is connected to a reference voltage V4. A second terminal of the switch S6 is connected to a first terminal of a capacitor C2 having a second terminal connected to a reference voltage, e.g., ground. The digital signal $bit_2$ is presented to an input terminal 178 from where it is supplied to the one-bit DAC 164 to control switch S4 and input to an inverter 180 that generates a signal at terminal 182 used to control switch S5.

The one-bit DAC 166 has a reference voltage V5 connected to a first terminal of a switch S7, the second terminal of which is connected to a first terminal of a switch S8 and a first terminal of a switch S9. A second terminal of the switch S8 is connected to a reference voltage V6. A second terminal of the switch S9 is connected to a first terminal of a capacitor C3 having a second terminal connected to a reference voltage, e.g., ground. The digital signal $bit_3$ is presented to an input terminal 184 from where it is supplied to the one-bit DAC 166 to control switch S7 and input to an inverter 186 that generates a signal at terminal 188 used to control switch S8.

The one-bit DAC 168 has a reference voltage V7 connected to a first terminal of a switch S10, the second terminal of which is connected to a first terminal of a switch S11 and a first terminal of a switch S12. A second terminal of the switch S11 is connected to a reference voltage V8, a second terminal of the switch S12 is connected to a first terminal of a capacitor C4 having a second terminal connected to a reference voltage, e.g., ground. The digital signal $bit_4$ is presented to an input terminal 190 from where it is supplied to the one-bit DAC 168 where it is used to control charging switch S10 and input to an inverter 192 that generates a signal at terminal 194 used to control switch S11.

The first terminal of each of the capacitors C1, C2, C3, C4 is supplied to a first terminal of a charge sharing switch S13, charge sharing switch S14, charge sharing switch S15, and charge sharing switch S16, respectively. The second terminal of each of the switches S13-S16 are connected to a first terminal of a charging switch S17, that has a second terminal connected to the output terminal 160.

In one embodiment, each of the digital signals $bit_1$, $bit_2$, $bit_3$, and $bit_4$ are equally-weighted. In such an embodiment, the one-bit DAC 162, the one-bit DAC 164, the one-bit DAC 166, and the one-bit DAC 168 may have similar configurations wherein, V1=V3=V5=V7, V2=V4=V6=V8, and the values of C1, C2, C3, and C4 are identical, or at least substantially identical. However, such similarity is not absolutely required. In other equally-weighted embodiments, the one-bit DAC 162, the one-bit DAC 164, the one-bit DAC 166 and the one-bit DAC 168 may not be identical. Each of the switched capacitor sub-DACs employs charge approximately equal to a constant K, times a weight(s) of the bit(s) into the switched capacitor sub-DAC.

In one embodiment, the reference voltages V1, V3, V5 and V7 are connected to a reference voltage $V_{ref}$, and reference voltages V2, V4, V6, V8 are connected to ground.

The DAC 150 may receive a non-overlapping 3-phase clock, P1, P2, P3, shown in FIG. 6. The closed/open condition of the switches S3, S6, S9, and S12 is controlled by the P3 signal of the 3-phase clock. The P1 signal of the 3-phase clock controls the open/closed condition of the charge sharing switches S13, S14, S15, and S16. The P2 signal of the 3-phase clock controls the open/closed condition of the switch S17.

In particular, on clock phase P3, i.e., phase P3 has a logic high state (e.g. "1"), capacitors C1, C2, C3, and C4 are each charged to $V_{ref}$ or, alternatively, discharged to ground in response to the state of the associated one of the digital signals $bit_1$, $bit_2$, $bit_3$, $bit_4$, and charge sharing switches S13, S14, S15, and S16 and output switch S17, are all in the open condition. On clock phase P1, charging switches S3, S6, S9, and S12 are all in an open condition, and charge sharing switches S13, S14, S15 and S16 are all in a closed condition, wherein charge may be redistributed. On clock phase P2, all charging switches, i.e., S3, S6, S9, and S12, and charge sharing switches S14, S15, and S16, are in an open condition. Also on phase P2, charge sharing switch S13 and output switch S17 are each in a closed condition wherein charge may be delivered to the output terminal 160.

FIGS. 7A-7C are block diagrams showing the operation of the SC DAC 150 of FIG. 5 for each of the 3 clock phases in the event that input terminals 172, 178, 184, and 190 are supplied with digital bit signals $bit_1$, $bit_2$, $bit_3$, $bit_4$, having logic states of 1, 0, 0, 0, respectively. Tables show the relationship between the clock phase, and the state (i.e., voltage and charge) of the capacitors in the one-bit DACs. Referring now to FIG. 7A, on phase P3 of the 3-phase clock, all of the charge sharing switches S13, S14, S15, and S16 and the output switch S17, are in the open condition. The capacitor C1 is charged to $V_{ref}$ in response logic state 1 on terminal 172. Capacitors C2, C3 and C4 are all discharged to ground in response to the logic state 0 signals on terminals 178, 184, 190, respectively. Referring now to FIG. 7B, on phase P1 of the 3-phase clock, all of the charging switches S3, S6, S9 and S12 (FIG. 5) and the output switch S17 are in an open condition, and all of the charge sharing switches S13, S14, S15 and S16 are in a closed condition, whereby charge is redistributed and resulting in the total charge on all of the capacitors being divided among all of the capacitors. If the capacitors C1, C2, C3, C4 all have the same capacitance value C, then the charge is shared equally so that the voltage across each capacitor becomes $V_{ref}/4$. Referring now to FIG. 7C, on phase P2, charge sharing switches S14, S15, and S16 are in the open condition, output switch S17 is in the closed condition, and capacitor C1 (FIG. 5) of one-bit DAC 162 delivers its charge to the output terminal 160. On the next occurrence of phase P3 (not shown), the multi-bit digital signal $bit_1$, $bit_2$, $bit_3$, and $bit_4$ may be updated and provided to the DAC 150 via input terminals 172, 178, 184, 190.

In one or more embodiments charge sharing (i.e., mixing) before delivering may help reduce non-linear glitch energy. However, a reduction in glitch energy need not be sought nor obtained in every embodiment, and is not a requirement of the switched capacitor techniques disclosed herein.

The accuracy of the signal(s) out of the SC DAC 150 depends at least in part on the degree of correspondence between the capacitors C1, C2, C3, C4. In some embodiments it may be sought to have the components that are used to employ the switched capacitor techniques, e.g., C1, C2, C3, C4, match as closely as is possible limited only for example by limitations in manufacturing processes. In other embodiments however, such matching may not be required or desired, but rather, all that may be desired is a degree of correspondence to provide suitable DAC transfer characteristics. Thus, in some embodiments they may be substantially identical, but in other embodiments they may not be substantially identical.

In some embodiments, there may be one or more parasitic capacitance(s) that have an effect on the degree of correspondence, and it may be desirable, although not necessary to the techniques described herein, to provide a parasitic capacitance(s) that has an effect that offsets an effect of other parasitic capacitance.

The term switch as used herein is defined as any type of switching element. The term capacitor as used herein is defined as any type of capacitive element. The switches and the capacitors are not limited to any particular type(s) of switching element and capacitive element, respectively. Thus for example, a switching element may be a single element. As another example, a switching element may comprise a plurality of elements that function as a switch. As a further example, a capacitive element may be a capacitor. As a further example, a capacitive element may comprise one or more elements that provide capacitance.

A switch may include but is not limited to one or more active elements (for example one or more transistors) and may but need not employ MOS technology. A capacitor may include but is not limited to metal, polysilicon and double polysilicon, metal metal, metal poly, poly diffusion, semiconductors, junction capacitors, parallel plate technology, adjacent conductors, fringing capacitors.

Although described above with respect to an input signal having logic states of 1, 0, 0, 0, the input signals can have logic states with any combination of ones and zeros.

In another embodiment, the digital signal $bit_1$, $bit_2$, $bit_3$, and $bit_4$ are binary-weighted bit signals. In such embodiments, the weight of the digital bit signals $bit_1$, $bit_2$, $bit_3$, and $bit_4$ are 1, 2, 4, and 8, respectively. To accommodate these various weights, each of the SC DACs utilize an amount of charge proportional to the weight of the bit signal supplied to the SC DAC. Thus, C1 is provided with ½ of the charge provided to C2, ¼ of the charge provided to C3, and ⅛ of the charge provided to C4. In other words, the charge provided to C4 is 8 times that provided to C1, 4 times that provided to C2, and 2 times that provided to C3. On clock phase P1, switches S13-S16 are in the closed condition, whereby charge is redistributed among the capacitors so that the voltage across each of the capacitors is indicative of the sum of the values of the bits in the multi-bit signal. The charge on each capacitor is equal to the voltage across that capacitor multiplied by its capacitance. On the phase P2, the outer switch S17 is in the closed condition and one of the capacitors delivers its charge to the output terminal.

In one embodiment, the SC DAC 188 (FIG. 3) is formed using a SC DAC 150, where the size of each capacitor C1, C2, C3, C4 of the one-bit DACs 162, 164, 166, 168, respectively, is scaled directly proportionate to the weight of the binary-weighted bit input to the one-bit DACs 162, 164, 166, 168.

FIGS. 8A-8D are block diagrams showing the operation of another embodiment of the SC DAC 150, for each of 4 phases of a non-overlapping four phase clock (FIG. 9) if input terminals 172, 178, 184, 190, are supplied with digital bit signals $bit_1$, $bit_2$, $bit_3$, $bit_4$, having logic states of 1, 0, 0, 0, respectively. Tables show the relationship between the clock phase and the state (i.e., voltage and charge) of the capacitors in the one-bit DACs. The non-overlapping four phase clock may be derived from a master clock (FIG. 9). The embodiment shown in FIGS. 8A-8D is the same as that shown in FIG. 5 and FIGS. 7A-7C, except that switches S18-S24 replace switches S13-S17. Referring now to FIG. 8A, on phase P3 of the 4-phase clock, capacitor C1 of the one-bit DAC 162 is charged to a voltage $V_{ref}$ in response to the logic state 1 on input terminal 172. Capacitors C2, C3, and C4 of the one-bit DACs 164, 166, 168, respectively, are all discharged to ground in response to the logic state 0 on each of the input terminals 178, 184, 190. All of the charge sharing switches S18-S23 and the output switch S24 are in the open condition. Referring now to FIG. 8B, on phase P4 of the 4-phase clock, charge sharing switches S18, S19, S20, and S21 are in the closed condition wherein the charge on capacitor C1 (FIG. 5) of the one-bit DAC 162 is redistributed. Capacitor C1 retains ½ of the charge and capacitor C2 (FIG. 5) of one-bit DAC 164 receives ½ of the charge. In the event that either capacitor C3 or capacitor C4 had charge, the charge would be redistributed between capacitor C3 and capacitor C4.

Referring now to FIG. 8C, on phase P1 of the 4-phase clock, charge sharing switches S19 and S21 are in an open condition. Charge sharing switches S22 and S23 are in a closed condition, the charge on capacitor C1 of the one-bit DAC 162 is redistributed between capacitor C1 and capacitor C3 of the one-bit DAC 166. In particular, in one embodiment the charge on the capacitor C1 is divided substantially evenly between capacitor C1 and capacitor C3 such that each ends up with substantially one half of the charge on capacitor C1 in FIG. 8B, i.e., one quarter of the total charge on capacitor C1 in FIG. 8A. Referring now to FIG. 8D, on phase P2 charge-sharing switches S19, S20, S21, and S23 are in an open condition. Also on phase P2 switches S18, S22, and S24, are in a closed condition whereby capacitor C1 (FIG. 5) of the one-bit DAC 162 delivers its charge to the output terminal 160.

Referring now to FIG. 10, in another embodiment, the SC DAC 150 described with respect to FIGS. 7A-7C operates with a non-overlapping four-phase clock, e.g., the four-phase clock illustrated in FIG. 9 instead of the three phase of FIG. 6. On phase P3 of the four phase clock, the condition of the SC DAC 150 is the same as that described above with respect to FIG. 7A. On phase P4 of the four phase clock, the condition of the SC DAC 150 is the same as that described above with respect to FIG. 7B. On phase P1 of the four phase clock, the condition of the SC DAC 150 is the same as that described above with respect to FIG. 7C. FIG. 10 shows the state of the SC DAC 150 on phase P2 of the four phase clock. On phase P2 of the four phase clock, the charging switches S3, S6, S9, S12 (FIG. 5) are in the open condition, charge sharing switches S13, S15, S16 are in the open condition, and switch S14 and output switch S19 are in the closed condition, wherein C2 of the one-bit DAC delivers its charge to the output terminal 160. Thus, in such embodiment, two copies, each indicative of the sum of the values of the bits in the multi-bit digital input signal, are separately delivered to the output terminal. As described above, in this embodiment, they are delivered one after the other. However, in another embodiment, they may be delivered simultaneously.

FIGS. 11A-11D are block diagrams showing the operation of the embodiment of FIG. 5 of each of 4 phases of a non-overlapping four phase clock (FIG. 9) if input terminals 172, 178, 184, 190, are supplied with digital bit signals $bit_1$, $bit_2$, $bit_3$, $bit_4$, 593 having logic states of 1, 0, 0, 0, respectively. Tables show the relationship between the clock phase and the state (i.e., voltage and charge) of the capacitors in the one-bit DACs. The embodiment shown in FIGS. 11A-11D is the same as that shown in FIG. 5 and FIGS. 7A-7C, except that switches S18-S27 replace switches S13-S17.

Referring now to FIG. 11A, on phase P3 of the 4-phase clock, capacitor C1 of the one-bit DAC 162 is charged to a voltage $V_{ref}$ in response to the logic state 1 on input terminal 172. Capacitors C2, C3, and C4 of the one-bit DACs 164, 166, 168, respectively, are all discharged to ground in response to the logic state 0 on each of the input terminals 178, 184, 190. All of the charge sharing switches S18-S21, S25-S27 are in the open condition. Referring now to FIG. 11B, on phase P4 charge sharing switches S18, S19, S20, and S21 are in a closed condition wherein the charge on capacitor C1 (FIG. 5) of the one-bit DAC 162 is redistributed, whereby capacitor C1 retains ½ of the charge and capacitor C2 (FIG. 5) of one-bit DAC 164 receives ½ of the charge. In the event that either capacitor C3 or capacitor C4b had charge, the charge would be redistributed between capacitor C3 and capacitor C4.

Referring now to FIG. 11C, on phase P1, charge sharing switches S19 and S21 are in an open condition and charge sharing switch S26 is in a closed condition. The charge on capacitor C1 of the one-bit DAC 162 is redistributed between capacitor C1 and capacitor C3 of the one-bit DAC 166. In particular, the charge on the capacitor C1 is divided substantially evenly between capacitor C1 and capacitor C3 such that each ends up with ½ the charge on capacitor C1 in FIG. 11B, i.e., ¼ of the total charge on capacitor C1 in FIG. 11A. Referring now to FIG. 11D, on P2 charge sharing switches S19, S20, S21, S26, and S27, are in an open condition, and switches S18, and S25, are in the closed condition whereby capacitor C1 of the one-bit DAC 162 (FIG. 5) delivers its charge to the output terminal 160. Although switch S27 is in an open condition on phase P2 and does not deliver charge, in other embodiments, switch S27 may be configured to be in a closed condition on phase P2 so that switch S27 delivers a copy of the charge, which is in addition to the copy delivered by switch S25. In still further embodiments, an additional clock phase, e.g., a phase P5, is provided and switch S27 is used to deliver a copy of the charge on phase P5.

FIGS. 12A-12C are block diagrams showing the operation of another embodiment of the SC DAC 150 of FIG. 5 for each of the 3 clock phases if input terminals 172, 178, 184, and 190 are supplied with digital bit signals $bit_1$, $bit_2$, $bit_3$, $bit_4$, having logic states of 1, 0, 0, 0, respectively. Tables show the relationship between the clock phase and the state (i.e., voltage and charge) of the capacitors in the one-bit DACs. The embodiment shown in FIGS. 12A-12C is the same as that shown in FIG. 5 and FIGS. 7A-7C, except that switches S28-S33 replace switches S13-S17. Referring now to FIG. 12A, on phase P3 of the 3-phase clock, all of the switches S28-S33 are in the open condition. The capacitor C1 is charged to $V_{ref}$ in response to the logic state 1 on terminal 172. Capacitors C2, C3 and C4 are all discharged to ground in response to the logic state 0 signals on terminals 178, 184, 190, respectively. Referring now to FIG. 12B, on phase P1 of the 3-phase clock, all of the charging switches S3, S6, S9 and S12 (FIG. 5) and the switches S32, S33 are in an open condition, and all of the charge sharing switches S28-S31 are in a closed condition, wherein the charge on capacitor C1 (FIG. 5) of the one-bit DAC 162 is redistributed, whereby capacitor C1 retains ½ of the charge and capacitor C2 (FIG. 5) of one-bit DAC 164 receives ½ of the charge. In the event that either capacitor C3 or capacitor C4 had charge, the charge would be redistributed between capacitor C3 and capacitor C4. Referring now to FIG. 12C, on phase P2 of the 3-phase clock charge sharing switches S29 and S31 are in the open condition, switches S32 and S33 are in the closed condition, and capacitors C1 of one-bit DAC 162 (FIG. 5) and C3 of one-bit DAC 166 (FIG. 5) delivers their charge to the output terminal 160. On the next phase P3 (not shown), the multi-bit digital signal $bit_1$, $bit_2$, $bit_3$, and $bit_4$ may be updated and provided to the DAC 150 via input terminals 172, 178, 184, 190.

FIG. 13 is a schematic diagram of another embodiment of the SC DAC 150, which receives the 4-bit digital signal, $bit_1$, $bit_2$, $bit_3$, $bit_4$, on input terminals 172, 178, 184, and 190, respectively, and outputs an analog signal on output terminal 160 indicative of a sum of the values of the bits in the 4-bit digital signal. In this embodiment, the SC DAC 150 comprises four one-bit DACs 202, 204, 206, 208 which are similar to the one-bit DACs 162, 164, 166, 168 (FIG. 5) except that the one-bit DACs 202, 204, 206, 208 each have an additional path 212, 214, 216, 218, respectively, that connects to the respective capacitor C1, C2, C3, C4. The first terminal of the capacitor C1 connects to a first terminal of a charge sharing switch S43, a second terminal of which connects to the first terminal of the capacitor C2. The first terminal of the capacitor C2 further connects to a first terminal of a charge sharing switch S44, a second terminal of which connects to the first terminal of the capacitor C3 which is further connected to a first terminal of a charge sharing switch S45. A second terminal of the charge sharing switch S45 is connected to the first terminal of the capacitor C4 which further connects to a first terminal of a charge sharing switch S46. A second terminal of the charge sharing switch S46 connects to the first terminal of the capacitor C1. The first terminal of the capacitor C3 is further connected to a first terminal of an output switch S47, a second terminal of which connects to the output terminal 160.

FIGS. 14A-14C are block diagrams showing the operation the SC DAC 150 of FIG. 13 if input terminals 172, 178, 184, and 190 are supplied with digital bit signals $bit_1$, $bit_2$, $bit_3$, $bit_4$, having logic states of 1, 0, 0, 0, respectively. Tables show the relationship between the clock phase and the state (i.e., voltage and charge) of the capacitors in the one-bit DACs. Referring now to FIG. 14A, on phase P3 of the 3-phase clock, all of the charge sharing switches S43, S44, S45, and S46 and the output switch S47, are in the open condition. The capacitor C1 is charged to $V_{ref}$ in response to the logic 1 on terminal 172. Capacitors C2, C3 and C4 are all discharged to ground in response to the logic 0 signals on terminals 178, 184, 190, respectively. Referring now to FIG. 14B, on phase P1 of the 3-phase clock all of the charging switches S3, S6, S9 and S12 (FIG. 13) and the output switch S47 are in an open condition, and all of the charge sharing switches S43, S44, S45 and S46 are in a closed condition, whereby charge is redistributed and results in the total charge on all of the capacitors being divided among all of the capacitors. Because the capacitors C1, C2, C3, C4 all have the same capacitance value, the charge is shared equally so that the voltage across each capacitor becomes $V_{ref}/4$. Referring now to FIG. 14C, on phase P2 charge sharing switches S43, S44, S45, and S46 are in the open condition, output switch S47 is in the closed condition, and capacitor C1 (FIG. 5) of one-bit DAC 202 delivers its charge to the output terminal 160. On the next phase P3 (not shown), the multi-bit digital signal $bit_1$, $bit_2$, $bit_3$, and $bit_4$ may be updated and provided to the DAC 150 via input terminals 172, 178, 184, 190.

Other embodiments have further DAC and switch arrangements and configurations. For example, in one embodiment, the DAC includes one-bit DACs that are substantially identical to one another, and interconnected through the switch network to form an "open arrangement", such embodiment being referred to herein as a "snake arrangement".

FIG. 15 is a block diagram of another embodiment of the SC DAC 150, which is similar to the SC DAC 150 illustrated in FIGS. 9, 10A-10C, except that the SC DAC 150 of FIG. 15 further comprises a switch S48, a switch S49, and a switch S50. A first terminal of the switch S48 is connected to the second terminal of the charge sharing switch S43. A first terminal of the switch S49 is connected to the second terminal of the charge sharing switch S45. A first terminal of the switch S50 is connected to the second terminal of the charge sharing switch S46. Each of the switches S48, S49, and S50 may, but need not serve one or more of the functions noted hereinbelow. In one embodiment, one purpose of the switches S48, S49, S50 is to provide parasitic capacitance similar to that of output switch S47, so as to help cancel the effect of the parasitic capacitance of switch S47.

FIG. 16A shows a schematic diagram of another embodiment of a one-bit DAC 221, that includes the one-bit DAC 204, the switch S43 and the switch S48 of the SC DAC 150 of FIG. 15. The one-bit DAC 204 includes a switched capacitor (SC) portion 220 and a switch control portion 222. The SC portion 220 includes the switch S4, the switch S5, and the capacitor C2. The switch control portion 222 has an AND gate 223A that receives the phase signal P3 and the digital signal $bit_2$ and outputs a signal, on signal line 223B, that is used to control the switch S4. The digital signal $bit_2$ is further provided to the inverter 180, which outputs a signal 182 that is supplied to an AND gate 223C that further receives the phase signal P3 and outputs a signal, on signal line 223D, that is used to control the switch S5.

FIG. 16B shows a schematic diagram representative of one embodiment of a layout of a switched capacitor cell (SC cell) 300, which may be used for example in forming a SC DAC. In this embodiment, the SC cell 300 comprises the SC portion 220 (FIG. 16A) of the one-bit DAC 204 (16A) including the switch S4, the switch S5, and the capacitor C2. The SC cell 300 further includes switch S43, switch S48, and conductors to provide control signals to the switches of the SC cell 300. For example, SC cell 300 includes a conductor with a terminal 302 to provide a control signal to switch S48, a conductor with a terminal 304 to provide a control signal to switch S43, a conductor with a terminal 306 to provide a control signal to switch S4, and a conductor with a terminal 308 to provide a control signal to switch S5. The SC cell further includes a conductor with a terminal 310 to connect to a terminal of the switch S43, a conductor with a terminal 311 to connect to a terminal of the switch S48, and further includes a conductor with a set of terminals 312, 314 to connect to the capacitor C2. The terminals 302, 304, 306, 308, 310, 311, 312, 314, are disposed along the perimeter of the SC cell 300. The SC cell has a reference direction $D_{300}$.

In this embodiment, the footprint of each SC cell is square or at least substantially square. In another example embodiment, the footprint may be octagonal or at least substantially octagonal. In one embodiment, switch terminal 310 has substantially identical composition and surface area as switch terminal 311, and contributes the same amount of capacitance as switch terminal 311. In one embodiment, the capacitor is disposed such that the center of the capacitor coincides with, or at least substantially overlays, the center of the footprint of the SC cell.

Referring now to FIG. 16C, an SC cell 300A is schematically identical to the SC cell 300. The SC cell 300A has a reference direction $D_{300A}$. The SC cell 300 is adapted to electrically connect to the SC cell 300A if the SC cell 300A is positioned adjacent to the SC cell 300 and oriented such that its reference direction $D_{300A}$ is directed in the same direction as the reference direction $D_{300}$ of the SC cell 300. In such position and orientation, the terminal 314 on SC cell 300 electrically connects to the terminal 310A on SC cell 300A, thereby coupling capacitor C2 of SC cell 300 to capacitor C2A of SC cell 300A through switch S43A.

Referring now to FIG. 16D, in some embodiments, the SC cell 300 is further adapted to electrically connect to the SC cell 300A if the SC cell 300A is positioned adjacent to the SC cell 300 and oriented such that its reference direction is directed in a direction having a predetermined angular offset from the reference direction $D_{300}$ of the SC cell 300. In this embodiment, the predetermined angular offset is ninety degrees. In other embodiments, other predetermined angular offsets may be employed. In such position and orientation, the terminal 312 on SC cell 300 electrically connects to the terminal 311A on SC cell 300A, thereby coupling capacitor C2 of SC cell 300 to capacitor C2A of SC cell 300A through switch S48A.

FIG. 16E shows four identical SC cells, i.e., an SC cell 300, an SC cell 300A, an SC cell 300B, and a SC cell 300C. The SC cell 300 has a reference direction $D_{300}$. The SC cell 300A has a reference direction $D_{300A}$. The SC cell 300B has a reference direction $D_{300B}$. The SC cell 300C has a reference direction $D_{300C}$. The SC cell 300A is oriented such that its reference direction $D_{300A}$ is directed in a direction offset ninety degrees from the reference direction $D_{300}$. The SC cell 300B is oriented such that its reference direction $D_{300B}$ is directed in a direction offset ninety degrees from the reference direction $D_{300A}$. The fourth SC cell 300C is oriented such that its reference direction $D_{300C}$ is directed in a direction offset ninety degrees from the reference direction $D_{300B}$. Such embodiment is one type of a "ring arrangement". If the SC cells 300, 300A, 300B, 300C are positioned adjacent to one another and oriented as shown, then each of the SC cells has a switch terminal 311 connected to a capacitor terminal 312 of a neighboring SC cell, and further has a capacitor terminal 312 connected to a switch terminal 311 of a neighboring cell.

FIG. 17 shows one embodiment of the SC DAC 150 that is formed, at least in part, by SC cells arranged into a "ring arrangement". In this embodiment, the SC DAC 150 includes four one-bit DACs 202, 204, 206, 208. The one-bit DAC 202 includes an SC cell 300A and a switch control portion 350. The one-bit DAC 204 includes an SC cell 300B and a switch control portion 352. The one-bit DAC 206 includes an SC cell 300C and a switch control portion 354. The one-bit DAC 208 includes the SC cell 300D and a switch control portion 356. The SC cell 300A has a reference direction $D_{300A}$. The SC cell 300B has a reference direction $D_{300B}$. The SC cell 300C has a reference direction $D_{300C}$. The SC cell 300D has a reference direction $D_{300D}$. The reference direction $D_{300B}$ is directed in a direction that is offset ninety degrees from the reference direction $D_{300A}$. The reference direction $D_{300C}$ is directed in a direction that is offset ninety degrees from the reference direction $D_{300B}$. The reference direction $D_{300D}$ is directed in a direction that is offset ninety degrees from the reference direction $D_{300C}$.

The digital signal $bit_1$ and the phase P3 signal are supplied to the switch control portion 350, which generates switch control signals, on signal lines 360, 362 supplied to the SC cell 300A. The digital signal $bit_2$ and the phase P3 signal are supplied to the switch control portion 352, which generates switch control signals, on signal lines 364, 366 supplied to the SC cell 300B. The digital signal $bit_3$ and the phase P3 signal are supplied to the switch control portion 354, which generates switch control signals on signal lines 368, 370 supplied to the SC cell 300C. The digital signal $bit_4$ and the phase P3 signal are supplied to the switch control portion 356, which generates switch control signals, on signal lines 372, 376 supplied to the SC cell 300D.

FIG. 18 shows an embodiment of the SC DAC 108 (FIG. 3) that is adapted to convert a two bit binary-weighted input signal bit$_1$, bit$_2$ into a corresponding analog signal. This embodiment of a switched capacitor DAC is disclosed in F-J. Wang et al., "A Quasi-Passive CMOS Pipeline D/A converter", IEEE Journal of Solid State Circuits, Vol. 24, no. 6, Dec 1989, pp. 1752-1755. In this embodiment of the SC DAC 108, the values of C101, C102, C103 are substantially identical. The SC DAC 108 receives a non-overlapping 3-phase clock, P1, P2, P3, e.g., shown in FIG. 3. The closed/open condition of the switches S102, S103, S104, S105, S106, S109 is controlled by the 3-phase clock. The closed/open condition of the switches S100, S101, and the switches S107, S108 are controlled by the logic state of the LSB and the MSB, respectively.

FIGS. 19A-19C are block diagrams showing the operation of the SC DAC 108 of FIG. 18 for each of the 3 clock phases in the event that the LSB and the MSB digital input signals have logic states of 1, 0, respectively. Tables show the relationship between the clock phase, and the state (i.e., voltage and charge) of the capacitors in the one-bit DACs. Referring now to FIG. 19A, on phase P1 of the 3-phase clock, switch S102 and switch S104 are in the closed condition whereby capacitor C102 is discharged to ground, and capacitor C101 is charged to $V_{ref}$ in response to the state of the LSB. Referring now to FIG. 19B, on phase P2 switches S102 and S104 are in the open condition. Switch S103 is in the closed condition whereby C101 and C102 split the charge initially stored on C101. Because the capacitors C101 and C102 have the substantially the same capacitance value, the charge is shared equally so that the voltage across each capacitor becomes $V_{ref}/2$. Referring now to FIG. 19C, on P3 of the 3-phase clock charge sharing switch S105 is in the closed condition, S102-S104, S106, and S109 are in the open condition. C101 and C103 share charge, in specific, C101 and C103 split the charge from C101. Because the capacitors C101 and C102 have substantially the same capacitance value, the charge is shared equally so that the voltage across each capacitor becomes $V_{ref}/4$. On the next phase P1 (see FIG. 19A for switch configuration), output switch S109 is in the closed condition, and capacitor C103 delivers its charge to the output.

FIG. 20 is a block diagram of another of the DAC portion 110 of the DAC stage 86 shown in FIG. 3. In this embodiment, an output terminal 111 of the SC DAC 108 for processing the MSB of the binary-weighted multi-bit digital input signal is coupled to one of the charge sharing switches of the segmented SC DAC 114 (FIG. 3).

FIG. 21 is a schematic representation of one embodiment of the DAC portion 110 shown in FIG. 20. In this embodiment, the DAC portion 110 includes an SC DAC 150 such as that described above with respect to FIG. 17. The DAC portion 110 further includes an SC DAC 108 (only MSB portion shown), such as that described above with respect to FIG. 18. A one-bit DAC for processing the MSB includes a SC cell 380 and a switch control portion 382. The digital signal MSB and the phase P2 signal are supplied to the switch control portion 382, which generates switch control signals on lines 384, 386, that are supplied to the SC cell 380. An output terminal of the SC cell 380 is coupled to one of the SC cells 300A, 300B, 300C, 300D, e.g., SC cell 300D.

In this embodiment, the SC DAC 108 and the SC DAC 150 each receive a non-overlapping three phase clock. On phase P2, the one-bit DAC of the MSB of the SC DAC 108 undergoes pre-charge in accordance with the logic state of the MSB signal into the SC DAC 108. On phase P3, a charge sharing switch of the SC DAC 108 is in the closed condition, whereby the one-bit DAC of the MSB portion of the SC DAC 108 shares charge with the preceding one-bit DAC of the SC DAC 108. Also on phase P3, the SC DAC 150 undergoes precharge in accordance with the multi-bit digital signal, bit$_1$, bit$_2$, bit$_3$, bit$_4$. On phase P1, the charge sharing switches of the SC DAC 150 are in the closed condition, whereby charge is redistributed among the one-bit DACs in the SC DAC 150 and the one-bit DAC of the MSB of the SC DAC 108. On phase P2, switch S48 is in the closed condition, and one of the one-bit DACs of the SC DAC 150 delivers charge, i.e., a data sample, to the output terminal 120 of the DAC portion 110 of the DAC stage 86 (FIG. 3).

FIG. 22 is a schematic representation of another embodiment of the DAC portion 110 shown in FIG. 20. In this embodiment, the SC DAC 150 includes 3 one-bit DACS, 202, 204, 206. In this embodiment, unlike the embodiment of FIG. 21, the MSB portion of the SC DAC 108 is positioned in the "ring arrangement" of the SC DAC 150. Thus, besides the SC cell 380 used for the MSB portion of the SC DAC 108 (FIG. 3) there are three other SC cells in the ring arrangement. Operation of the DAC portion 110 shown in FIG. 22 is similar to that described above with respect to the DAC portion 110 of FIG. 21.

FIG. 23 is a block diagram of another embodiment of the DAC stage 86, which receives a binary-weighted multi-bit digital signal on signal line 82. The binary-weighted multi-bit digital signal is divided into a binary-weighted LSB portion and a binary-weighted MSB portion. The LSB's are supplied to a switched capacitor (SC) DAC 108 that forms an analog signal corresponding to the value represented by the LSB's. The MSB's are supplied to a thermometer encoder 112 that converts the MSB's into an equally-weighted multi-bit digital signal. The equally-weighted multi-bit digital signal is input to a scrambler 400, and help reduce the effects of the noise and/or distortion produced by the digital to analog converter. The scrambler 400 outputs equally-weighted scrambled bits which are supplied to a switched capacitor (SC) DAC 114. The SC DAC 114 forms an analog signal corresponding to the value represented by the equally-weighted, scrambled, multi-bit digital signal. The analog signal from the SC DAC 108 and the analog signal from the summed SC DAC 114 are summed at 118 to form an analog signal, output on signal line 120.

FIG. 24 is a block diagram of one embodiment of a four bit scrambler 400 that receives a three bit digital input signal, bit$_A$, bit$_B$, bit$_C$. A scrambler is typically most effective when all of the scrambler inputs receive data. The extra input(s) of the scrambler may for example be "hardwired" to a logic state, i.e., a 1 or a 0. In this event that an input(s) of a scrambler is hardwired, it may be desirable to hardwired a corresponding number of DAC input(s), to a logic state opposite to that used for the extra input(s) of the scrambler.

The scrambler may be any type of scrambler. For example, various scramblers and scrambler configurations are disclosed in U.S. Pat. Nos. 5,977,899 and 5,404,142, and in Kwan, Tom, et al., "A Stereo Multibit Sigma-Delta DAC with Asynchronous Master-Clock Interface", IEEE Journal of Solid-State Circuits, Vol. 31, No. 12, Dec. 1996, pp. 1881-1887. In addition, the scrambler may use any of various schemes, e.g., data directed, random swapping.

FIG. 25 is a schematic representation of one embodiment of the DAC portion 110 of the DAC stage 86 shown in FIG. 20. In this embodiment, unlike the embodiment of FIG. 22, the MSB portion of the SC DAC 108 is one of six SC cells in a "ring arrangement". Thus, besides the SC cell 380 used for the MSB portion of the SC DAC 108 (FIG. 3) there are five other SC cells in the ring arrangement, namely, SC cells 300A-300E. In this embodiment, the five SC cells 300A-

300E form a segmented SC DAC 114 (FIG. 3). SC cell 380 and SC cell 300D are similarly oriented to each other, i.e., D380 and $D300_D$ are directed in similar direction to each other. Likewise, SC cell 300B and SC cell 300E are similarly oriented to each other.

The bits $bit_1$, $bit_2$, $bit_3$, $bit_4$, of the multi-bit digital signal are supplied to the SC cells 300A, 300B, 300C, 300D, respectively. The SC cell 300E may be supplied with a signal having a "hardwired" logic state. In some embodiments, supplying such an input signal has an effect on the "gain" of the SC DAC 114 (FIG. 3). Some embodiments may provide compensation for any "gain" effect. Compensation may for example be provided in the digital signal processor stage 109 (FIG. 3), the signal conditioning stage 89 (FIG. 3), or in the DAC portion 110 (FIG. 3), or any combination thereof. In addition, the input signal may be of a type that does not result in a "gain effect". If an input signal is supplied to the SC cell 300E, the signal is not limited to one hardwired to a logic state but rather may be any type of signal, and may be time varying or non-time varying.

FIG. 26 is a schematic block diagram of another embodiment of the DAC stage 86 (FIG. 3). An MSB portion of an equally-weighted multi-bit digital signal is input to the scrambler 400, which outputs equally-weighted scrambled bits to a gating stage 420. The gating stage 420 (sixteen gating stages) further receives one of the clock phase signals, e.g., P3, and outputs gates, equally-weighted scrambled bits to a switched capacitor (SC) DAC 114. The SC DAC 114 forms an analog signal corresponding to the value represented by the equally-weighted, scrambled, multi-bit digital signal. The analog signal from the SC DAC 108 is supplied to the segmented SC DAC 114, which form an analog signal, on signal line 120, corresponding to the value represented by the multi-bit digital signal input to the DAC stage 86. Scrambler 400 further receives an input signal for example having a logic state of 1. An additional gating stage 421 receives an input signal for example having a logic state of 0. Thus there are seventeen gating stages in total.

In one embodiment, the DAC stage 86 (FIG. 3) operates at a cycle rate lower than that of the SC filter stage 90, for example, the DAC stage 86 (FIG. 3) may operate at a cycle rate of 6.5 MHz and the SC filter may operate at a cycle rate of 13 MHz.

Digital-to-analog conversion often results in noise, e.g., quantization noise, and/or distortion, caused for example, by non-linearities, e.g., integral and/or differential, within the digital-to-analog converter, which in turn is caused by, among other things, mismatching of analog components within the digital-to-analog converter. As stated above, signals from the digital to analog converter may be supplied to a signal conditioning stage that may comprise an analog filter, for example, a switched capacitor (SC) filter stage. The signal conditioning stage may help attenuate noise and/or distortion components of the analog signals, for example, by removing out of band noise. However, a reduction in any particular noise and/or distortion need not be sought nor obtained in every embodiment, and is not a requirement of the signal conditioning stage or the switched capacitor techniques disclosed herein.

FIG. 27 is a schematic diagram of one embodiment of a portion of the DAC stage 86 in combination with one embodiment of the SC filter stage 90. In this embodiment, the DAC stage 86 and the SC filter stage 90 each receive a non overlapping four phase clock. However, the cycle rate of the DAC stage, is less, e.g., about 50% less than the cycle rate of the SC filter stage 90. In this embodiment, the output of the SC DAC is in the form of charge packets, which are provided to the switched-capacitor filter as described below. Data may be pipelined through the digital-to-analog converter and into the switched capacitor filter, wherein the output data rate of the digital-to-analog converter is matched to the input data rate requirements of the switched capacitor filter.

The output of the input op amp is valid on phase P3 and on phase P1. On phase P3, the one-bit DAC 202 and one-bit DAC 204 pre-charge in response to the logic state of $bit_1$ and $bit_2$, respectively, as described above with respect to FIG. 13. DAC stage switches S59, S60, S61, and S62 are in the open condition. Also on phase P3, SC filter stage switches S63, S64, S68, S69, S72, and S74 are in the open condition. Switches S65, S66, S67, S70, S71, and S73 are in the open condition. On phase P4, the charge sharing switches, e.g., S59 and S60 of the SC DAC stage are in the closed condition, whereby charge is redistributed among the one-bit DACs. Also on phase P4, SC filter switches S63, S64, S68, S69, S72, and S74 are in the closed condition. Switches S65, S66, S67, S70, S71, and S73 are in the open condition, whereby the input op amp of the SC filter stage 90 undergoes offset and gain compensation. Gain compensation is most effective when the sample rate is much higher than the bandwidth of the analog signals from the DAC stage. On phase P1, switch S61 closes and one of the one-bit DACs of the SC DAC delivers charge, i.e. a data sample, to input of the SC filter stage, which in this embodiment appears as a offset and gain compensated virtual ground. Switches S59 and S60 are in the open condition. Also on P1, the SC filter stage 90 switches S67 and S70 are in the closed condition, through which the output of the SC filter stage 90 is connected back to the input of the SC filter stage 90. Switches S65, S71, and S73 are in the closed condition as well. Switches S63, S64, S68, S69, S72, and S74 are in the open condition. On phase P2, SC filter switches S62 and S63 are in the open condition thereby opening the connection between the output and the input of the SC filter stage 90. Switch S62 is in the closed condition whereby the one-bit DAC 202 delivers charge, i.e. a data sample, to input of the SC filter stage. Switches S61, S60, and S59 are in the open condition. Also on phase P2, switch S65, S66, S69, S69, S72, and S74 are in the closed condition. Switches S63, S64, S67, S70, S71, S73 are in the open condition. On phase P3, switches S59, S60, S61, and S62 are in the open condition and the SC DAC undergoes another precharge in accordance with the multi-bit input signal.

Thus, the DAC stage delivers more than one analog signal (e.g., two analog signals in this embodiment), during each cycle of the DAC (e.g., each cycle of the four phase clock), whereby the output sample rate of the DAC matches the input sample rate of the SC filter stage. The analog signals may but need not be identical to one another. In some embodiments, the two analog signals from the DAC are not identical but the downstream stages provide appropriate compensation so that the two analog signals contribute equally to the output of the Digital to Analog Conversion System. Any type of SC DAC may be used so long as the DAC generates suitable "copies" of the analog signal. In some embodiments, a SC DAC of the type shown in FIG. 18 and 19A–19C may be used because it can inherently provide multiple copies of the output signal.

The signal conditioner stage need not be a switched capacitor filter. Thus, although described above as including a SC filter stage, some embodiments may not include a an SC filter stage. Furthermore, in embodiments having a SC filter stage, offset and gain compensation is not required.

There are many ways to physically arrange the stages in each of the figures. For example, in one embodiment, one gate stage is integrated into each of the SC cells in order to reduce the number of data lines that are routed to the DAC stage. In another embodiment, the gate stages are integrated near the scrambler cell in order to reduce the size of the SC cells.

In some embodiments, the value of the capacitance used in the SC DAC may be selected in accordance with kT/C noise requirements, although this is not required.

In some embodiments, the value of the capacitance used in the SC DAC may be selected so as to be large enough to meet bit weight matching requirements. However, others are just two example criteria. The criteria for selecting the value (s) of the capacitance used in the SC DAC are not limited to those of noise requirements and/or bit weight matching requirements.

Although described with respect to a system for use in a GSM system that runs at 13 MHz, the systems described above are not limited to such.

Various switched capacitor filters and associated configurations are disclosed in Temes, Gabor C., et al. "Novel Pipeline Data Converters", ISCAS, 1988, pp. 1943-1946 and Yoshizawa, Hirokazu, et al., "Novel Design Techniques for High-Linearity MOSFET-Only Switched-Capacitor Circuits", Symposium on VLSI Circuits Digest of Technical Papers, 1996, pp. 152-153.

In some embodiments, the DAC stage simultaneously delivers multiple "copies" at the same time, which in effect increases the gain of the DAC.

Referring again to FIG. 27, in some embodiments the SC filter stage 90 has a switched capacitor, e.g., C400. The switched capacitor C400 may be but is not limited to a switched capacitor that does not have effects from associated parasitic capacitances. In other words, the parasitic capacitances may or may not be charged and/or discharged and do not pass parasitic signals from the charging and discharging events into the signal path. In this embodiment, the SC filter stage includes a switched capacitor C410 in parallel with the switched capacitor C400. Switched capacitor C400 may or may not share switches with the switched capacitor C401. The switched capacitor C410 may exhibit parasitic capacitance characteristics. The switched capacitor C401 may be for example, but is not limited to a switched capacitor formed of two diodes that are connected anode to anode or are connected cathode to cathode, where the junction between the two diodes is biased such that the diodes do not become forward biased during operation. In some embodiments, the DAC stage has parasitic sensitive switched capacitor elements and consequently the capacitor C401 in the switched capacitor filter may improve gain matching and/or gain drift between the DAC stage and the SC filter stage.

FIG. 28A is an illustration of a top view of one embodiment of a SC cell 450 implementing the one-bit DAC of FIG. 16A. The perimeter of the SC cell 450 is shown as a dotted line. The SC cell 450 includes a capacitor top plate C1TP and a capacitor bottom plate C1BP. A conductor 452 is provided to supply the digital signal bit$_2$ to a region of a control portion 222. A conductor 454 is provided to supply the phase signal P2 to a region representing a control portion 222. A conductor 456 runs from the perimeter of the SC cell 450 to a gate of a switch S43. A conductor 458 runs from the perimeter of the SC cell 450 to one of a source or a drain of the switch S43. A conductor 460 runs from the perimeter of the SC cell 450 to the top plate of the capacitor C1TP and to the other of the source or drain of the switch S43. A conductor 462 runs from the perimeter to one of a source or a drain of a switch S48. A conductor 464 runs from the other of the source or drain of the switch S48 to the top plate of the capacitor C1TP and to a region 466 representing a region of a switch S4, a switch S5, voltage reference V3, and voltage reference V4. A conductor 468 runs from a gate of the switch S48 to the perimeter of the SC cell 450.

FIG. 28B is an illustration of a top view of another embodiment of a SC cell 450 implementing the one-bit DAC of FIG. 16A. This embodiment is substantially the same as the embodiment of FIG. 28A but further includes a switch S43A that is electrically in parallel with S43 and physically oriented substantially perpendicular to S43; and further includes a switch S48A that is electrically in parallel with S48 and physically oriented perpendicular to S48. For example, the switches S43, S43A may have a longitudinal axis, and the switches may be oriented such that the longitudinal axis of one switch is physically perpendicular to the longitudinal axis of the other switch. In one embodiment, the switches S43 and S43A are formed of two switches of approximately equal size.

FIG. 29 is a representation of a top view of one embodiment of a die layout 480 of a DAC portion 110 having eighteen SC cells arranged in a ring 482. Seventeen of the SC cells (shown in solid lines) in the ring form a segmented DAC adapted to receive a multi-bit digital input signal having up to seventeen bits. One of the SC cells (shown in dotted line) in the ring forms the MSB portion of a SC DAC (shown in dotted line) 484 formed of seven SC cells and adapted to receive a multi-bit digital input signal of up to seven bits. An arrow on each of the SC cells in the ring indicates the relative direction of orientation of the SC cell.

In one embodiment, the DAC stage is fabricated in a 0.25 micron ($\mu$) double-poly quad metal process in a GSM baseband/voiceband integrated circuit.

However, as stated above, the switches and the capacitors are not limited to the particular embodiments shown.

As stated above, switched capacitor techniques are used in many systems. Thus, the switched capacitor devices and techniques described above are not limited to mobile communication systems or even digital to analog converters.

FIG. 30 is a schematic diagram of one embodiment of the CT filter stage 92 of FIG. 2, which includes a two resistors R600, R601 that each receive an analog signal from the SC filter stage, and form an RC filter with C600 and C601, to passively filter the images left by the switched capacitor filter. The images appear at multiples of the SC filter sample rate. The stage may have selectable gain formed by an amplifier 600 and resistors R602-R607. The CT filter stage may further provide resistors R608, R609, which form a passive pole in combination with an off-chip capacitor C602. Although not required, the resistors in the output pole may be integrated to improve I/Q channel matching, reduce external component count and to reduce the effects of loading from the pin capacitance on the output stage amplifier.

FIG. 31 is a block diagram of one embodiment of a squaring circuit 500 that is adapted to convert a 4-bit digital input signal bit$_1$, bit$_2$, bit$_3$, bit$_4$, into an analog signal indicative of the square of the input signal. The analog signal is supplied to an output terminal 510. The squaring circuit 500 comprises four switched capacitor DACs 162, 164, 166, 168, described above with respect to FIG. 5. The digital signal bit$_1$ is presented to an input terminal 512 from where it is supplied to the one-bit DAC 162 to control the switch S1. The digital signal bit$_1$ is further supplied to an inverter 174 that generates a signal at terminal 176 used to control switch S2. The digital signal $bit_2$ is presented to an input terminal 514 from where it is supplied to the one-bit DAC 164 to control switch S4 and input to an inverter 180 that generates a signal at terminal 182 used to control switch S5. The digital signal $bit_3$ is presented to an input terminal 516 from where it is supplied to the one-bit DAC 166 to control switch S7 and input to an inverter 186 that generates a signal at terminal 188 used to control switch S8. The digital signal $bit_4$ is presented to an input terminal 518 from where it is supplied to the one-bit DAC 168 where it is used to control charging switch S10 and input to an inverter 192 that generates a signal at terminal 194 used to control switch S11. The first terminal of the capacitor C1 is supplied to a first terminal of a charge sharing switch S200. The first terminal of the capacitor C2 is supplied to a first terminal of a charge sharing switch S201. The first terminal of the capacitor C3 is supplied to a first terminal of a charge sharing switch S202. The first terminal of the capacitor C4 is supplied to a first terminal of a charge sharing switch S203. The second terminal of each of the switches S200-203 is connected to a first terminal of a switch S204. The second terminal of the switch S204 is connected to the output terminal 510.

FIGS. 33A-33C are block diagrams showing the operation of the squaring circuit 500 of FIG. 31 in the event that input terminals 512, 514, 516, 518 are supplied with digital bit signals $bit_1$, $bit_2$, $bit_3$, $bit_4$, having logic states of 1, 0, 0, 0, respectively. Tables show the relationship between the clock phase, and the state (i.e., voltage and charge) of the capacitors in the one-bit DACs. Referring now to FIG. 33A, on phase P3 of the 3-phase clock (FIG. 32), all of the charge sharing switches S200, S201, S202, and S203 and the output switch S204, are in the open condition. The capacitor C1 is charged to $V_{ref}$ in response to the logic state 1 on terminal 512. Capacitors C2, C3 and C4 are all discharged to ground in response to the logic state 0 signals on terminal 514, 516, 518, respectively. Referring now to FIG. 33B, on phase P1 of the 3-phase clock (FIG. 32) all of the charging switches S3, S6, S9 and S12 (FIG. 31) and the output switch S204 are in an open condition, and all of the charge sharing switches S200, 201, 202, 203 are in a closed condition, whereby charge is redistributed and resulting in the total charge on all of the capacitors being divided among all of the capacitors. If the capacitors C1, C2, C3, C4 all have the same capacitance value C, then the charge is shared equally so that the voltage across each capacitor becomes $V_{ref}/4$. Referring now to FIG. 33C, on P2 of the 3-phase clock (FIG. 32) switch S200 is in the closed condition because P2 has a logic 1 state and $bit_1$ has a logic state 1. Switches S201, S202, S203 are in the open condition because $bit_2$, $bit_3$, $bit_4$ have a logic state 0. Output switch S204 is in the closed condition, and capacitor C1 (FIG. 31) of one-bit DAC 162 delivers its charge to the output terminal 510. Consequently, the total charge delivered to the output terminal 510 is equal to $C*Vref/4$.

FIGS. 34A-34C are block diagrams showing the operation of the squaring circuit 500 of FIG. 31 for each of the 3 clock phases in the event that input terminal 512, 514, 516, 518 are supplied with digital bit signals $bit_1$, $bit_2$, $bit_3$, $bit_4$, having logic states of 1, 1, 0, 0, respectively. Tables show the relationship between the clock phase, and the state (i.e., voltage and charge) of the capacitors in the one-bit DACs. Referring now to FIG. 34A, on phase P3 of the 3-phase clock, all of the charge sharing switches S200, S201, S202, and S203 and the output switch S204, are in the open condition. The capacitor C1 and the capacitor C2 are each charged to $V_{ref}$ in response to the logic state 1 on terminal 512 and 514, respectively. Capacitors C3 and C4 are all discharged to ground in response to the logic 0 signals on terminals 516, 518, respectively. Referring now to FIG. 34B, on phase P1, all of the charging switches S3, S6, S9 and S12 (FIG. 31) and the output switch S204 are in an open condition, and all of the charge sharing switches S200, 201, 202, 203 are in a closed condition, whereby charge is redistributed and resulting in the total charge on all of the capacitors being divided among all of the capacitors. If the capacitors C1, C2, C3, C4 all have the same capacitance value C, then the charge is shared equally so that the voltage across each capacitor becomes $V_{ref}/2$. Referring now to FIG. 33C, on P2 of the 3-phase clock, switch S200 is in the closed condition because P2 has a logic state 1 and $bit_1$ has a logic state 1. Switch S201 is in the closed condition because P2 has a logic state 1 and $bit_2$ has a logic state 1. Switches S202, S203 are in the open condition because $bit_3$, $bit_4$ have a logic state 0. Output switch S204 is in the closed condition, and capacitors C1 and C2 (FIG. 31) of one-bit DACs 162, 164 delivers charge to the output terminal 510. Consequently, the total charge delivered to the output terminal 510 is equal to $C*Vref$.

Thus, for this embodiment, the charge may be determined as follows:

$$\text{Charge} = (C*Vref*(\text{value of digital input})^2)/4 \quad \text{(Equation 1)}$$

In other embodiments, the multi-bit digital input signal to the SC squaring circuit need not be equally-weighted bits, but rather may have binary-weighting or any other weighting.

FIG. 35 shows one embodiment of an analog to digital converter 800. The analog to digital converter 800 is a successive approximation type having an analog comparison stage 801 that receives an analog signal. The analog comparison stage 801 generates an output signal that is supplied to a successive approximation register (SAR), which generates an output signal that is supplied to a latch stage 804. A digital output signal from the latch stage 804 is fed back to an input of the analog comparison stage through a feedback element 806. The feedback element 806 may be a digital to analog converter that employs one or more of the methods or devices described hereinabove. In some embodiments, the feedback element may comprise a squaring circuit such as for example, the squaring circuit described hereinabove with respect to FIGS. 31-34. In such embodiments, the feedback DAC has the characteristic that the analog output is proportional to the square of the digital input. This produces a square root transfer function for the overall analog to digital converter, wherein the digital output is proportional to the square root of the analog input. In contrast, the AD574 analog to digital converter, manufactured by Analog Devices, Inc. produces a linear transfer function, wherein the digital output is directly proportionate to the analog input of the analog to digital converter.

Referring again to FIG. 31, in another embodiment, a digital to analog converter may receive a first multi-bit digital signal and a second multi-bit digital signal, and generate an analog signal indicative of a product of the first multi-bit digital signal and the second multi-bit digital signal. Such embodiment is similar to the squaring circuit of FIG. 31 except that the switches S200, S201, S202, and S203 are controlled by the second multi-bit digital signal. For example, the switch S200 may be controlled according to an equation: $P1+((bit_1 \text{ of second multi-bit digital signal})*P2)$. The switch S201 may be controlled according to an equation: $P1+((bit_2 \text{ of second multi-bit digital signal})*P2)$. The switch S202 may be controlled according to an equation: $P1+((bit_3 \text{ of second multi-bit digital signal})*P2)$. The switch S203 may be controlled according to an equation: P1+((bit$_4$ of second multi-bit digital signal)*P2). In another embodiment, such a digital to analog converter may be employed in the feedback loop of a analog to digital converter, as in FIG. 35.

In another embodiment, the digital signal processing stage includes a sigma delta modulator.

Although shown in an embodiment adapted to receive an acoustical signal 56, in other embodiments, the handset 50 is not limited to such. The input signal may be one or more signal of any type including but not limited to electromagnetic, electrical, microwave, acoustical, ultrasound, and optical signal, may have any form, and may be from any source. The invention may be used in any type of system which may but need not include a digital to analog conversion stage.

The multi-bit digital signal may be parallel data, e.g., provided by way of plurality of signal lines, serial data, e.g., provided by way of a single signal line, or any combination thereof, e.g., some parallel data and some serial data.

Although the SC cell is shown in embodiments for use in forming a SC DAC, the SC cell is not limited to such, but rather may be used in any application.

The switched capacitor devices and techniques described above are not limited to embodiments in which the elements are substantially identical.

As stated above, the switches and the capacitors may be of any type and are not limited to the particular embodiments disclosed above.

While there have been shown and described various embodiments, it will be understood by those skilled in the art that various changes and modifications may be made.

What is claimed is:

1. A DAC comprising:
a switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, the DAC having a charge sharing operating state in which at least two of the plurality of sub DACs share charge with one another, and having an operating state, initiated subsequent to the charge sharing operating state, in which the switched capacitor network outputs at least one analog signal indicative of a sum of values of each bit in the multi-bit signal.

2. The DAC of claim 1, wherein the multi-bit digital signal is an equally-weighted multi-bit digital signal, and the associated amount of charge is the same for each of the plurality of sub DACs.

3. The DAC of claim 1, wherein the multi-bit digital signal is an equally-weighted multi-bit digital signal, and the associated capacitance is the same for each of the plurality of sub DACs.

4. The DAC of claim 1, wherein each of the plurality of sub DACs shares charge with one another, and the switched capacitor network outputs an analog signal indicative of a sum of values of each bit in the multi-bit digital signal.

5. The DAC of claim 1, wherein for each of the plurality of sub DACs, the associated capacitance comprises a single capacitor.

6. The DAC of claim 1, wherein at least a portion of the plurality of switched capacitor cells form a closed loop.

7. The DAC of claim 1, wherein the DAC comprises a plurality of switched capacitor cells used in forming the switched capacitor network, each of at least two of the plurality of switched capacitor cells has an orientation direction, and the at least two of the plurality of switched capacitor cells are oriented such that the orientation direction of at least one of the at least two of the plurality of switched capacitor cells is angularly offset relative to the orientation direction of at least one other of the at least two of the plurality of switched capacitor cells, the angular offset being substantially ninety degrees.

8. The DAC of claim 1, wherein the DAC comprises a plurality of switched capacitor cells used in forming the switched capacitor network, each of at least four of the plurality of switched capacitor cells has an orientation direction, and the orientation direction of each one of the at least four of the plurality of switched capacitor cells is angularly offset relative to the orientation directions of the others of the at least four of the plurality of switched capacitor cells.

9. A DAC comprising:
a switched capacitor network that receives an equally-weighted multi-bit digital signal and outputs one or more analog signals, wherein at least one of the one or more analog signals comprises a single packet of charge indicative of a sum of equally-weighted values of each bit in the multi-bit digital signal.

10. The DAC of claim 9, wherein the one or more analog signals comprises exactly one signal.

11. The DAC of claim 9, wherein the one or more analog signals comprises two or more analog signals, wherein at least two of the two or more analog signals comprises a single packet of charge indicative of a sum of equally-weighted values of each bit in the multi-bit digital signal.

12. A DAC comprising:
a switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally-weighted values of each bit in the multi-bit signal.

13. The DAC of claim 12, wherein for each of the plurality of sub DACs, the associated capacitance comprises a single capacitor.

14. The DAC of claim 12, wherein at least a portion of the plurality of switched capacitor cells form a closed loop.

15. The DAC of claim 12, wherein the DAC comprises a plurality of switched capacitor cells used in forming the switched capacitor network, each of at least two of the plurality of switched capacitor cells has an orientation direction, and the at least two of the plurality of switched capacitor cells are oriented such that the orientation direction of at least one of the at least two of the plurality of switched capacitor cells is angularly offset relative to the orientation direction of at least one other of the at least two of the plurality of switched capacitor cells.

16. The DAC of claim 12, wherein the DAC comprises a plurality of switched capacitor cells used in forming the switched capacitor network, each of at least four of the plurality of switched capacitor cells has an orientation direction, and the orientation direction of each one of the at least four of the plurality of switched capacitor cells is angularly offset relative to the orientation directions of the others of the at least four of the plurality of switched capacitor cells.

17. A method of converting a multi-bit digital signal to an analog signal indicative of a sum of value of each bit in the multi-bit digital signal comprising:

charging each of a plurality of capacitors to a value corresponding to a value of a bit in the multi-bit digital signal, wherein the charge on each capacitor corresponds to a weight of the value of a corresponding bit;

temporarily connecting at least two of the plurality of capacitors to one another to share charge; and providing at least one analog output signal indicative of a sum of values of each bit in the multi-bit digital signal, after disconnecting the at least two of the plurality of capacitors from one another.

18. The method of claim 17, wherein the method further comprises connecting each of the plurality of capacitors to at least one other of the plurality of capacitors.

19. The method of claim 17, wherein the method further comprises connecting all of the plurality of capacitors together so the value of each of the plurality of capacitors is substantially a same value.

20. The method of claim 19, wherein the charge on each of the plurality of capacitors is substantially a same charge.

21. A method of converting a equally-weighted multi-bit digital signal to an analog signal indicative of a sum of value of each bit in the multi-bit digital signal comprising:

charging each of a plurality of capacitors to a value corresponding to a value of a bit in the equally-weighted multi-bit digital signal, and generating a signal packet of charge on at least one capacitor indicative of a sum of equally-weighted values of each bit in the multi-bit digital signal.

22. The method of claim 21, wherein the method further comprises connecting each of the plurality of capacitors to at least one other of the plurality of capacitors.

23. The method of claim 21, wherein the method further comprises charging each of the plurality of capacitors to a level indicative of a value of correspondence and connecting all of the plurality of capacitors together so each of the capacitors has a charge which is substantially a same charge.

24. A method of converting an equally-weighted multi-bit digital signal to an analog signal indicative of a sum of value of each bit in the multi-bit digital signal comprising:

charging each of a plurality of capacitors to a value corresponding to a value of a bit in the equally-weighted multi-bit digital signal, and connecting at least two of the plurality of capacitors to one another to share charge.

25. The method of claim 24, wherein the method further comprises connecting each of the plurality of capacitors to at least one other of the plurality of capacitors.

26. The method of claim 24, wherein the method further comprises charging each of the plurality of capacitors to a level indicative of a value of correspondence and connecting all of the plurality of capacitors together so each of the capacitors has a charge which is substantially a same charge.

27. A DAC comprising:

means for charging each of a plurality of capacitors to a value corresponding to a value of a bit in a multi-bit signal, wherein the charge on each capacitor corresponds to a weight of the value of a corresponding bit;

means for temporarily connecting at least two of the plurality of capacitors to one another to share charge; and means for providing at least one analog output signal indicative of a sum of values of each bit in the multi-bit signal, after disconnecting the at least two of the plurality of capacitors from one another.

28. The DAC of claim 27, wherein the DAC further comprises means for connecting each of the plurality of capacitors to at least one other of the plurality of capacitors.

29. The DAC of claim 27, wherein the DAC further comprises means for connecting all of the capacitors together so each has substantially the same value.

30. The DAC of claim 29, wherein each of the capacitors has substantially the same charge.

31. A DAC comprising:

means for charging each of a plurality of capacitors to a value corresponding to a value of a bit in an equally-weighted multi-bit signal, and means for generating a single packet of charge on at least one capacitor indicative of a sum of equally-weighted values of each bit in the multi-bit signal.

32. The DAC of claim 31, further comprising means for connecting each of the plurality of capacitors to at least one other of the plurality of capacitors.

33. The DAC of claim 31 further comprising means for charging each of the plurality of capacitors to a level indicative of a value of correspondence and connecting all of the plurality of capacitors together so a charge of each of the capacitors is substantially a same charge.

34. A DAC comprising:

means for charging each of a plurality of capacitors to a value corresponding to a value of a bit in an equally-weighted multi-bit signal, and means for connecting at least two of the plurality of capacitors to one another to share charge.

35. The DAC of claim 34, further comprising means for connecting each of the plurality of capacitors to at least one other of the plurality of capacitors.

36. The DAC of claim 34 further comprising means for charging each of the plurality of capacitors to a level indicative of a value of correspondence and connecting all of the plurality of capacitors together so a charge of each of the capacitors is substantially a same charge.

37. An integrated circuit comprising:

an integrated switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, the integrated switched capacitor network having a charge sharing operating state in which at least two of the plurality of sub DACs share charge with one another, and having an operating state initiated subsequent to the charge sharing operating state, in which the switched capacitor network outputs at least one analog signal indicative of a sum of values of each bit in the multi-bit digital signal.

38. An integrated circuit comprising:

an integrated switched capacitor network that receives an equally-weighted multi-bit digital signal and outputs one or more analog signals, wherein at least one of the one or more analog signals comprises a single packet of charge indicative of a sum of equally-weighted values of each bit in the multi-bit digital signal.

39. An integrated circuit comprising:

an integrated switched capacitor network that receives an equally-weighted multi-bit digital signal, the switched capacitor network having a plurality of sub DACs, at least two of the plurality of sub DACs sharing charge with one another, wherein the switched capacitor network outputs an analog signal indicative of a sum of equally-weighted values of each bit in the multi-bit digital signal.

40. The DAC of claim 1 wherein each of the plurality of sub DACs shares charge with at least one other of the plurality of sub DACs to generate at least one analog signal indicative of a sum of values of each bit in the multi-bit digital signal.

41. The DAC of claim 1 wherein the switched capacitor network generates the at least one analog signal in response to the charge received by the capacitance of each of the plurality of sub DACs in response to the associated bit.

42. The DAC of claim 12 wherein each of the plurality of sub DACs shares charge with at least one other of the plurality of sub DACs to generate at least one analog signal indicative of a sum of values of each bit in the multi-bit digital signal.

43. The DAC of claim 12 wherein the switched capacitor network generates the at least one analog signal in response to the charge received by the capacitance of each of the plurality of sub DACs in response to the associated bit.

44. The method of claim 17 further comprising generating at least one analog signal indicative of a sum of the values of the bits in the multi-bit digital signal in response to the charge stored on each of the plurality of capacitors by the step of charging.

45. The method of claim 17 wherein connecting comprises connecting each of the plurality of sub DACs with at least one other of the plurality of sub DACs to share charge and generate at least one analog signal indicative of a sum of the values of the bits in the multi-bit digital signal.

46. The method of claim 24 further comprising generating at least one analog signal indicative of a sum of the values of the bits in the multi-bit digital signal in response to the charge stored on each of the plurality of capacitors by the step of charging.

47. The method of claim 24 wherein connecting comprises connecting each of the plurality of sub DACs with at least one other of the plurality of sub DACs to share charge and generate at least one analog signal indicative of a sum of the values of the bits in the multi-bit digital signal.

48. The DAC of claim 27 further comprising means for generating at least one analog signal indicative of a sum of the values of the bits in the multi-bit signal in response to the charge stored on each of the plurality of capacitors by the step of charging.

49. The DAC of claim 27 wherein means for connecting comprises means for connecting each of the plurality of sub DACs with at least one other of the plurality of sub DACs to share charge and generate at least one analog signal indicative of a sum of the values of the bits in the multi-bit signal.

50. The DAC of claim 34 further comprising means for generating at least one analog signal indicative of a sum of the values of the bits in the multi-bit signal in response to the charge stored on each of the plurality of capacitors by the step of charging.

51. The DAC of claim 34 wherein means for connecting comprises means for connecting each of the plurality of sub DACs with at least one other of the plurality of sub DACs to share charge and generate at least one analog signal indicative of a sum of the values of the bits in the multi-bit signal.

52. The DAC of claim 37 wherein each of the plurality of sub DACs shares charge with at least one other of the plurality of sub DACs to generate at least one analog signal indicative of a sum of values of each bit in the multi-bit digital signal.

53. The DAC of claim 37 wherein the switched capacitor network generates the at least one analog signal in response to the charge received by the capacitance of each of the plurality of sub DACs in response to the associated bit.

54. The DAC of claim 39 wherein each of the plurality of sub DACs shares charge with at least one other of the plurality of sub DACs to generate at least one analog signal indicative of a sum of values of each bit in the multi-bit digital signal.

55. the DAC of claim 39 wherein the switched capacitor network generates the at least one analog signal in response to the charge received by the capacitance of each of the plurality of sub DACs in response to the associated bit.

56. The DAC of claim 1 wherein the DAC has more than one charge sharing operating state in which at least two of the plurality of sub DACs share charge with one another.

57. The DAC of claim 1 wherein the DAC has more than one operating state, subsequent to the charge sharing operating state, in which the switched capacitor network outputs at least one analog signal indicative of a sum of values of each bit in the multi-bit digital signal.

58. A DAC comprising:
   a switched capacitor network that receives a multi-bit digital signal, the switched capacitor network having a plurality of sub DACs that each received an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, the DAC having an operating state in which at least two of the plurality of sub DACs share charge with one another, and having an operating state in which fewer than all of the plurality of sub DACs are connected to an output terminal and the switched capacitor network outputs at least one analog signal indicative of a sum of values of each bit in the multi-bit digital signal.

59. The DAC of claim 58 wherein the DAC has more than one charge sharing operating state in which at least two of the plurality of sub DACs share charge with one another.

60. The DAC of claim 58 wherein the DAC has more than one operating state in which fewer than all of the plurality of sub DACs are connected to an output terminal and the switched capacitor network outputs at least one analog signal indicative of a sum of values of each bit in the multi-bit digital signal.

61. The DAC of claim 58 wherein in the operating state in which fewer than all of the plurality of sub DACs are connected to an output terminal and the switched capacitor network outputs at least one analog signal indicative of a sum of values of each bit in the multi-bit digital signal, the sub DACs that are connected to the output terminal deliver charge to said output terminal.

62. A method of converting a multi-bit digital signal to an analog signal indicative of a sum of value of each bit in the multi-bit digital signal comprising the steps of:
   charging each of a plurality of capacitors to a value corresponding to a value of a bit in the multi-bit signal, wherein the charge on each capacitor corresponds to a weight of the value of a corresponding bit;
   connecting at least two of the plurality of capacitors to one another to share charge; and
   connecting fewer than all of the plurality of sub DACs to an output terminal to provide at least one analog output signal indicative of a sum of values of each bit in the multi-bit signal.

63. A DAC comprising:
   means for charging each of a plurality of capacitors to a value corresponding to a value of a bit in a multi-bit signal, wherein the charge on each capacitor corresponds to a weight of the value of a corresponding bit;

means for connecting at least two of the plurality of capacitors to one another to share charge; and means for connecting fewer that all of the plurality sub DACs to an output terminal to provide at least one analog output signal indicative of a sum of values of each bit in the multi-bit signal.

64. An integrated circuit comprising:

an integrated switched capacitor network that receives a multi-bit digital signal, the switched capacitor network having a plurality of sub DACs that each receive an associated bit of the multi-bit digital signal, each of the plurality of sub DACs having an associated capacitance that receives an associated amount of charge in response to the associated bit, wherein the associated amount of charge for each of the plurality of sub DACs is in direct proportion to a weight of the bit, the integrated switched capacitor network having an operating state in which at least two of the plurality of sub DACs share charge with one another, and having an operating state in which fewer than all of the plurality of sub DACs are connected to an output terminal and the switched capacitor network outputs at least one analog signal indicative of a sum of values of each bit in the multi-bit signal.

65. The DAC of claim 15 wherein the angular offset is substantially ninety degrees.

* * * * *